(12) United States Patent
Yamazaki et al.

(10) Patent No.: US 7,842,992 B2
(45) Date of Patent: Nov. 30, 2010

(54) NONVOLATILE SEMICONDUCTOR MEMORY DEVICE HAVING FLOATING GATE THAT INCLUDES TWO LAYERS

(75) Inventors: Shunpei Yamazaki, Setagaya (JP); Yoshinobu Asami, Atsugi (JP); Tamae Takano, Atsugi (JP); Makoto Furuno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 97 days.

(21) Appl. No.: 11/723,506

(22) Filed: Mar. 20, 2007

(65) Prior Publication Data

US 2007/0228448 A1 Oct. 4, 2007

(30) Foreign Application Priority Data

Mar. 31, 2006 (JP) .............................. 2006-100367

(51) Int. Cl.
*H01L 29/788* (2006.01)
(52) U.S. Cl. ...................... 257/315; 257/314; 257/316; 257/E29.3
(58) Field of Classification Search ......... 257/314–316, 257/324, E29.3, E21.422
See application file for complete search history.

(56) References Cited

U.S. PATENT DOCUMENTS

| | | | |
|---|---|---|---|
| 3,878,549 A | 4/1975 | Yamazaki et al. | |
| 5,448,513 A | 9/1995 | Hu et al. | |
| 5,808,336 A | 9/1998 | Miyawaki | |
| 6,324,101 B1 | 11/2001 | Miyawaki | |
| 6,417,538 B1 | 7/2002 | Choi | |
| 6,498,369 B1 * | 12/2002 | Yamazaki et al. ........... | 257/347 |

(Continued)

FOREIGN PATENT DOCUMENTS

EP 0 682 370 9/2000

(Continued)

OTHER PUBLICATIONS

European Search Report (Application No. 07005513.2) dated Jul. 10, 2007.
European Search Report (Application No. 07005504.1) dated Apr. 14, 2008.

*Primary Examiner*—Anh Phung
*Assistant Examiner*—Allison P Bernstein
(74) *Attorney, Agent, or Firm*—Eric J. Robinson; Robinson Intellectual Property Law Office, P.C.

(57) ABSTRACT

It is an object to provide a nonvolatile semiconductor memory device with an excellent writing property and charge-retention property. A semiconductor layer including a channel forming region between a pair of impurity regions which are formed to be apart from each other is provided. In an upper layer portion thereof, a first insulating layer, a floating gate electrode, a second insulating layer, and a control gate electrode are provided. The floating gate has at least a two-layer structure, and a first layer being in contact with the first insulating layer preferably has a band gap smaller than that of the semiconductor layer. The stability of the first layer is improved by formation of a second layer of the floating gate electrode using a metal, an alloy, or a metal compound material. Such a structure of the floating gate electrode can improve injectability of carriers in writing and a charge-retention property.

40 Claims, 46 Drawing Sheets

U.S. PATENT DOCUMENTS

| | | |
|---|---|---|
| 6,518,594 B1 | 2/2003 | Nakajima et al. |
| 6,551,948 B2 | 4/2003 | Ohmi et al. |
| 6,597,034 B2 | 7/2003 | Yamazaki et al. |
| 6,613,630 B2 | 9/2003 | Lee |
| 6,699,754 B2 | 3/2004 | Huang |
| 6,713,834 B2 | 3/2004 | Mori et al. |
| 6,812,086 B2 | 11/2004 | Murthy et al. |
| 6,828,623 B1 | 12/2004 | Guo et al. |
| 6,861,689 B2 | 3/2005 | Burnett |
| 7,098,504 B2 | 8/2006 | Kawashima et al. |
| 7,245,010 B2 | 7/2007 | Powell et al. |
| 7,482,651 B2 | 1/2009 | Bhattacharyya |
| 7,485,526 B2 | 2/2009 | Mouli et al. |
| 7,554,854 B2 | 6/2009 | Osame et al. |
| 2002/0079533 A1 | 6/2002 | Horiguchi et al. |
| 2002/0093073 A1 | 7/2002 | Mori et al. |
| 2002/0175376 A1 | 11/2002 | Ohtani et al. |
| 2003/0049900 A1 | 3/2003 | Forbes et al. |
| 2003/0107077 A1 | 6/2003 | Yamazaki et al. |
| 2004/0043638 A1 | 3/2004 | Nansei et al. |
| 2004/0104426 A1 | 6/2004 | Forbes et al. |
| 2004/0119110 A1 | 6/2004 | Park |
| 2005/0023577 A1 | 2/2005 | Ito |
| 2005/0095786 A1 | 5/2005 | Chang et al. |
| 2005/0112820 A1 | 5/2005 | Chen et al. |
| 2005/0230743 A1 | 10/2005 | Nakagawa et al. |
| 2006/0003531 A1 | 1/2006 | Chang et al. |
| 2006/0043463 A1 | 3/2006 | Liu et al. |
| 2006/0118858 A1 | 6/2006 | Jeon et al. |
| 2006/0186458 A1 | 8/2006 | Forbes et al. |
| 2006/0246738 A1 | 11/2006 | Isobe et al. |
| 2007/0132004 A1* | 6/2007 | Yasuda et al. ............... 257/315 |
| 2007/0200167 A1 | 8/2007 | Yamazaki |
| 2007/0221971 A1 | 9/2007 | Yamazaki et al. |
| 2007/0221985 A1 | 9/2007 | Yamazaki et al. |
| 2007/0228449 A1 | 10/2007 | Takano et al. |
| 2007/0228452 A1* | 10/2007 | Asami ........................ 257/315 |
| 2007/0228453 A1 | 10/2007 | Yamazaki et al. |
| 2007/0230254 A1* | 10/2007 | Osame et al. .......... 365/185.29 |
| 2007/0235793 A1 | 10/2007 | Yamazaki et al. |
| 2007/0235794 A1 | 10/2007 | Yamazaki et al. |
| 2009/0257283 A1 | 10/2009 | Osame et al. |

FOREIGN PATENT DOCUMENTS

| | | |
|---|---|---|
| JP | 51-007036 | 3/1976 |
| JP | 52-023532 | 6/1977 |
| JP | 55-015869 | 4/1980 |
| JP | 03-119765 | 5/1991 |
| JP | 06-097454 | 4/1994 |
| JP | 06-244432 | 9/1994 |
| JP | 08-097307 | 4/1996 |
| JP | 2656986 | 9/1997 |
| JP | 10-135357 | 5/1998 |
| JP | 11-040682 | 2/1999 |
| JP | 2000-058685 | 2/2000 |
| JP | 2004-221448 | 8/2004 |
| JP | 2005-347328 | 12/2005 |
| JP | 2006-114905 | 4/2006 |

* cited by examiner

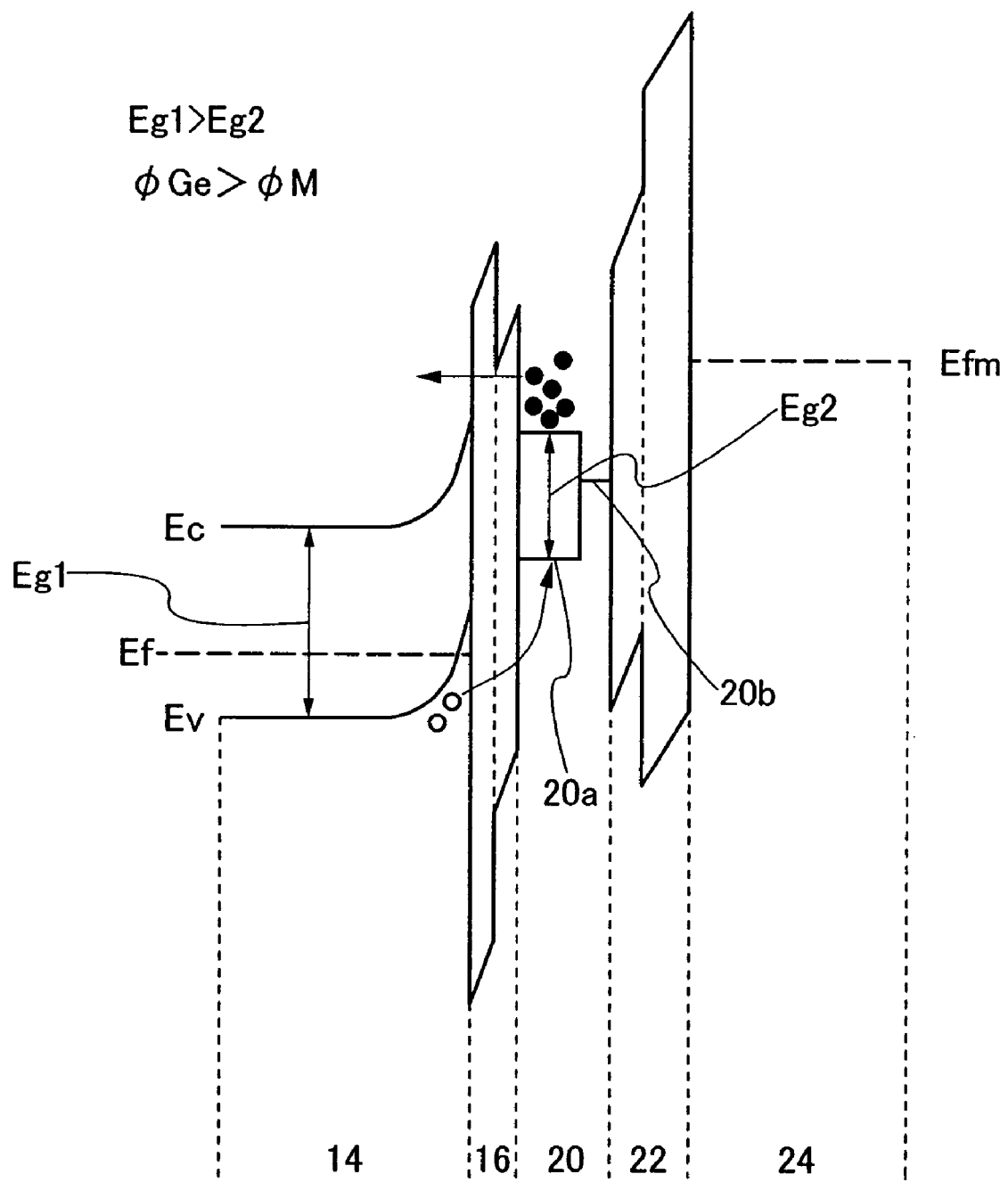

FIG. 8
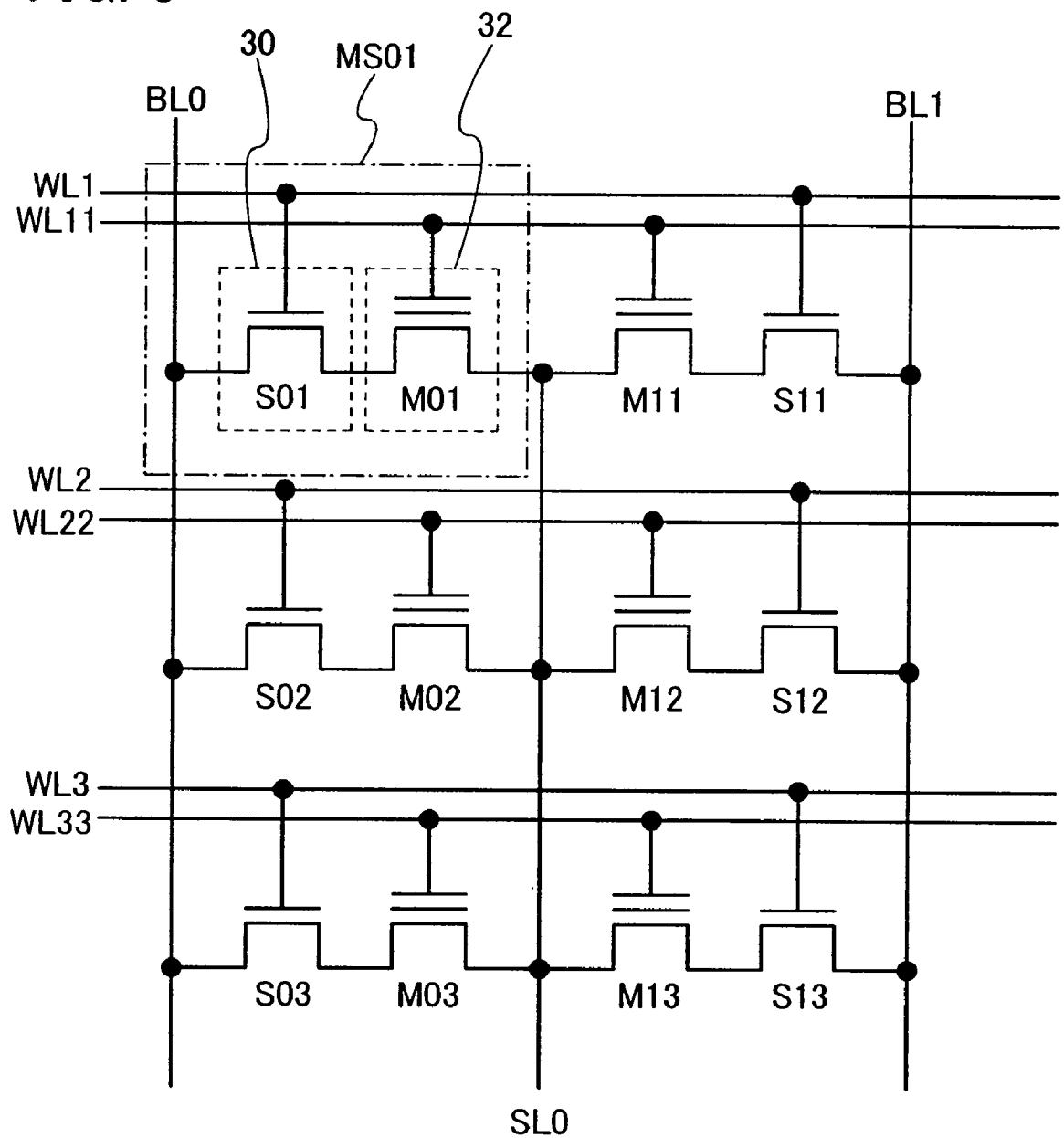
 Semiconductor Layer
 Memory Cell

FIG. 9
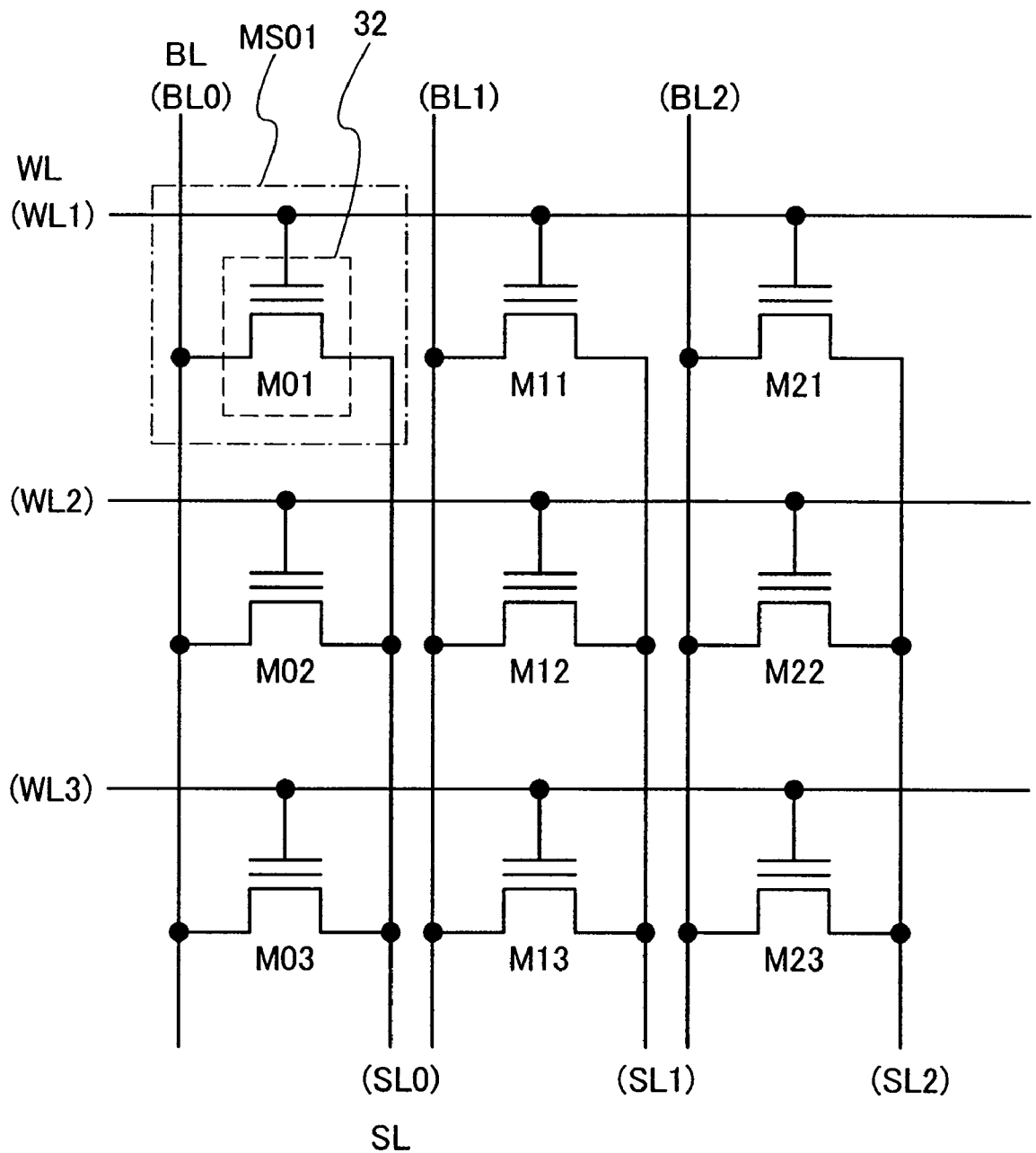
 Semiconductor Layer
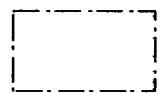 Memory Cell

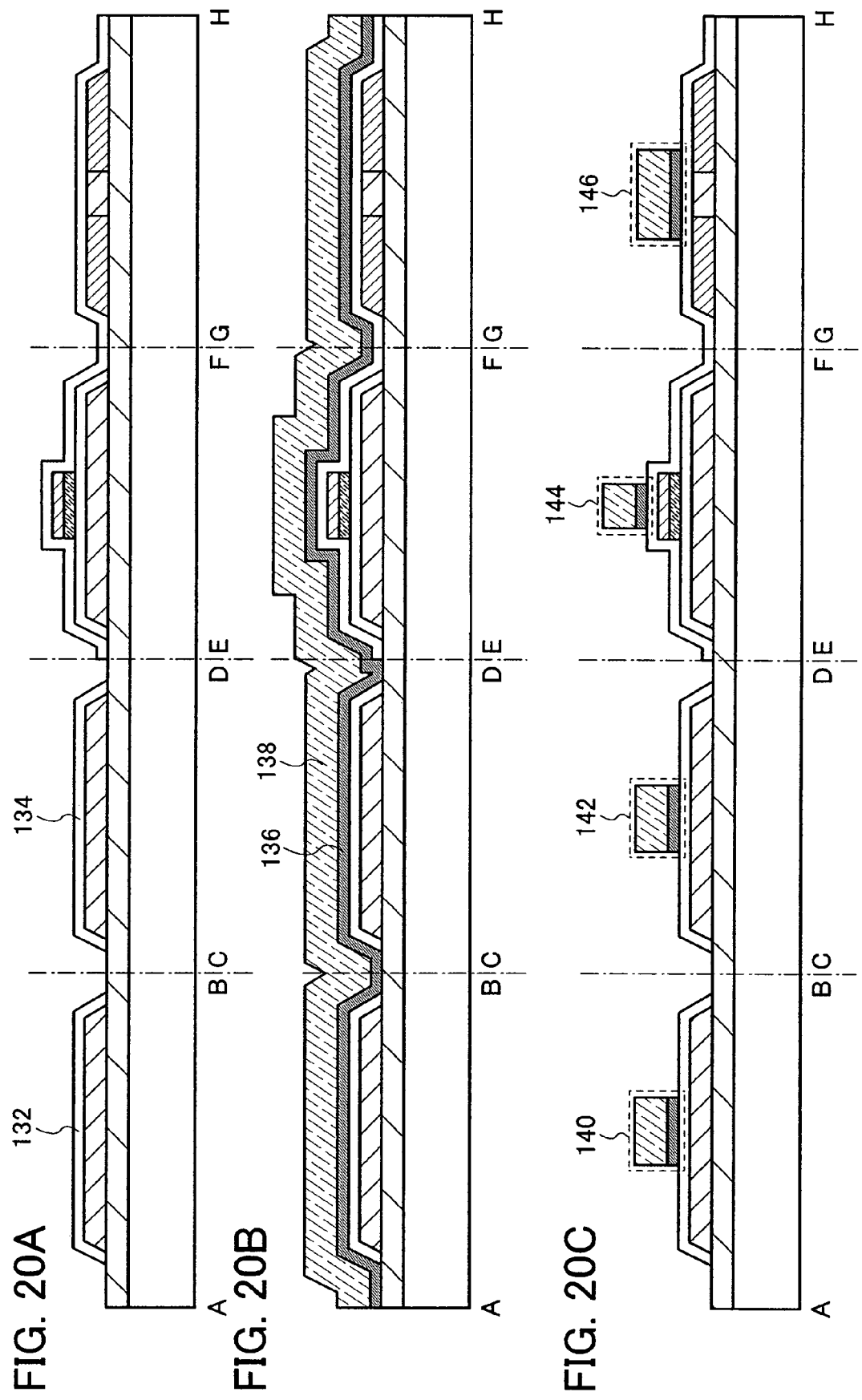

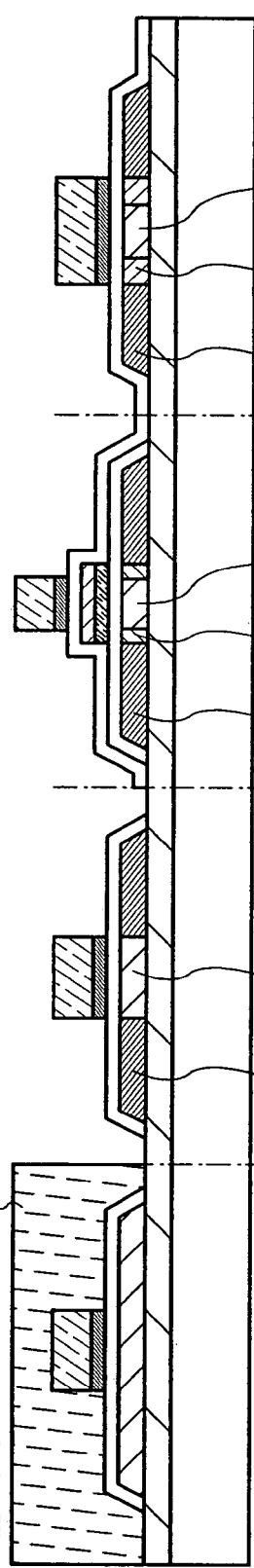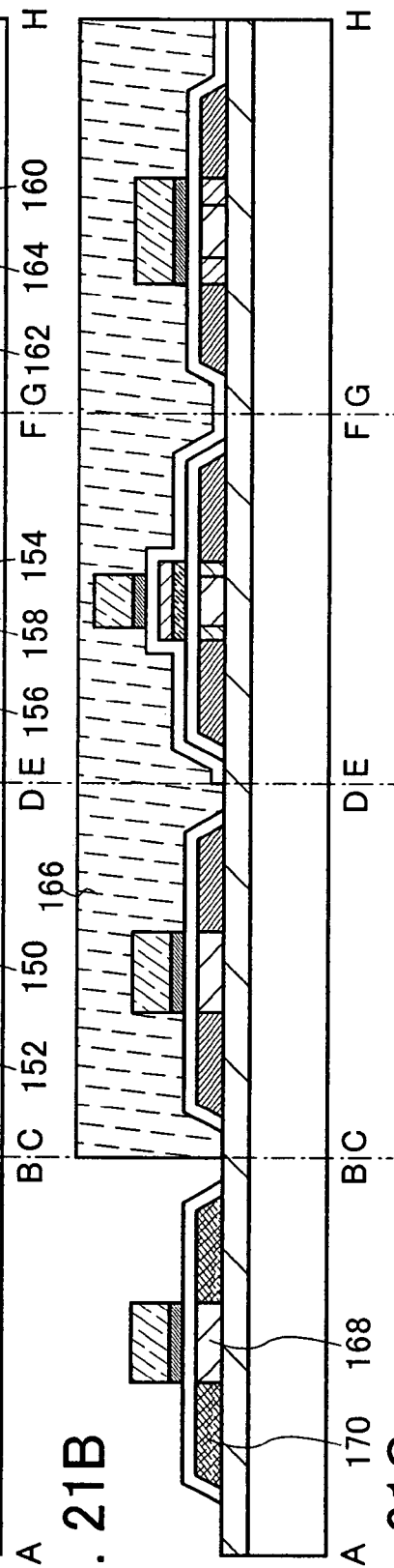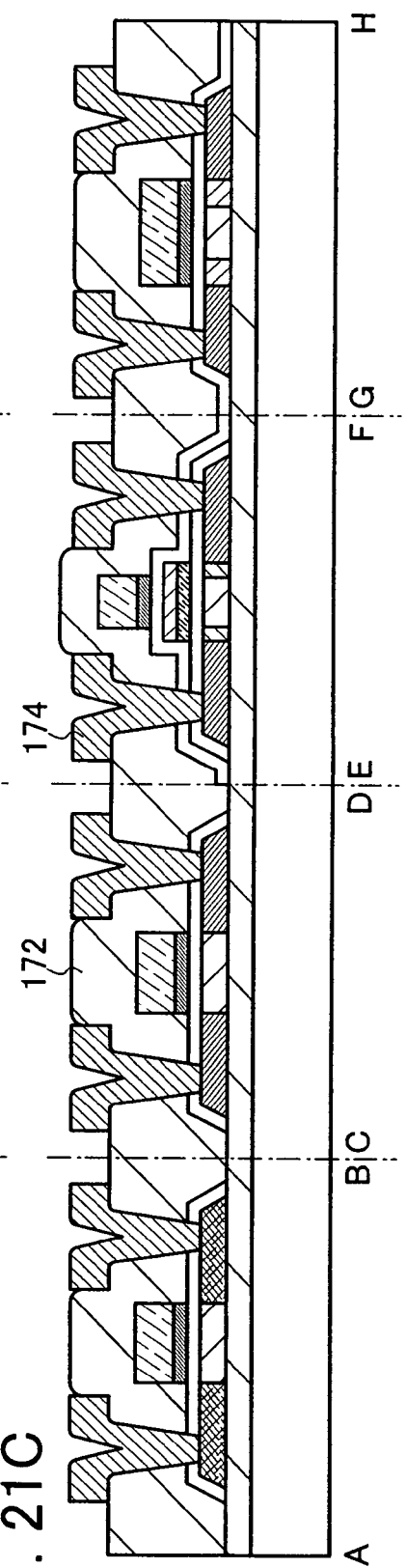

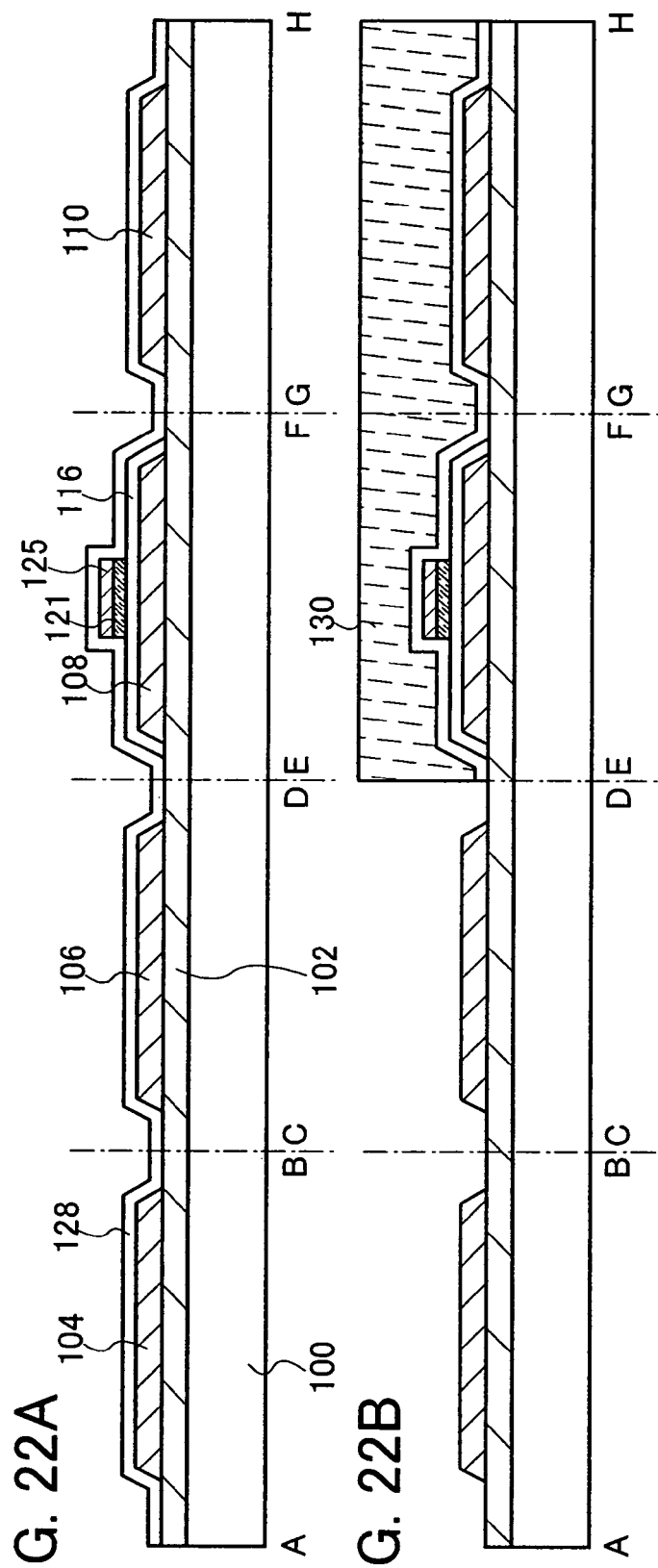

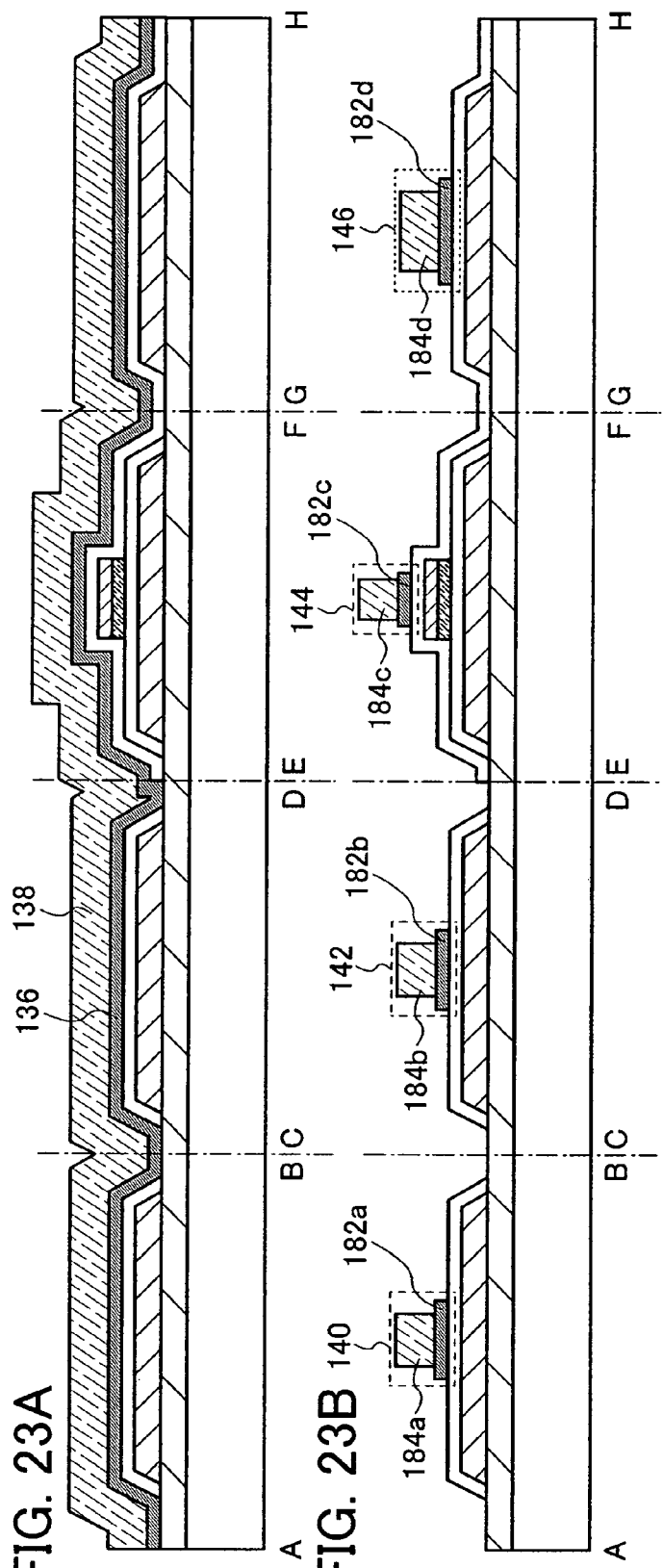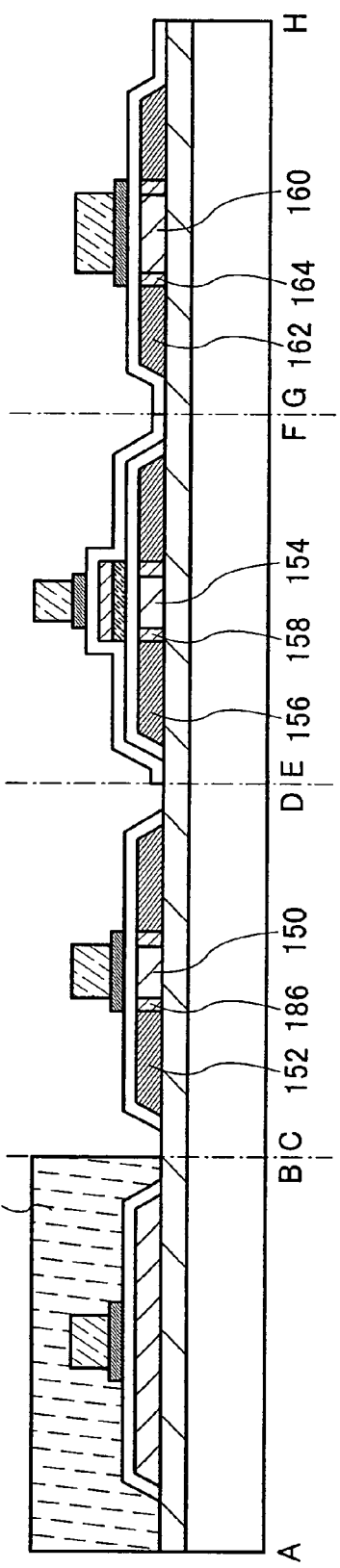

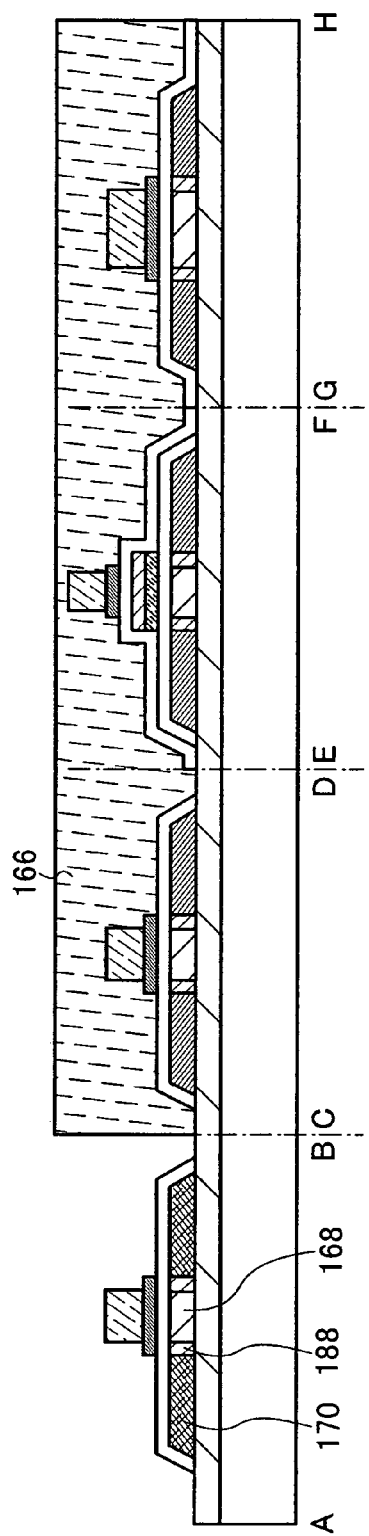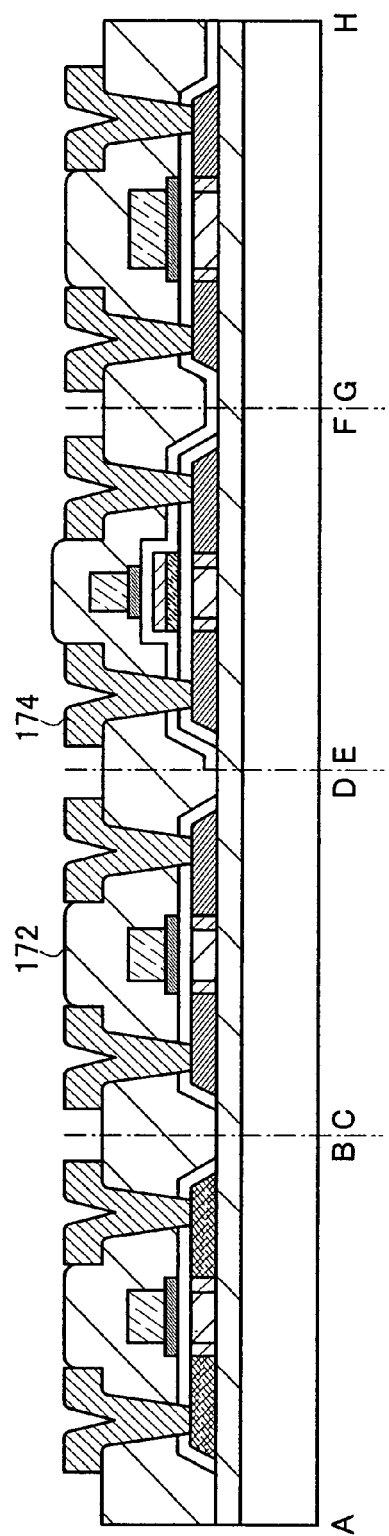
FIG. 24A
FIG. 24B

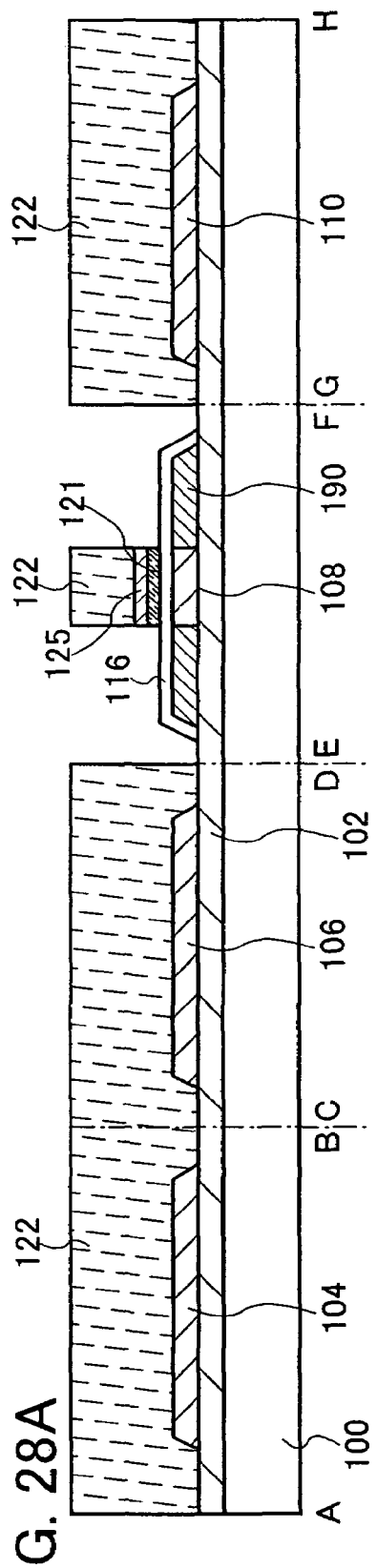
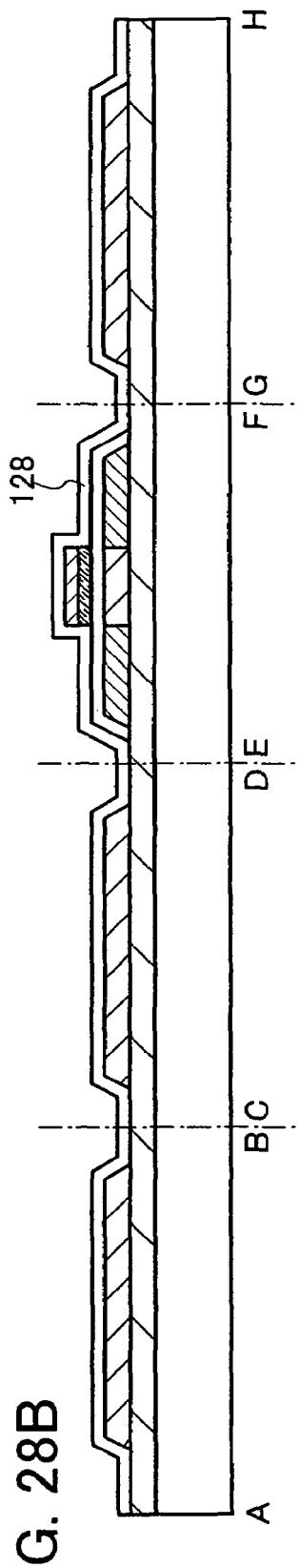
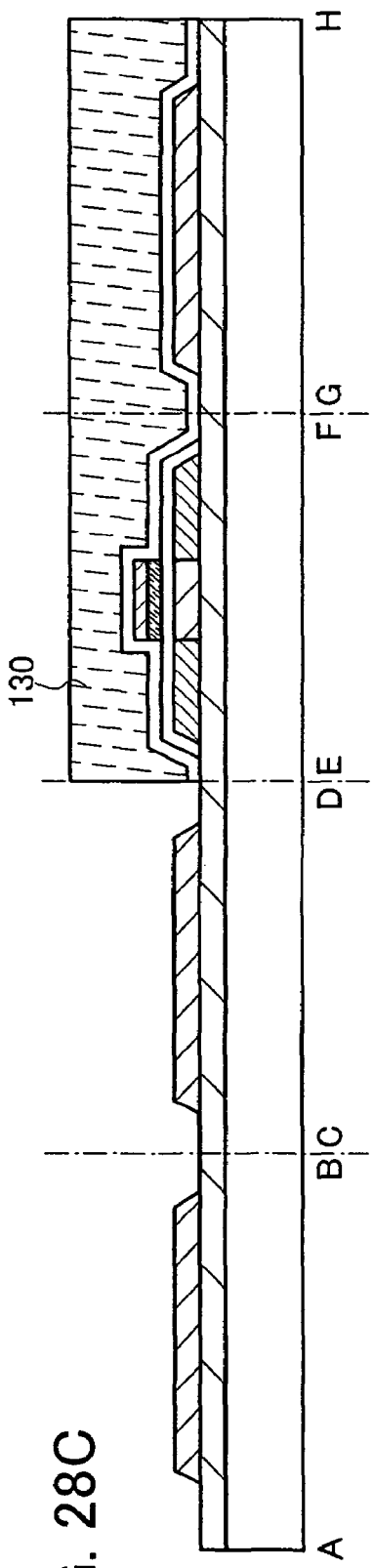

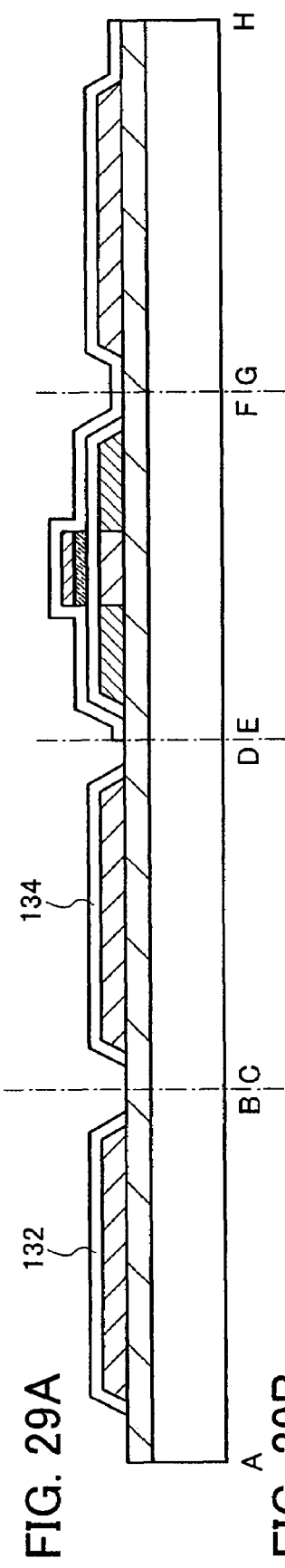
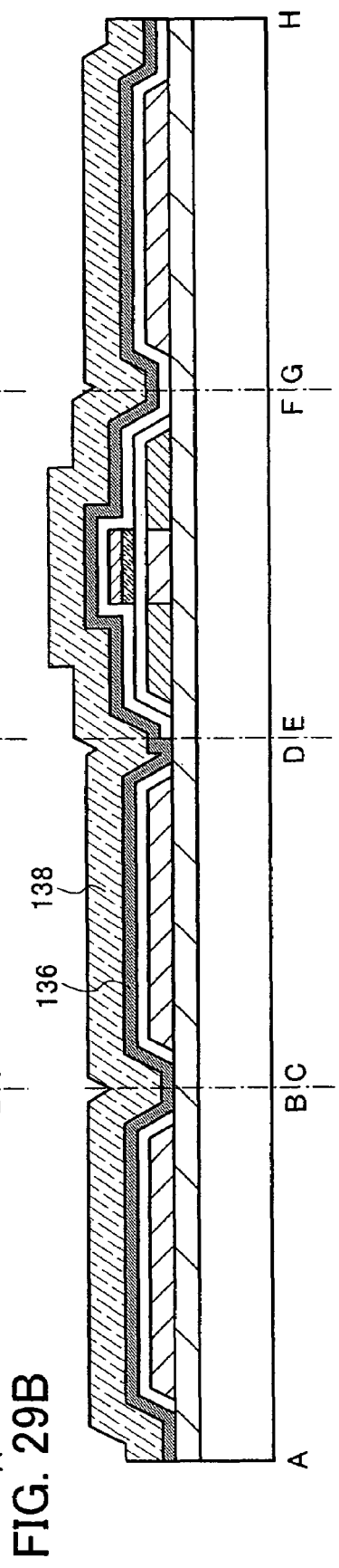
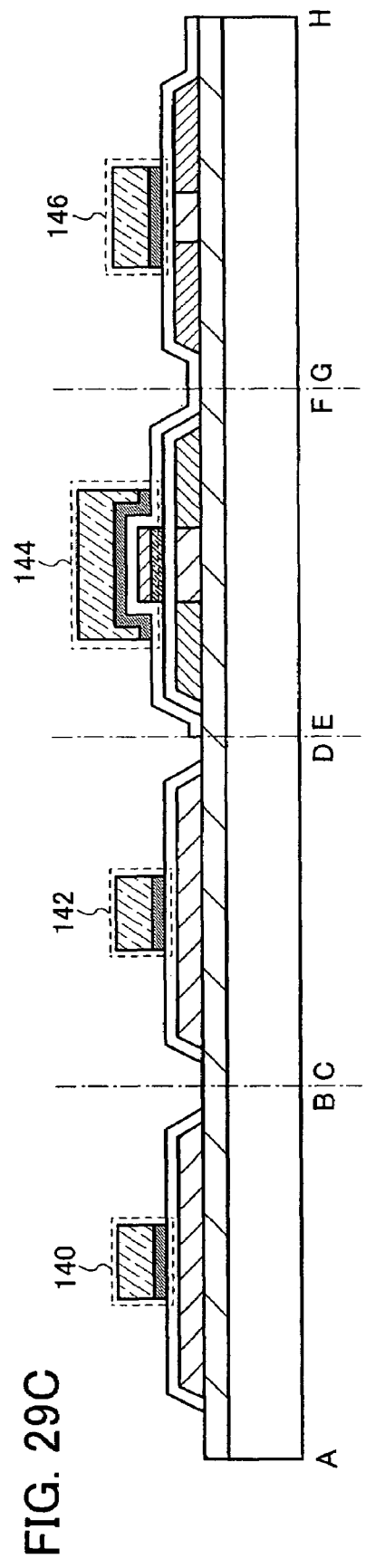
FIG. 29A
FIG. 29B
FIG. 29C

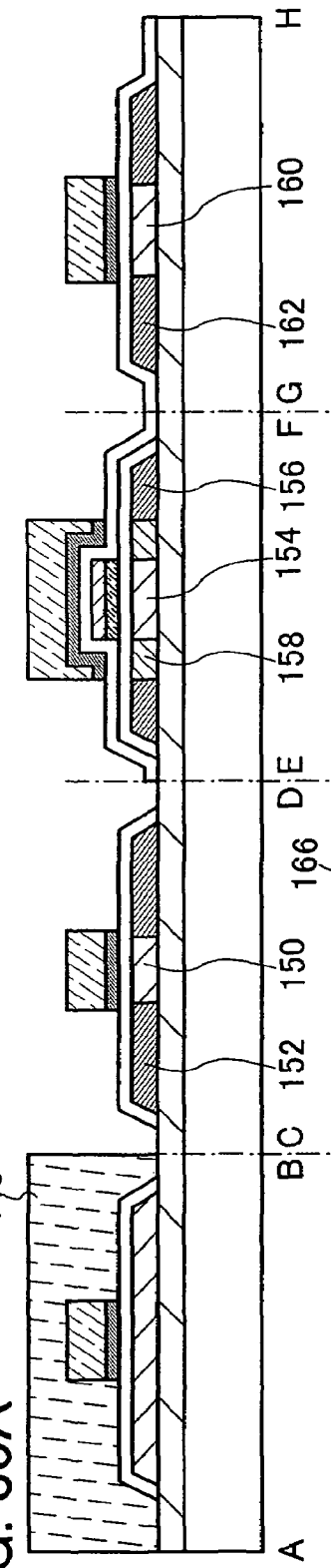
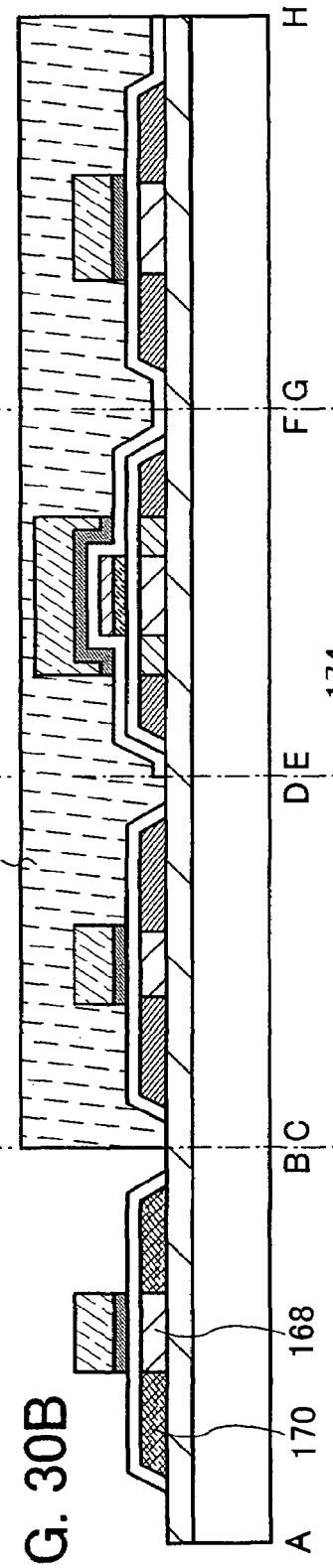
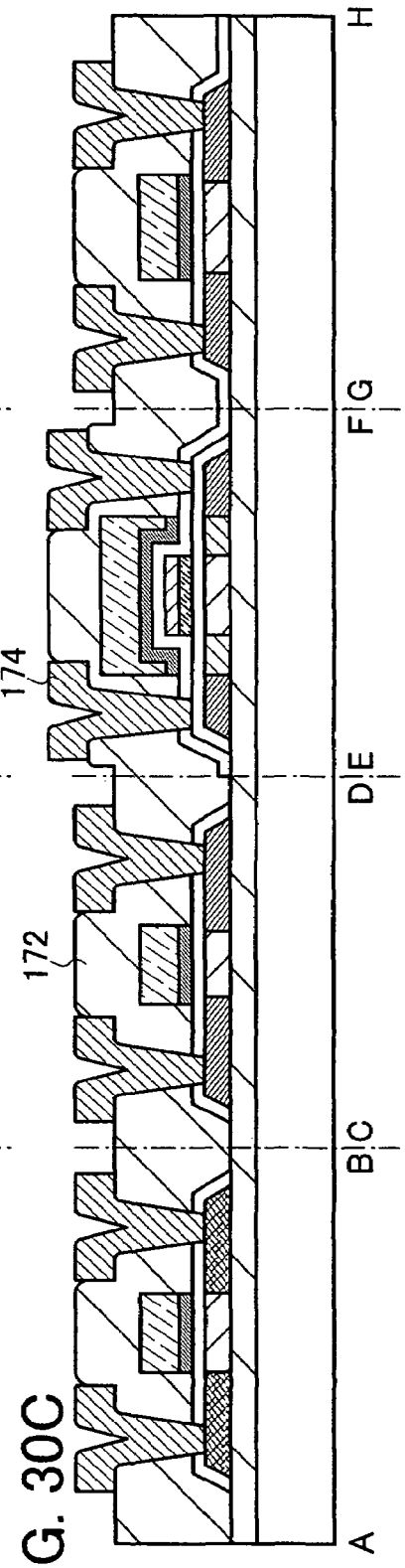

FIG. 34
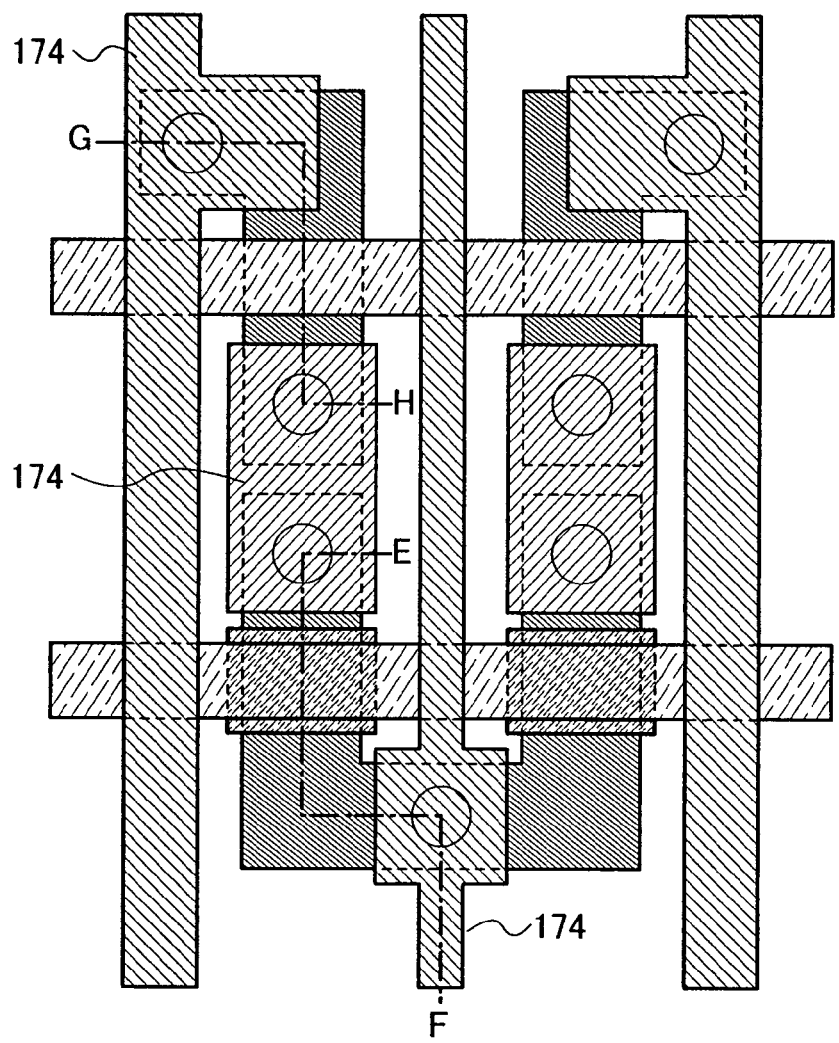
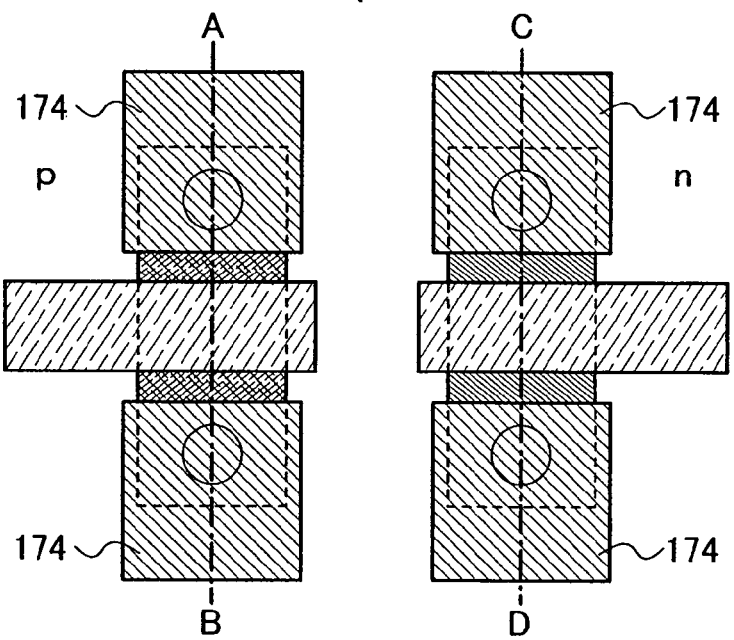

FIG. 41
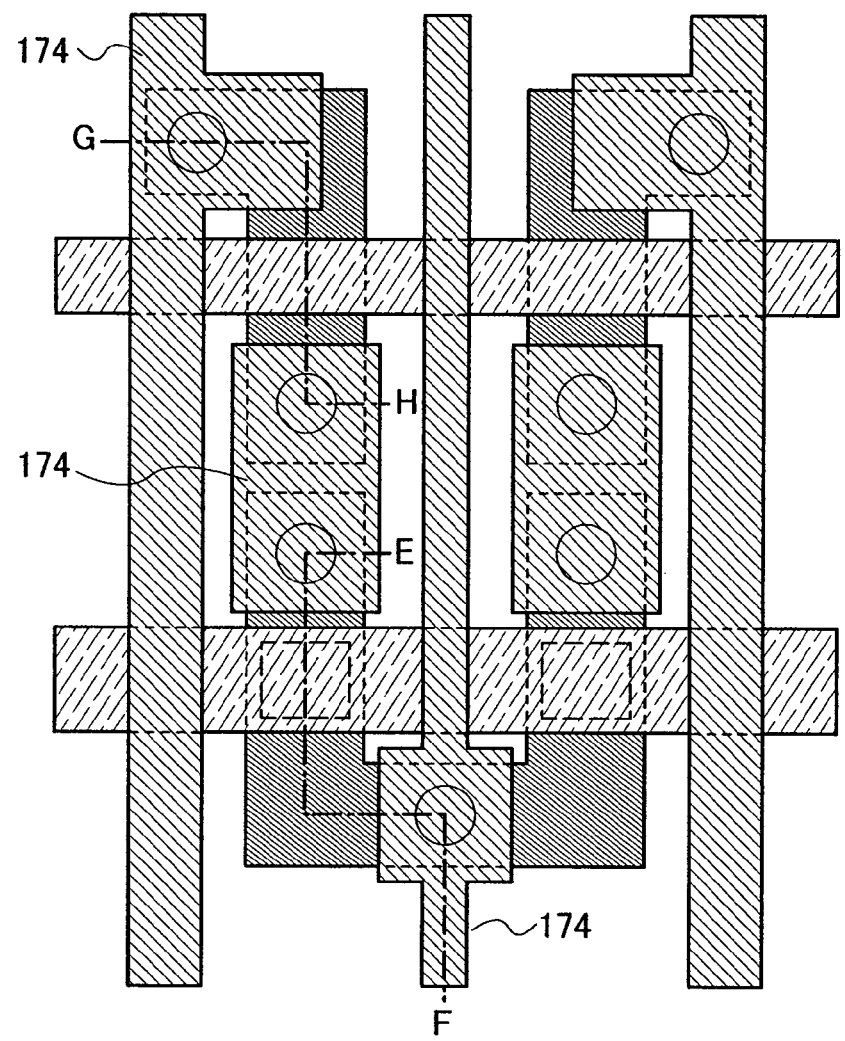
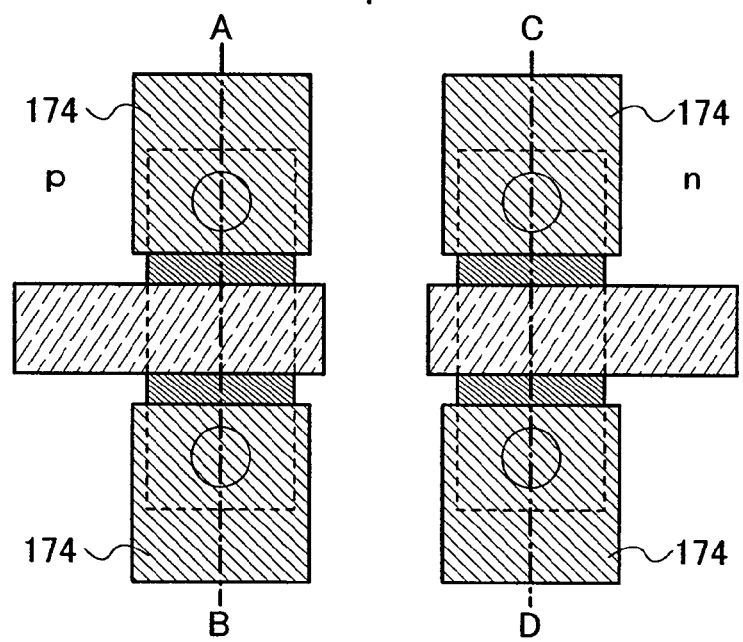

FIG. 45
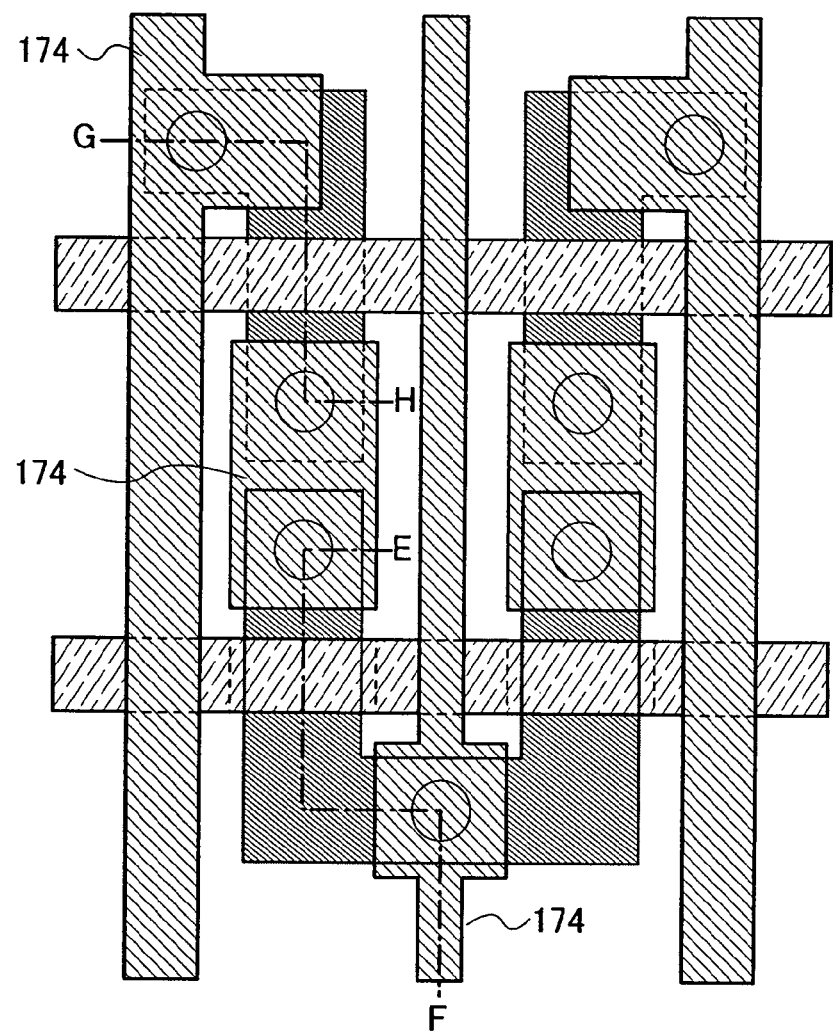
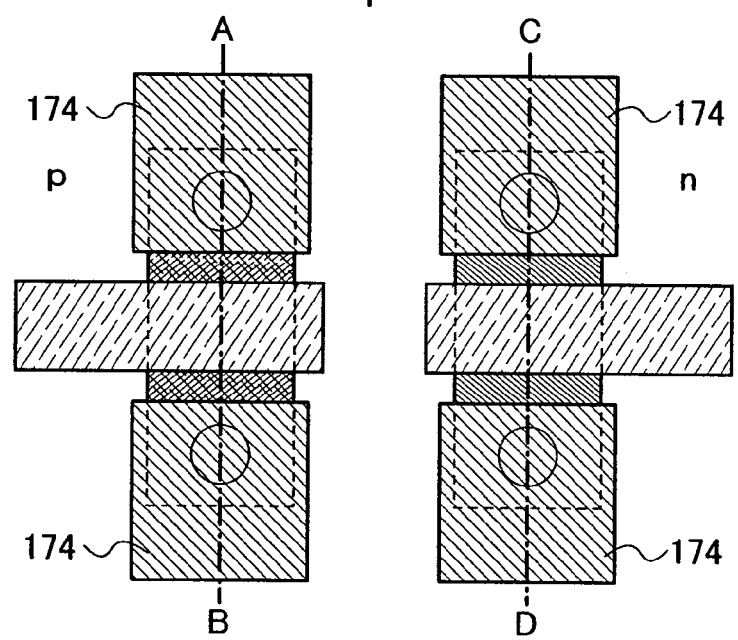

NONVOLATILE SEMICONDUCTOR MEMORY DEVICE HAVING FLOATING GATE THAT INCLUDES TWO LAYERS

BACKGROUND OF THE INVENTION

1. Field of the Invention

The present invention relates to a nonvolatile semiconductor memory device that is electrically writable, readable, and erasable, and its manufacturing method. In particular, the present invention relates to a structure of a floating gate in the nonvolatile semiconductor memory device.

2. Description of the Related Art

The market is expanding for nonvolatile memories in which data can be electrically rewritten and data can be stored even after the power is turned off. Features of a nonvolatile memory lie in that its structure is similar to that of a MOSFET (Metal Oxide Semiconductor Field Effect Transistor) and a region capable of accumulating charges for a long period of time is provided over a channel forming region. Such a charge accumulating region is also referred to as a floating gate since it is formed over an insulating layer and is insulated and isolated from its surroundings. Since the floating gate is surrounded by an insulator and is electrically insulated from the surroundings, there is a feature that the floating gate retains charges that are injected thereto. A gate electrode called a control gate is further provided over the floating gate with an insulating layer interposed therebetween. The control gate is distinguished from the floating gate by application of predetermined voltage to the control gate in data writing or reading.

In a so-called floating gate type nonvolatile memory having such a structure, data is stored through electrical control of charge injection to and discharge from the floating gate. Specifically, charges are injected to and discharged from the floating gate by application of high voltage between a semiconductor layer in which a channel forming region is formed and a control gate. It is said that Fowler-Nordheim (F-N) type tunnel current (NAND type) or hot electrons (NOR type) flow at this time through an insulating layer over the channel forming region at this time. Accordingly, the insulating layer is also referred to as a tunnel insulating layer.

The floating gate type nonvolatile memory is required to have a property, for securing reliability, that charges accumulated in the floating gate can be retained for 10 years or more. Accordingly, the tunnel insulating layer is required to have a thickness that allows a tunnel current to flow and to have a high insulating property so that charges do not leak.

In addition, the floating gate formed over the tunnel insulating layer is formed using silicon that is the same semiconductor material as that of the semiconductor layer in which the channel forming region is formed. Specifically, a method for forming the floating gate using polycrystalline silicon has been widely used, and for example, a polysilicon film deposited with a thickness of 400 nm is known (refer to Patent Document 1: Japanese Published Patent Application No. 2000-58685, p 7, FIG. 7)

SUMMARY OF THE INVENTION

Since a floating gate of a nonvolatile memory is formed of polycrystalline semiconductor, the energy level at a conduction band bottom thereof is equal to that of a semiconductor layer (channel forming region) formed of the same silicon material. If the thickness of polycrystalline silicon of the floating gate is reduced, the energy level at the conduction band bottom becomes higher than that of the semiconductor layer. With such a difference in energy level, fewer electrons are injected from the semiconductor layer to the floating gate and writing voltage becomes high. In order to make any reduction in write voltage of a nonvolatile memory a floating gate of which is formed of polycrystalline silicon, it is necessary to shift the Fermi level to the conduction band side by adding an n-type impurity such as phosphorus or arsenic to the floating gate. In addition, a gate insulating layer provided between the floating gate and the semiconductor layer is required to have small thickness in order to inject charges to the floating gate with low voltage. On the other hand, in order to stably maintain charges for a long period of time, the gate insulating layer is required to have large thickness to prevent charge leakage and impurity entry.

Eventually, a conventional nonvolatile memory requires high write voltage and secures reliability by taking countermeasures such as error detection and error correction by providing a redundant memory cell or devising a controller, for deterioration of charge retention characteristics due to repetitive rewriting.

It is an object of the present invention to provide a nonvolatile semiconductor memory device having excellent writing property and charge-retention property.

One aspect of the present invention is a nonvolatile semiconductor memory device including a semiconductor layer having a channel forming region between a pair of impurity regions which are formed apart from each other; and a first insulating layer over the channel forming region; a floating gate over the channel forming region with the first insulating layer interposed therebetween; a second insulating layer over the floating gate; and a control gate over the floating gate with the second insulating layer interposed therebetween. In the present invention, the floating gate includes at least a first layer formed of a semiconductor material and a second layer formed of a metal material, or an alloy material or a metal compound material thereof. In other words, the floating gate of the nonvolatile semiconductor memory device according to the present invention includes a semiconductor layer, and a metal layer, an alloy layer, or a metal compound layer with a barrier property which is provided on a second insulating layer side of the semiconductor layer for preventing corrosion of the semiconductor layer. The semiconductor material forming the floating gate can be selected to meet the following requirements in relation to the semiconductor layer forming the channel forming region.

The semiconductor material forming the floating gate can be selected to satisfy one or a plurality of the following conditions. A band gap of the semiconductor material forming the floating gate is preferably smaller than that of the semiconductor layer. For example, a difference between the band gap of the semiconductor material forming the floating gate and the band gap of the semiconductor layer is preferably 0.1 eV or more, and the former is preferably smaller. A band gap of the second insulating layer provided in contact with the floating gate is preferably larger than that of the semiconductor material forming the floating gate.

In addition, the semiconductor material preferably has lower resistivity than a material forming the semiconductor layer. The resistivity is preferably 40 $\Omega$·cm to 100 $\Omega$·cm.

The semiconductor material forming the floating gate is typically and preferably germanium or a germanium compound.

The floating gate is applied to the nonvolatile semiconductor memory device according to the present invention for charge accumulation. Without limitation to germanium or a germanium compound, a layer of germanium oxide or germanium nitride, or an oxide layer or a nitride layer including germanium or a germanium compound can be used as long as it has a similar function (as long as it functions as a charge accumulating layer).

The second layer constituting a part of the floating gate is preferably formed of a metal, or an alloy or a metal compound thereof. The metal is preferably a refractory metal such as tungsten (W), tantalum (Ta), titanium (Ti), molybdenum (Mo), chromium (Cr), or nickel (Ni). The alloy may be an alloy using plural kinds of the refractory metals. The alloy may be formed using the refractory metal and niobium, zirconium, cerium, thorium, or hafnium. Alternatively, oxide or nitride of the refractory metal may be used. A metal nitride such as tantalum nitride, tungsten nitride, molybdenum nitride, or titanium nitride may be used. A metal oxide such as tantalum oxide, titanium oxide, or molybdenum oxide may be used.

In the nonvolatile semiconductor memory device according to the present invention, a semiconductor layer is preferably formed over an insulating surface and isolated into an island shape. At least a semiconductor layer forming a memory element and a semiconductor layer forming a logic circuit are preferably separated from each other. In other words, one feature of the present invention is a nonvolatile semiconductor memory device including a semiconductor layer having a channel forming region between a pair of impurity regions which are formed apart from each other; and a first insulating layer, a floating gate, a second insulating layer, and a control gate over the semiconductor layer which roughly overlap with the channel forming region. This nonvolatile semiconductor memory device may include a semiconductor layer formed over an insulating surface.

When a floating gate is formed over a semiconductor layer with a first insulating layer functioning as a tunnel insulating layer interposed therebetween, through formation of the floating gate using a semiconductor material including at least germanium, charges can be easily injected from the semiconductor layer to the floating gate, and a charge-retention property of the floating gate can be improved. When a layer is further formed of a metal, or an alloy or a metal compound thereof in contact with the floating gate, this layer can serve as a barrier layer for improving water resistance of the floating gate and preventing corrosion thereof. Accordingly, deterioration of the floating gate can be suppressed.

Through formation of a floating gate using a layer made of a metal, or an alloy or a metal compound thereof, a nonvolatile semiconductor memory device with excellent characteristics can be manufactured without reduction in productivity. Since germanium is a semiconductor and a material which belongs to Group 14 of the periodic table like silicon, microfabrication of a thin film can be performed without a burden on the manufacturing equipment.

BRIEF DESCRIPTION OF THE DRAWINGS

In the accompanying drawings:

FIG. 5 is an energy band diagram of a nonvolatile memory in an erasing state;

FIG. 8 is a diagram showing an example of an equivalent circuit of a nonvolatile memory cell array;

FIG. 9 is a diagram showing an example of an equivalent circuit of a NOR type nonvolatile memory cell array;

FIGS. 20A to 20C are diagrams showing an example of a manufacturing method of a nonvolatile semiconductor memory device of the present invention;

FIGS. 21A to 21C are diagrams showing an example of a manufacturing method of a nonvolatile semiconductor memory device of the present invention;

FIGS. 22A to 22C are diagrams showing an example of a manufacturing method of a nonvolatile semiconductor memory device of the present invention;

FIGS. 23A to 23C are diagrams showing an example of a manufacturing method of a nonvolatile semiconductor memory device of the present invention;

FIGS. 24A and 24B are diagrams showing an example of a manufacturing method of a nonvolatile semiconductor memory device of the present invention;

FIGS. 28A to 28C are diagrams showing an example of a manufacturing method of a nonvolatile semiconductor memory device of the present invention;

FIGS. 29A to 29C are diagrams showing an example of a manufacturing method of a nonvolatile semiconductor memory device of the present invention;

FIGS. 30A to 30C are diagrams showing an example of a manufacturing method of a nonvolatile semiconductor memory device of the present invention;

FIG. 34 is a diagram showing an example of a top view of a nonvolatile semiconductor memory device of the present invention;

FIG. 41 is a diagram showing an example of a top view of a nonvolatile semiconductor memory device of the present invention;

FIG. 45 is a diagram showing an example of a top view of a nonvolatile semiconductor memory device of the present invention.

DESCRIPTION OF THE INVENTION

Figure 1:
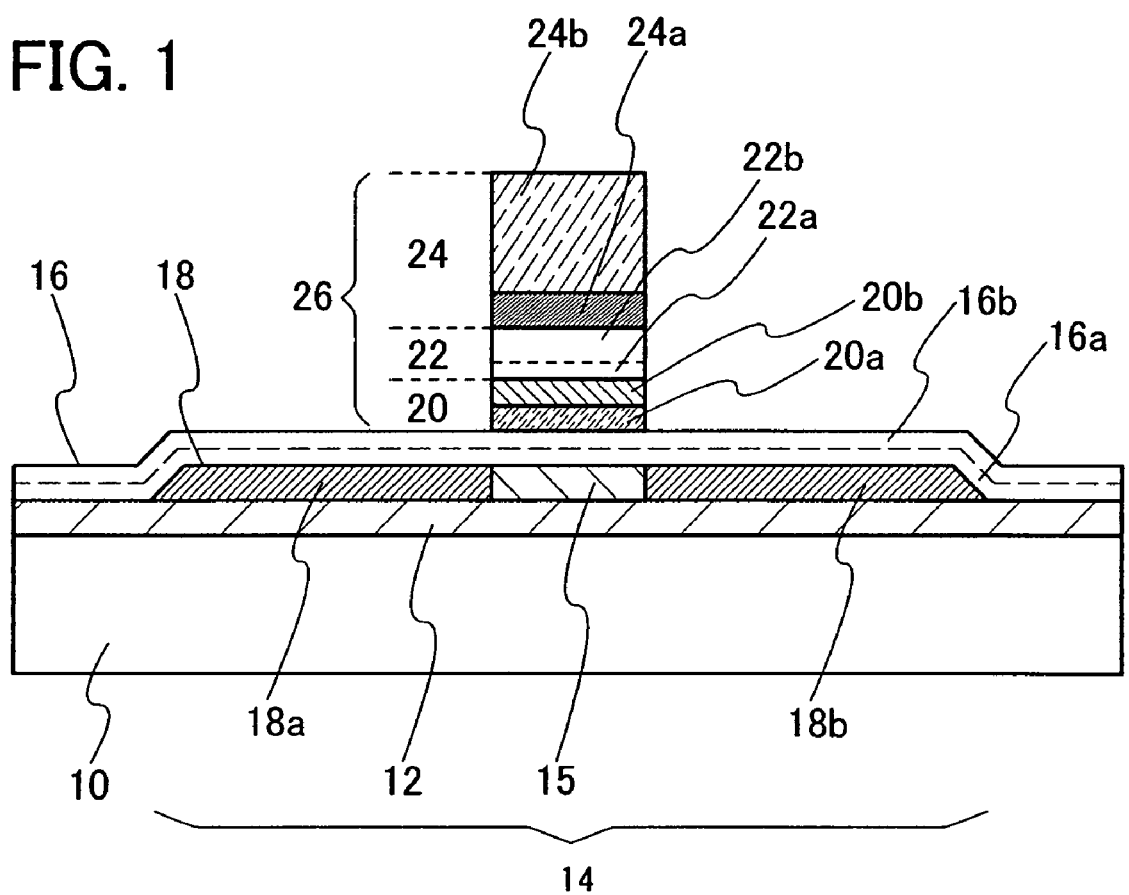
FIG. 1 is a cross-sectional view showing a major structure of a nonvolatile semiconductor memory device according to the present invention.

Hereinafter, an embodiment mode of the present invention will be explained with reference to the accompanying drawings. It is to be noted that the present invention is not limited to the following description, and it is easily understood by those skilled in the art that the modes and details thereof can be modified in various ways without departing from the spirit and the scope of the present invention. Therefore, the present invention should not be interpreted as being limited to the following description of the embodiment mode. In a structure of the present invention, which will be explained below, the same reference numerals may be used in common to denote the same portions in different drawings.

FIG. 1 is a cross-sectional view showing a major structure of a nonvolatile semiconductor memory device according to the present invention. FIG. 1 particularly shows a main part of a nonvolatile memory element. The nonvolatile memory element is manufactured using a substrate 10 having an insulating surface. The substrate 10 having an insulating surface can be a glass substrate, a quartz substrate, a sapphire substrate, a ceramic substrate, a metal substrate provided with an insulating layer on the surface, or the like.

A semiconductor layer 14 is formed over the substrate 10 having an insulating surface. A base insulating layer 12 may be provided between the substrate 10 and the semiconductor layer 14. The base insulating layer 12 prevents contamination due to diffusion of an impurity such as alkali metal from the substrate 10 to the semiconductor layer 14, and may appropriately be provided as a blocking layer.

The base insulating layer 12 is formed by a CVD method, a sputtering method, or the like using an insulating material such as silicon oxide, silicon nitride, silicon oxynitride ($SiO_xN_y$, (x>y)), or silicon nitride oxide ($SiN_xO_y$, (x>y)). For example, in the case of the base insulating layer 12 with a two-layer structure, a silicon nitride oxide film may be formed as a first insulating layer, and a silicon oxynitride film may be formed as a second insulating layer. Alternatively, a silicon nitride film may be formed as the first insulating layer, and a silicon oxide film may be formed as the second insulating layer.

The semiconductor layer 14 is preferably formed using a single crystal semiconductor or a polycrystalline semiconductor. For example, the semiconductor layer 14 can be formed as follows: a semiconductor layer is formed over the entire surface of the substrate 10 by a sputtering method, a plasma CVD method, or a low-pressure CVD method, and the semiconductor layer is crystallized and then selectively etched. In other words, for the purpose of element separation, it is preferable to form an island-like semiconductor layer over an insulating surface and to form one or a plurality of nonvolatile memory elements using the island-like semiconductor layer. Silicon is preferable as a semiconductor material. Alternatively, a silicon-germanium semiconductor can also be used. The semiconductor layer can be crystallized employing a laser crystallization method, a crystallization method by heat treatment using rapid thermal annealing (RTA) or an annealing furnace, a crystallization method using a metal element which promotes crystallization, or a combination thereof. Alternatively, instead of such a thin film process, a so-called SOI (Silicon on Insulator) substrate in which a single crystal semiconductor layer is formed over an insulating surface may be used.

When the semiconductor layer is separately formed into an island shape over an insulating surface, element separation can be effectively achieved even in the case where a memory element array and a peripheral circuit are formed over the same substrate. In other words, even when a memory element array required to perform writing or erasing with a voltage of approximately 10 V to 20 V and a peripheral circuit mainly performing data input/output or instruction control while operating with a voltage of approximately 3 V to 7 V are formed over the same substrate, mutual interference due to a difference in voltage applied to elements can be prevented.

A p-type impurity may be added to the semiconductor layer 14. The p-type impurity may be, for example, boron and may be added at a concentration of approximately $5 \times 10^{15}$ $cm^{-1}$ to $1 \times 10^{16}$ $cm^{-3}$. This impurity controls threshold voltage of a transistor and effectively functions when added to a channel forming region 15. The channel forming region 15 formed in a region which almost corresponds to a gate 26, which will be described later, is positioned between a pair of impurity regions 18 of the semiconductor layer 14.

The pair of impurity regions 18 function as a source and a drain in the nonvolatile memory element. The pair of impurity regions 18 are formed by addition of phosphorus or arsenic which is an n-type impurity at a concentration of approximately $1\times10^{19}$ cm$^{-3}$ to $1\times10^{21}$ cm$^{-3}$.

Over the semiconductor layer 14, a first insulating layer 16, a floating gate electrode 20, a second insulating layer 22, and a control gate electrode 24 are formed. In this specification, a stacked structure from the floating gate electrode 20 to the control gate electrode 24 may be referred to as the gate 26.

The first insulating layer 16 can be formed using silicon oxide or a stacked structure of silicon oxide and silicon nitride. The first insulating layer 16 may be formed through deposition of an insulating film by a plasma CVD method or a low-pressure CVD method but is preferably formed through solid phase oxidation or solid phase nitridation by plasma treatment. This is because an insulating layer which is formed through oxidation or nitridation of the semiconductor layer (typically, a silicon layer) by plasma treatment has a dense film quality, high withstand voltage, and high reliability. The first insulating layer 16 is preferably durable as described above since it is used as a tunnel insulating layer for injecting charges (carriers) to the floating gate electrode 20. The first insulating layer 16 is preferably formed with a thickness of 1 nm to 20 nm, more preferably 3 nm to 6 nm. For example, in the case where the gate length is to be 500 nm, the first insulating layer 16 can be formed with a thickness of 3 nm to 6 nm.

In solid phase oxidation treatment or solid phase nitridation treatment by plasma treatment, plasma is preferably used, which is excited by microwaves (typically, 2.45 GHz) and has an electron density of $1\times10^{11}$ cm$^{-3}$ to $1\times10^{13}$ cm$^{-3}$ and an electron temperature of 0.5 eV to 1.5 eV. This is in order to form a dense insulating layer and to obtain a practical reaction rate in solid phase oxidation treatment or solid phase nitridation treatment at a temperature of 500° C. or less.

When the surface of the semiconductor layer 14 is oxidized by this plasma treatment, the plasma treatment is performed in an oxygen atmosphere (for example, an atmosphere containing oxygen ($O_2$) or dinitrogen monoxide ($N_2O$) and a rare gas (at least one of He, Ne, Ar, Kr, and Xe), or an atmosphere containing oxygen or dinitrogen monoxide, hydrogen ($H_2$), and a rare gas). Further, when the surface of the semiconductor layer 14 is nitrided by the plasma treatment, the plasma treatment is performed in a nitrogen atmosphere (for example, an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. Alternatively, a gas in which Ar and Kr are mixed may be used.

Figure 15:
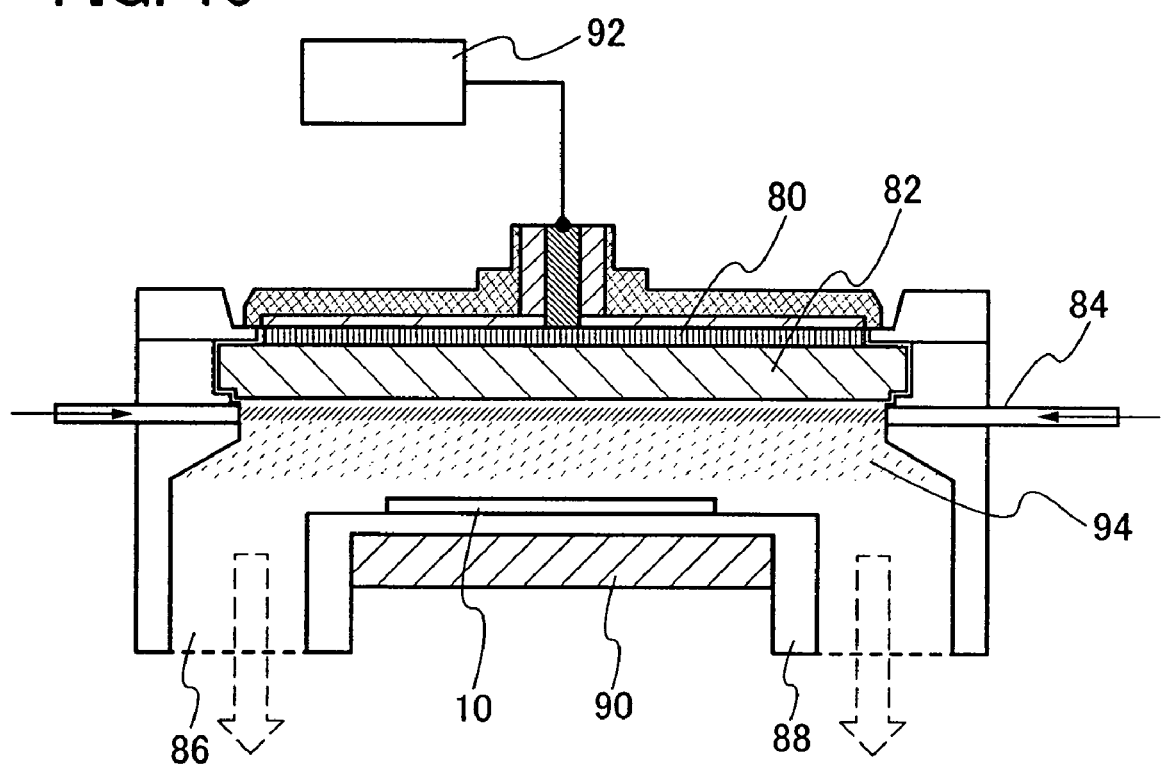
FIG. 15 is a diagram showing a structure of a plasma treatment apparatus.

FIG. 15 shows a structural example of an apparatus for performing plasma treatment. This plasma treatment apparatus includes a support 88 on which the substrate 10 is arranged, a gas supplying portion 84 for introducing a gas, an exhaust port 86 connected to a vacuum pump for exhausting a gas, an antenna 80, a dielectric plate 82, and a microwave supplying portion 92 which supplies a microwave for plasma generation. In addition, the support 88 can be provided with a temperature controlling portion 90 to control the temperature of the substrate 10.

Hereinafter, plasma treatment will be explained. It is to be noted that the plasma treatment includes oxidation treatment, nitridation treatment, oxynitridation treatment, hydrogenation treatment, and surface modification treatment performed to a semiconductor layer, an insulating layer, and a conductive layer. For each treatment, a gas supplied from the gas supplying portion 84 may be selected in accordance with an intended purpose.

Oxidation treatment or nitridation treatment may be performed as follows. First, a processing chamber is evacuated and a gas containing oxygen or nitrogen for plasma treatment is introduced from the gas supplying portion 84. The substrate 10 is at the room temperature or heated at a temperature of 100° C. to 550° C. by the temperature controlling portion 90. It is to be noted that the distance between the substrate 10 and the dielectric plate 82 is approximately 20 mm to 80 mm (preferably 20 mm to 60 mm). Next, microwaves are supplied from the microwave supplying portion 92 to the antenna 80. Then, the microwaves are introduced from the antenna 80 into the processing chamber through the dielectric plate 82; thus, plasma 94 is generated. When the plasma is excited by the introduced microwaves, plasma which has low electron temperature (3 eV or less, preferably 1.5 eV or less) and high electron density ($1\times10^{11}$ cm$^{-3}$ or more) can be generated. With oxygen radicals (containing OH radicals in some cases) and/or nitrogen radicals (containing NH radicals in some cases) generated by this high-density plasma, the surface of the semiconductor layer can be oxidized and/or nitrided. A plasma treatment gas mixed with a rare gas such as argon enables oxygen radicals or nitrogen radicals to be generated efficiently due to excited species of a rare gas. Through the effective use of active radicals excited by plasma in this method, oxidation, nitridation, or oxynitridation by a solid phase reaction can be performed at a low temperature of 500° C. or less.

In FIG. 1, as one preferable example of the first insulating layer 16 formed by plasma treatment, a silicon oxide layer 16a is formed over the semiconductor layer 14 with a thickness of 3 nm to 6 nm by performing the plasma treatment in an oxygen atmosphere, and the surface of the silicon oxide layer 16a is treated with nitridation plasma to form a nitrogen plasma treatment layer 16b. Specifically, the silicon oxide layer 16a is first formed over the semiconductor layer 14 by plasma treatment in oxygen atmosphere with a thickness of 3 nm to 6 nm. Then, the nitrogen plasma treatment layer 16b with high nitrogen concentration is successively provided on or adjacent to the surface of the silicon oxide layer through plasma treatment in nitrogen atmosphere. Note that the expression "adjacent to the surface" refers to a region with a depth of approximately 0.5 nm to 1.5 nm from the surface of the silicon oxide layer. For example, nitrogen is included at a rate of 20 atomic % to 50 atomic % in a region of the silicon oxide layer 16a with a depth of approximately 1 nm from the surface through plasma treatment in nitrogen atmosphere.

The surface of a silicon layer, which is a typical example of the semiconductor layer 14, is oxidized by plasma treatment to form a dense oxide film which has no distortion at the interface. In addition, a nitride layer is formed through nitridation of the oxide film by plasma treatment and through substitution of nitrogen for oxygen on the surface side, and thus, the layer can be denser. Due to this plasma treatment, an insulating layer which has high withstand voltage can be formed.

In any case, through the use of solid phase oxidation treatment or solid phase nitridation treatment by the plasma treatment as described above, an insulating layer similar to a thermal oxide film, which is formed at 950° C. to 1100° C., can be obtained even when using a glass substrate having a temperature limit of 700° C. or less. In other words, a highly reliable tunnel insulating layer can be formed as the tunnel insulating layer of the nonvolatile memory element.

The floating gate electrode 20 is formed over the first insulating layer 16. This floating gate electrode 20 includes a first floating gate electrode layer 20a and a second floating gate electrode layer 20b. Of course, the floating gate electrode is not limited to the two-layer structure, and a plurality of layers may be stacked. The first floating gate electrode layer 20a which is formed in contact with the first insulating layer 16 is preferably formed using a semiconductor material, and a material which satisfies one or a plurality of the following conditions can be selected.

It is preferable that a band gap of a semiconductor material forming the first floating gate electrode layer 20a be smaller than that of the semiconductor layer 14. For example, it is preferable that a band gap of a semiconductor material forming the first floating gate electrode layer 20a and a band gap of the semiconductor layer 14 have a difference of 0.1 eV or more, and the former be smaller. This is because when an energy level at the conduction band bottom of the floating gate electrode 20 is lower than that of the semiconductor layer 14, injectability of carriers (electrons) and a charge-retention property can be improved.

The semiconductor material forming the first floating gate electrode layer 20a preferably has lower resistivity than a material forming the semiconductor layer 14. When the first floating gate electrode layer 20a is formed of a semiconductor material with low resistivity, voltage applied between the control gate electrode and the semiconductor layer can be prevented from being divided by the floating gate electrode, and electric field can be made to effectively act on the semiconductor layer. For example, germanium is preferable because it has a specific resistance of 40 Ω·cm to 70 Ω·cm. An n-type impurity may be added to the first floating gate electrode layer 20a in order to lower resistivity. Writing characteristics can be improved when the first floating gate electrode layer 20a is thus formed using a material having a smaller band gap and a lower resistivity than that of the semiconductor layer 14.

The semiconductor material forming the first floating gate electrode layer 20a is selected so that barrier energy for electrons of the first floating gate electrode layer 20a, which is formed by the first insulating layer 16, is higher than barrier energy for electrons in the semiconductor layer 14, which is formed by the first insulating layer 16. This is in order to facilitate carrier (electron) injection from the semiconductor layer 14 to the first floating gate electrode layer 20a and prevent charges from being discharged from the first floating gate electrode layer 20a.

Germanium or a germanium compound can typically be selected to satisfy the above conditions. Silicon germanium is given as a typical example of germanium compound. In this case, preferably, germanium of 10 atomic % or more is contained in silicon. With the concentration of germanium of less than 10 atomic %, effect as a constituent element is weakened, and a band gap does not become smaller effectively.

Of course, other materials can also be employed to form the first floating gate electrode layer 20a as long as they have similar effects. For example, a ternary semiconductor material containing germanium can be used. The semiconductor material may be hydrogenated. As a floating gate electrode functioning as a charge-accumulating layer of the nonvolatile memory element, a layer of oxide or nitride of germanium or a germanium compound, or an oxide layer or a nitride layer containing germanium or a germanium compound can be used.

The second floating gate electrode layer 20b provided on the second insulating layer 22 side in contact with the first floating gate electrode layer 20a is preferably formed of a metal, or an alloy or a metal compound thereof. The metal is preferably a refractory metal such as tungsten (W), tantalum (Ta), titanium (Ti), molybdenum (Mo), chromium (Cr), or nickel (Ni). An alloy using plural kinds of the refractory metals may be used. The alloy may be formed using the refractory metal and niobium, zirconium, cerium, thorium, or hafnium. Alternatively, oxide or nitride of the refractory metal may be used. Metal nitride such as tantalum nitride, tungsten nitride, molybdenum nitride, or titanium nitride may be used. Metal oxide such as tantalum oxide, titanium oxide, or molybdenum oxide may be used.

When the second floating gate electrode layer 20b is thus formed of a metal or the like, the first floating gate electrode layer 20a can be stabilized. In other words, when the second floating gate electrode layer 20b is provided on the upper layer side of the first floating gate electrode layer 20a formed using germanium or a germanium compound, the second floating gate electrode layer 20b can be used as a barrier layer against water and chemicals in the manufacturing process. Therefore, the substrate can be easily handled in a photolithography step, an etching step, or a cleaning step, whereby productivity can be improved. In other words, the floating gate can be easily processed.

The second insulating layer 22 is formed by a low-pressure CVD method, a plasma CVD method, or the like using one or a plurality of layers of silicon oxide, silicon oxynitride ($SiO_xN_y$, (x>y)), silicon nitride ($SiN_x$), silicon nitride oxide ($SiN_xO_y$, (x>y)), aluminum oxide ($Al_xO_y$), and the like. The second insulating layer 22 is formed with a thickness of 1 nm to 20 nm, preferably 5 nm to 10 nm. For example, a silicon nitride layer 22a is deposited with a thickness of 3 nm, and a silicon oxide layer 22b is deposited thereover with a thickness of 5 nm, which can be used as the second insulating layer 22.

Alternatively, the second insulating layer 22 may be formed by depositing silicon oxynitride ($SiO_xN_y$ (x>y)) by a CVD method and then subjecting it to nitridation treatment through the plasma treatment. The second insulating layer 22 may be formed by depositing silicon nitride oxide ($SiN_xO_y$, (x>y)) by a plasma CVD method and then subjecting it to oxidation treatment through the plasma treatment. When an insulating layer formed by a plasma CVD method or the like is thus subjected to plasma treatment for nitridation or oxidation treatment, dielectric voltage can be improved. If such an insulating layer is used as the second insulating layer 22, it is possible to prevent leakage of charges accumulated in the floating gate electrode 20 to the control gate electrode 24 side.

The control gate electrode 24 is preferably formed using a metal such as tantalum (Ta), tungsten (W), titanium (Ti), molybdenum (Mo), chromium (Cr), or niobium (Nb), or an alloy material or a compound material containing the metal as its main component. In addition, polycrystalline silicon to which an impurity element such as phosphorus is added can be used. Alternatively, the control gate electrode 24 may be formed using a stacked structure of a metal nitride layer 24a with a single layer or a plurality of layers and a metal layer 24b formed using the above metal. The metal nitride can be tungsten nitride, molybdenum nitride, or titanium nitride. By providing the metal nitride layer 24a, adhesion of the metal layer 24b can be improved, whereby the metal layer 24b can be prevented from peeling. In addition, since metal nitride such as tantalum nitride has a high work function, the thickness of the first insulating layer 16 can be increased due to synergistic effect with the second insulating layer 22.

An operation mechanism of the nonvolatile memory element shown in FIG. 1 will be explained with reference to energy band diagrams. In the following energy band diagrams, the same elements as those in FIG. 1 are denoted by the same reference numerals.

Figure 2:
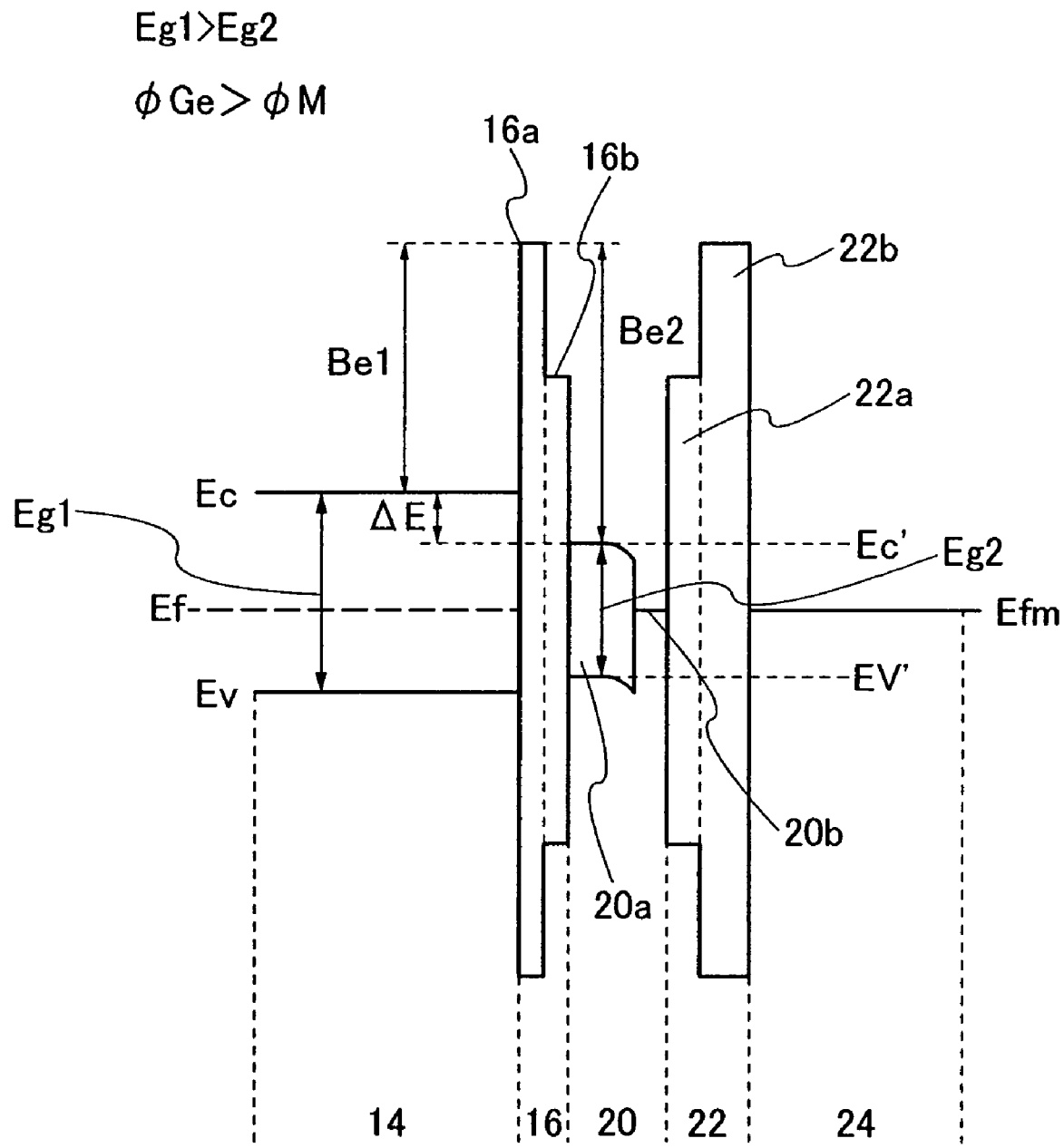
FIG. 2 is an energy band diagram of a nonvolatile memory in an initial state (charge emission state)

FIG. 2 shows a state where the semiconductor layer 14, the first insulating layer 16, the floating gate electrode 20, the second insulating layer 22, and the control gate electrode 24 are stacked. FIG. 2 shows the case where voltage is not applied to the control gate electrode 24, and a Fermi level Ef of the semiconductor layer 14 and a Fermi level Efm of the control gate electrode 24 are equal to each other.

The semiconductor layer 14 and at least the first floating gate electrode layer 20a of the floating gate electrode 20, between which the first insulating layer 16 is interposed are formed using different materials. A band gap Eg1 (an energy difference between a lower end Ec of the conduction band and an upper end Ev of the valence band) of the semiconductor layer 14 and a band gap Eg2 of the first floating gate electrode layer 20a are to be different from each other, and the first floating gate electrode layer 20a has a smaller band gap than that of the semiconductor layer 14. For example, silicon (1.12 eV) can be used for the semiconductor layer 14, whereas germanium (0.72 eV) or silicon germanium (0.73 eV to 1.0 eV) can be used for the first floating gate electrode layer 20a. Germanium or silicon germanium may be hydrogenated. In this case, it is acceptable as long as the hydrogen content of germanium or silicon germanium is 1 atomic % to 30 atomic %. When the first floating gate electrode layer 20a is formed of germanium containing hydrogen, recombination centers at the interface with the first insulating layer 16 can be reduced.

When a metal layer is used as the second floating gate electrode layer 20b, the metal layer can be formed using a material with a work function lower than that of the first floating gate electrode layer 20a. This is because a barrier is not formed against carriers (electrons) that are injected to the second floating gate electrode layer 20b. This facilitates carrier (electron) injection from the semiconductor layer 14 to the second floating gate electrode layer 20b. For example, the work function of germanium which can be used for the first floating gate electrode layer 20a is 5.0 eV, so that tungsten (work function: 4.55 eV), tantalum (4.25 eV), titanium (4.33 eV), molybdenum (4.6 eV), or chromium (4.5 eV) can be used.

It is to be noted that the first insulating layer 16 includes the silicon oxide layer 16a (approximately 8 eV) and the nitrogen plasma treatment layer 16b (approximately 5 eV) which is obtained through nitridation of the silicon oxide by plasma treatment. In addition, the second insulating layer 22 includes the silicon nitride layer 22a and the silicon oxide layer 22b which are stacked from the floating gate electrode 20 side.

The semiconductor layer 14 and the first floating gate electrode layer 20a, between which the first insulating layer 16 is interposed, are formed of different materials. In this case, a band gap of the semiconductor layer 14 and a band gap of the first floating gate electrode layer 20a are different from each other, and the first floating gate electrode layer 20a has a smaller band gap than the semiconductor layer 14. For example, silicon (1.12 eV) can be used for the semiconductor layer 14, and germanium (0.72 eV) or silicon germanium (0.73 eV to 1.1 eV) can be used for the first floating gate electrode layer 20a. In other words, the band gap Eg1 of silicon of the semiconductor layer 14 and the band gap Eg2 of germanium of the first floating gate electrode layer 20a satisfy Eg1>Eg2. Energy barriers to electrons of the semiconductor layer 14 and the first floating gate electrode layer 20a, which are formed by the first insulating layer 16, i.e., a first barrier Be1 and a second barrier Be2, respectively, have different values and can satisfy Be2>Be1. In such a situation, an energy difference $\Delta E$ is generated between energy levels at the conduction band bottoms of the semiconductor layer 14 and the floating gate electrode 20. As will be described afterwards, this energy difference $\Delta E$ contributes to reduction in writing voltage since $\Delta E$ acts in an electron-accelerating direction when electrons are injected from the semiconductor layer 14 to the floating gate electrode 20.

Figure 16:
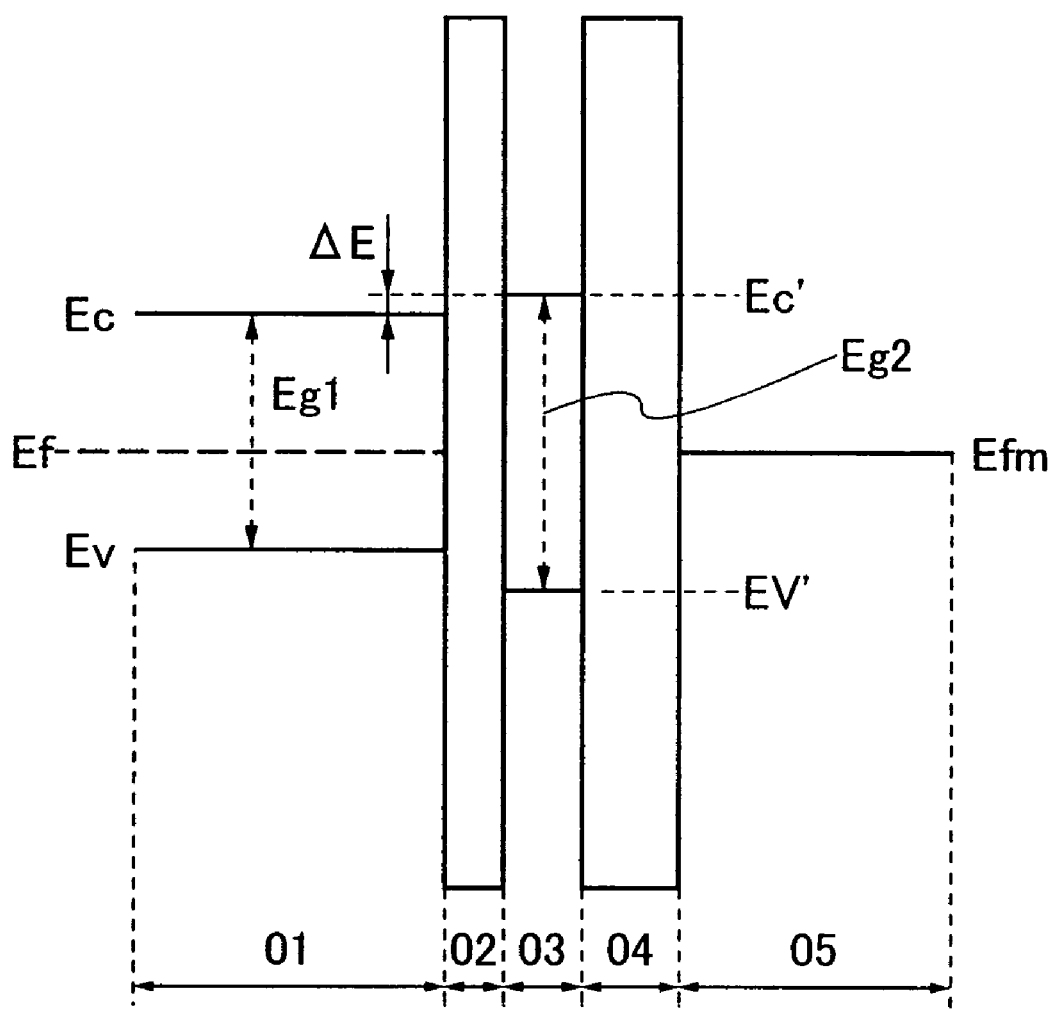
FIG. 16 is an energy band diagram of a conventional nonvolatile memory.

For comparison, FIG. 16 shows an energy band diagram where a semiconductor layer and a floating gate electrode are formed using the same semiconductor material. This energy band diagram shows a state where a semiconductor layer 01, a first insulating layer 02, a floating gate electrode 03, a second insulating layer 04, and a control gate electrode 05 are sequentially stacked. Even if the semiconductor layer 01 and the floating gate electrode 03 are formed using the same silicon material, band gaps thereof are different when the floating gate electrode 03 is formed thinly. In FIG. 16, a band gap of the semiconductor layer 01 is denoted by Eg1, and a band gap of the floating gate electrode 03 is denoted by Eg2. For example, a band gap of silicon is increased to approximately 1.4 eV from 1.12 eV which is a value of a bulk state when silicon is formed into a thin film. Accordingly, an energy difference—$\Delta E$ is generated between the semiconductor layer 01 and the floating gate electrode 03 in a direction which blocks electron injection. In such a situation, high voltage is necessary for electron injection from the semiconductor layer 01 to the floating gate electrode 03. In other words, in order to reduce writing voltage, it is necessary to form the floating gate electrode 03 thickly like bulk silicon, or add phosphorus or arsenic as an n-type impurity at a high concentration. This is a disadvantage of a conventional nonvolatile memory.

For electron injection to the floating gate electrode 20, there is a method utilizing hot electrons and a method utilizing F-N type tunnel current. In the case of the method utilizing hot electrons, hot electrons are generated by application of positive voltage to the control gate electrode 24 and high voltage to a drain. Accordingly, the hot electrons can be injected to the floating gate electrode 20. In the case of the method utilizing F-N type tunnel current, positive voltage is applied to the control gate electrode 24, and electrons are injected from the semiconductor layer 14 to the floating gate electrode 20 by F-N type tunnel current.

Figure 3:
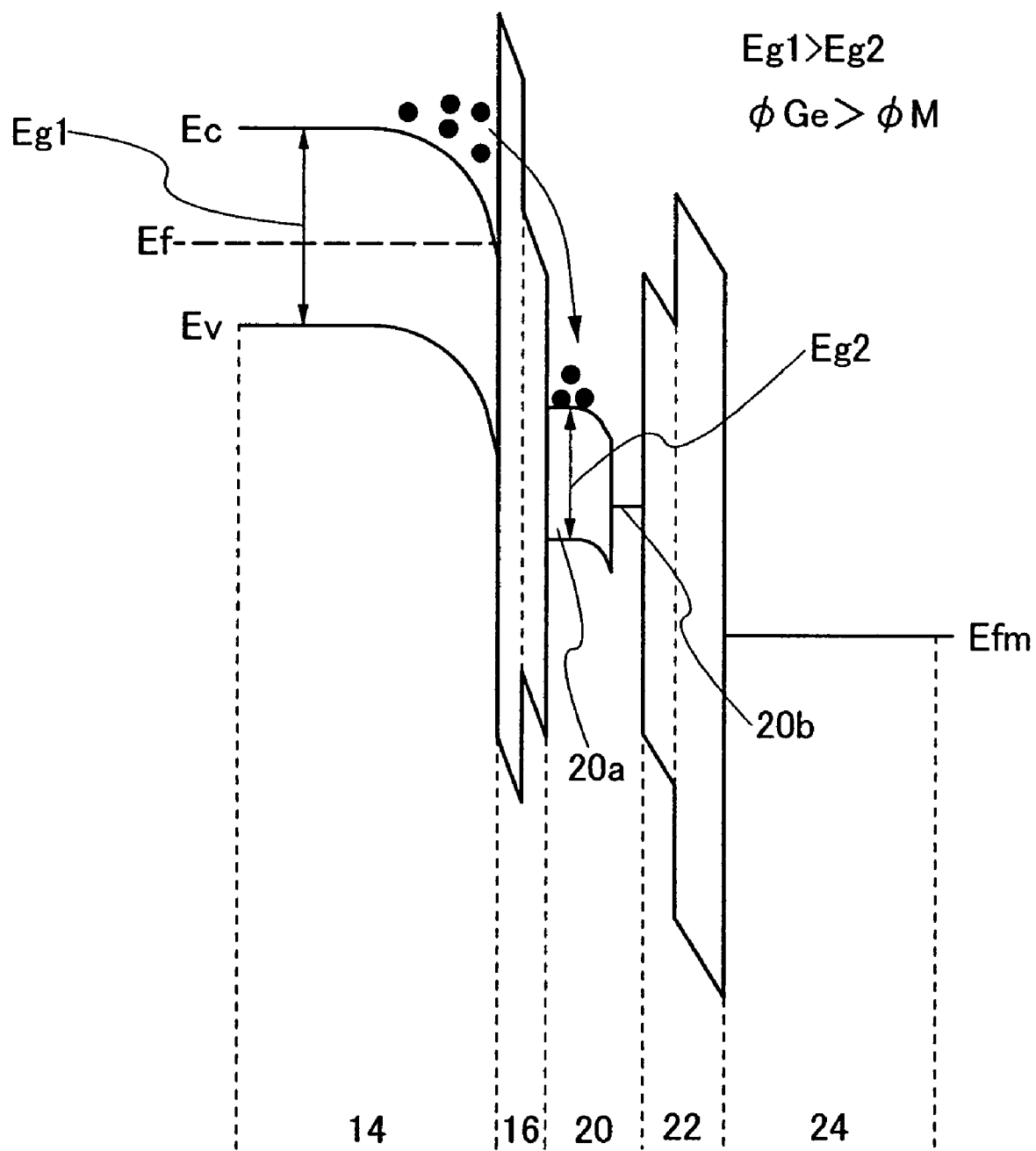
FIG. 3 is an energy band diagram of a nonvolatile memory in a writing state.
Figure 6A:
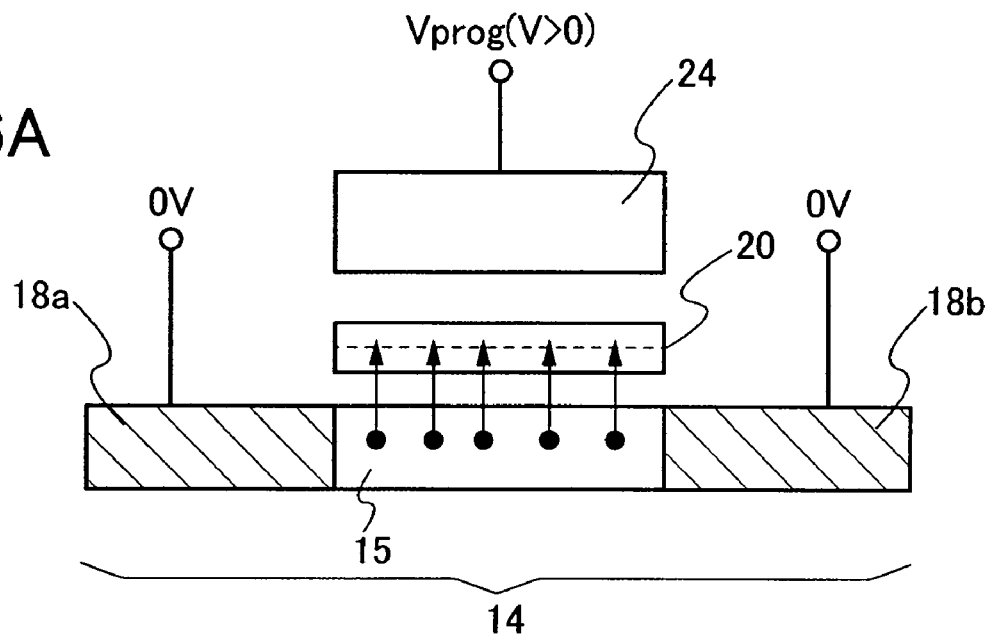
FIGS. 6A and 6B are diagrams showing a writing operation and a reading operation of a nonvolatile memory.

FIG. 6A shows voltage applied when electrons are injected to the floating gate electrode 20 by F-N type tunnel current. High positive voltage (10 V to 20 V) is applied to the control gate electrode 24 while 0V is applied to the source region 18a and the drain region 18b. FIG. 3 shows an energy band diagram at this time. A high electric filed enables carriers (electrons) in the semiconductor layer 14 to be injected to the first insulating layer 16, whereby F-N type tunnel current flows. As explained in FIG. 2, the band gap Eg1 of the semiconductor layer 14 and the band gap Eg2 of the floating gate electrode 20 satisfy Eg1>Eg2. This difference acts as self-bias so that electrons injected from the channel forming region 15 of the semiconductor layer 14 are accelerated toward the floating gate electrode. Accordingly, injectability of electrons can be improved.

An energy level at the conduction band bottom of the floating gate electrode 20 is lower than the energy level at the conduction band bottom of the semiconductor layer 14 by $\Delta E$ in terms of electron energy. Therefore, when electrons are injected to the floating gate electrode 20, an internal electric field generated by this energy difference acts. This phenomenon is achieved by a combination of the semiconductor layer 14 and the floating gate electrode 20 as described above. In other words, electrons can be easily injected from the semiconductor layer 14 to the floating gate electrode 20, whereby a writing property of the nonvolatile memory element can be improved. This action also applies when electrons are injected to the floating gate electrode 20 with the use of hot electrons.

Figure 4:
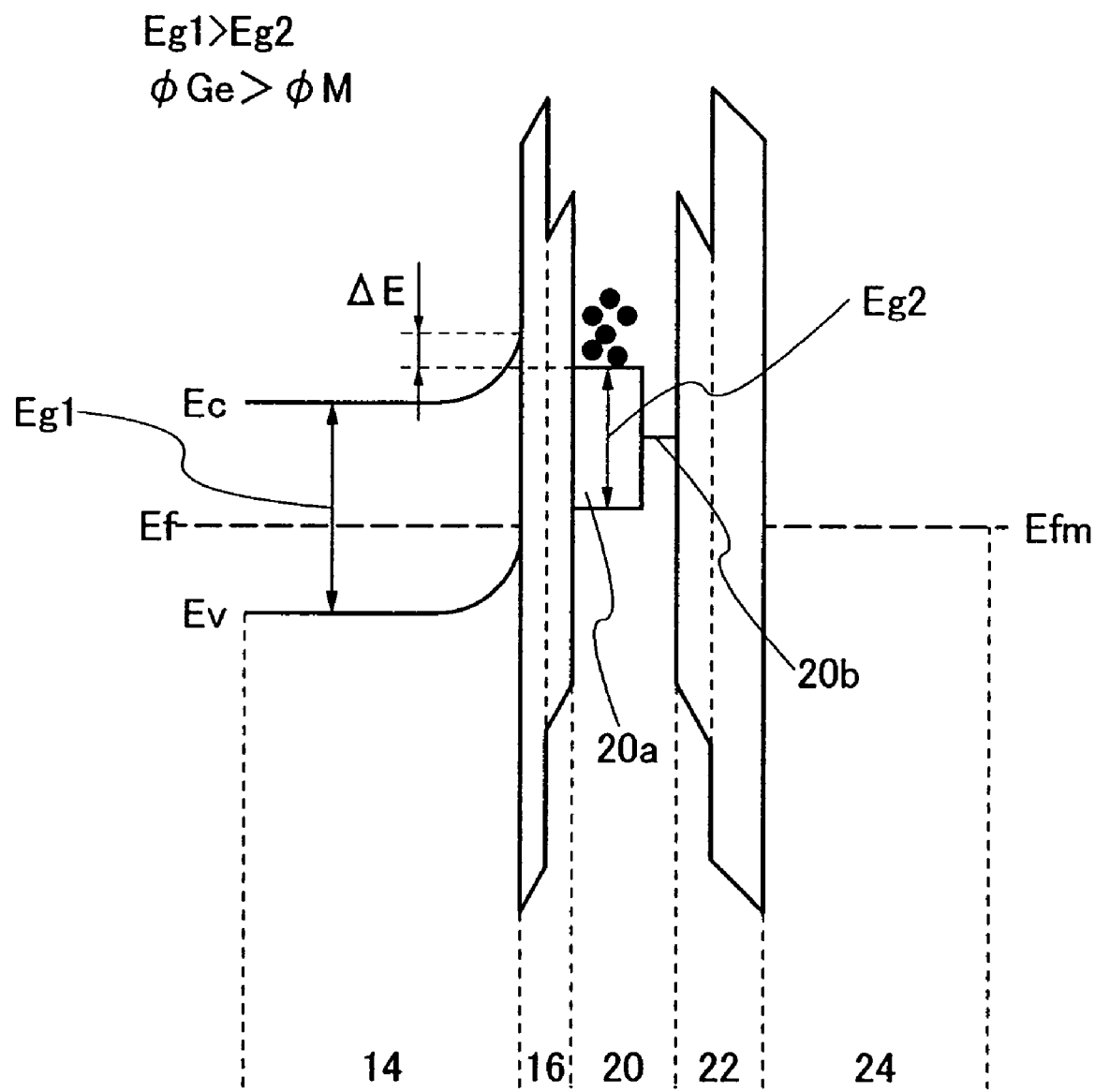
FIG. 4 is an energy band diagram of a nonvolatile memory in a charge-retention state.

While electrons are retained in the floating gate electrode 20, threshold voltage of the nonvolatile memory element is shifted to a positive side. This state can be regarded as a state where data "0" is written. FIG. 4 shows an energy band diagram of a charge-retention state. Carriers in the floating gate electrode 20 are energetically trapped because they are interposed between the first insulating layer 16 and the second insulating layer 22. This means that, although potential is increased by carriers (electrons) accumulated in the floating gate electrode 20, electrons are not discharged from the floating gate electrode 20 unless energy higher than barrier energy is given to the electrons. In other words, carriers accumulated in the floating gate electrode can be retained similar to that of a reliability test in which the element is left at a constant temperature of 150° C.

More in detail, it can be said that carriers in the first floating gate electrode layer 20a are trapped energetically between the first insulating layer 16 and the second floating gate electrode layer 20b. With this state, injected carries are prevented from leaking to the second insulating layer 22 side and being trapped at the interface. That is, an erasing failure can be prevented, which is caused when carriers injected to the floating gate region are left in an erasing operation. Since the second floating gate electrode layer 20b also has an ability to accumulate carriers as a floating gate, the second floating gate electrode layer 20b can function as a floating gate which supports the first floating gate electrode layer 20a.

In any case, electrons are not discharged from the floating gate electrode 20 unless energy higher than barrier energy is given to electrons. The energy level at the conduction band bottom of the floating gate electrode 20 is lower than the energy level at the conduction band bottom of the semiconductor layer 14 by ΔE in terms of electron energy, and the energy barrier is formed to electrons. By this barrier, electrons can be prevented from leaking to the semiconductor layer 14 by tunnel current.

Figure 6B:
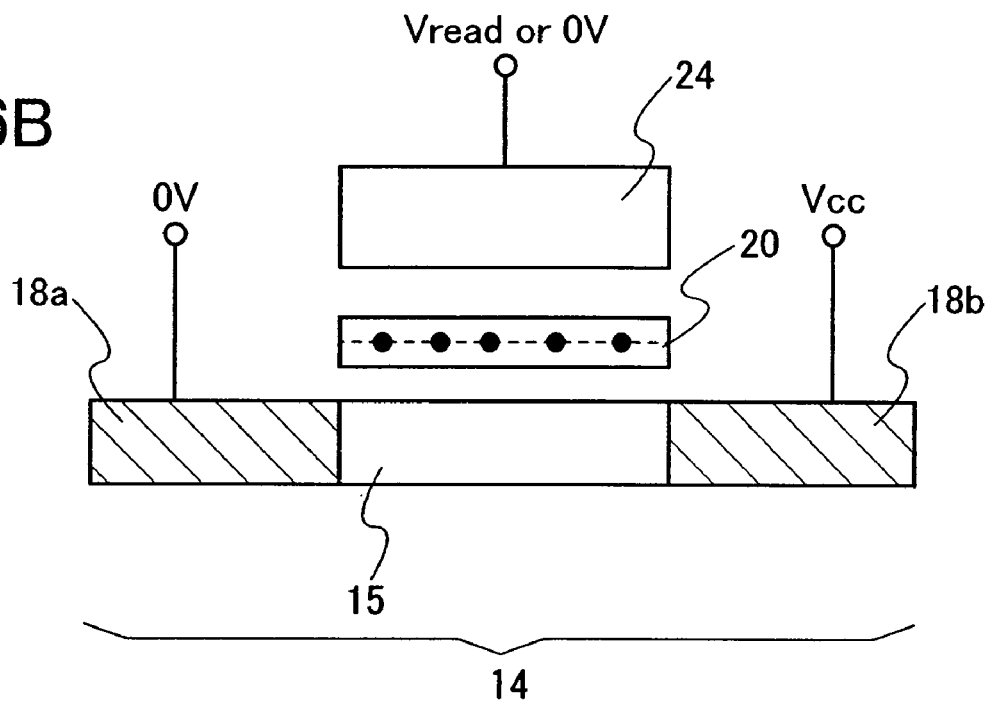

A state where data "0" is written is detected as follows: it is detected by a circuit that a transistor is not turned on when an intermediate potential Vread is applied to the control gate electrode 24. The intermediate potential is a potential between the threshold Voltage Vth1 in data "1" and the threshold voltage Vth2 in the data "0" (in this case, Vth1< Vread<Vth2). Alternatively, the state where data "0" is written can be detected depending on whether the nonvolatile memory element is turned on by application of a bias voltage between the source region 18a and the drain region 18b and application of 0V to the control gate electrode 24 as shown in FIG. 6B.

Figure 7A:
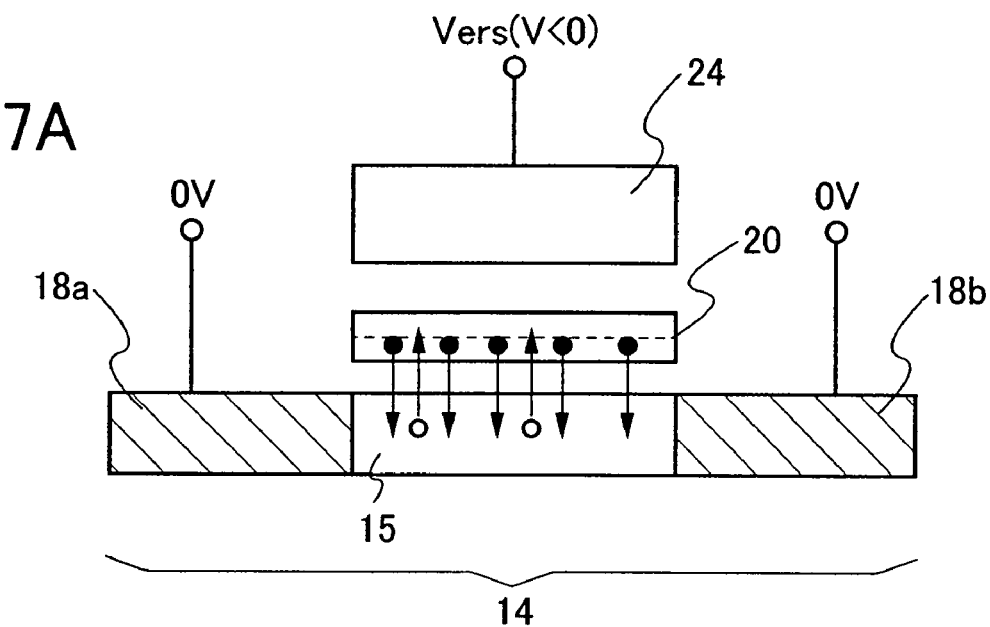
FIGS. 7A and 7B are diagrams each showing an erasing operation of a nonvolatile memory.
Figure 7B:
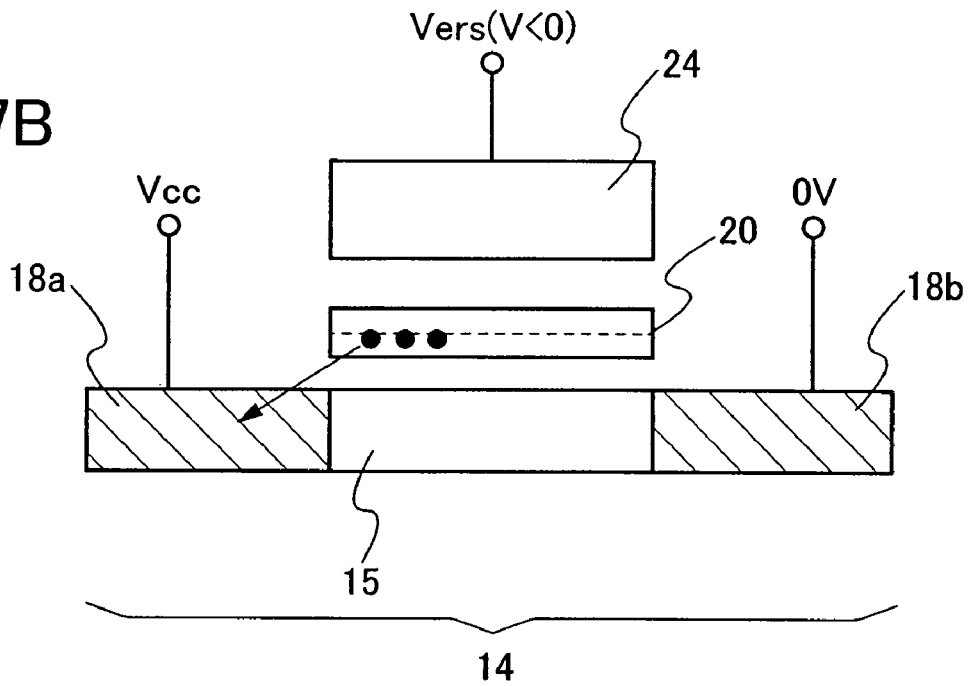

FIG. 7A shows a state where charges are discharged from the floating gate electrode 20 and data is erased from the nonvolatile memory element. In this case, negative bias voltage is applied to the control gate electrode 24, and F-N type tunnel current is applied between the semiconductor layer 14 and the floating gate electrode 20, whereby data is erased. Alternatively, as shown in FIG. 7B, negative bias voltage may be applied to the control gate electrode 24, and high positive voltage may be applied to the source region 18a, so that F-N type tunnel current is generated and electrons are extracted to the source region 18a side.

FIG. 5 shows an energy band diagram in the erasing state. In the erasing operation, since the first insulating layer 16 can be formed thinly, electrons in the floating gate electrode 20 can be discharged to the semiconductor layer 14 side by F-N type tunnel current. In addition, holes can be easily injected from the channel forming region 15 of the semiconductor layer 14. Therefore, a substantial erasing operation can be achieved by injection of holes to the floating gate electrode 20.

When the floating gate electrode 20 is formed using germanium or a germanium compound, the thickness of the first insulating layer 16 can be small. Accordingly, electrons can be easily injected to the floating gate electrode 20 through the first insulating layer 16 by tunnel current, whereby a low-voltage operation can be performed. Further, charges can be retained at a low energy level, whereby advantageous effect in which charges may be retained stably can be obtained.

The nonvolatile memory element according to the present invention has a structure as shown in FIGS. 2 and 3, by which self-bias is generated satisfying Eg1>Eg2 between the semiconductor layer 14 and the floating gate electrode 20. This relation is highly important and enables carriers to be easily injected from the channel forming region of the semiconductor layer to the floating gate electrode. That is, writing voltage can be reduced, whereas carriers can be prevented from being easily discharged from the floating gate electrode. This can improve a memory retention property of the nonvolatile memory element. In addition, when a germanium layer as the floating gate electrode is doped with an n-type impurity, self-bias can act so that an energy level at the conduction band bottom can be further lowered, and carriers can be more easily injected to the floating gate electrode. In other words, writing voltage can be reduced, and a memory retention property of the nonvolatile memory element can be improved.

As explained above, in the nonvolatile memory element according to the present invention, charges can be easily injected from the semiconductor layer to the floating gate electrode, and charges can be prevented from being discharged from the floating gate electrode. In other words, when the nonvolatile memory element operates as a memory, data can be written with very high efficiency at low voltage, and a charge-retention property can be improved.

With the use of such a nonvolatile memory element, various modes of nonvolatile semiconductor memory devices can be obtained. FIG. 8 shows an example of an equivalent circuit of a nonvolatile memory cell array. A memory cell MS01 which stores 1-bit data includes a selection transistor S01 and a nonvolatile memory element M01. The selection transistor S01 is inserted in series between a bit line BL0 and the nonvolatile memory element M01, and a gate of the selection transistor S01 is connected to a word line WL1. A gate of the nonvolatile memory element M01 is connected to a word line WL11. When data is written in the nonvolatile memory element M01, the word line WL1 and the bit line BL0 are set at an H level, a bit line BL1 is set at a L level, and high voltage is applied to the word line WL11, whereby charges are accumulated in the floating gate electrode as described above. When data is erased, the word line WL1 and the bit line BL0 are set at an H level, and high voltage with negative polarity is applied to the word line WL11.

In this memory cell MS01, the selection transistor S01 and the nonvolatile memory element M01 are formed using semiconductor layers 30 and 32, which are formed separately in island shapes over an insulating surface, respectively. Accordingly, even if an element separation region is not particularly provided, interference with other selection transistors or nonvolatile memory elements can be prevented. In addition, each of the selection transistor S01 and the nonvolatile memory element M01 in the memory cell MS01 is an n-channel type, so that a wiring connecting these two elements can be omitted by formation of both the elements using a single semiconductor layer which is separated in an island shape.

FIG. 9 shows a NOR type equivalent circuit in which a nonvolatile memory element is directly connected to a bit line. In this memory cell array, word lines WL and bit lines BL intersect, and the nonvolatile memory element is arranged at each intersection. In the NOR type, a drain of each nonvolatile memory element is connected to a bit line BL. Sources of the nonvolatile memory elements are commonly connected to a source line SL.

Also in this case, in a memory cell MS01, a nonvolatile memory element M01 is formed using a semiconductor layer 32, which is formed separately in an island shape over an insulating surface. Accordingly, even if an element separation region is not particularly provided, interference with other nonvolatile memory elements can be prevented. Further, a plurality of nonvolatile memory elements (such as M01 to M23 shown in FIG. 9) may be regarded as one block and formed using a single semiconductor layer which is separated in an island shape. Accordingly, an erasing operation can be performed on a block basis.

For example, an operation of the NOR type is as follows. In data writing, the source line SL is set at 0 V, high voltage is applied to a word line WL which is selected for data writing, and the bit line BL is set at a potential corresponding to data "0" or "1". For example, the bit line BL is set at H level and L level potentials corresponding to "0" and "1" respectively. Hot electrons are generated around the drain in the nonvolatile memory element to which is set at an H level potential so that data "0" is written, and the hot electrons are injected to the floating gate. In the case of data "1", such electron injection is not caused.

In the memory cell to which data "0" is given, hot electrons are generated around the drain by a strong lateral electric field between the drain and the source, and the hot electrons are injected to the floating gate. This state where the electrons are injected to the floating gate and threshold voltage is increased is "0". In the case of data "1", hot electrons are not generated and electrons are not injected to the floating gate, whereby a state where threshold voltage is low, that is, an erasing state, is retained.

When data is to be erased, a positive voltage of approximately 10 V is applied to the source line SL, and the bit line BL is put in a floating state. Then, high voltage with negative polarity is applied to the word line WL (high voltage with negative polarity is applied to the control gate), and electrons are extracted from the floating gate. Accordingly, an erasing state of data "1" is obtained.

When data is read, the source line SL is set at 0 V and the bit line BL is set at approximately 0.8 V, and reading voltage that is set to an intermediate value of threshold voltages of data "0" and "1" is applied to the selected word line WL, and then, it is detected by a sense amplifier connected to the bit line BL depending on whether current is drawn in the nonvolatile memory element.

Figure 10:
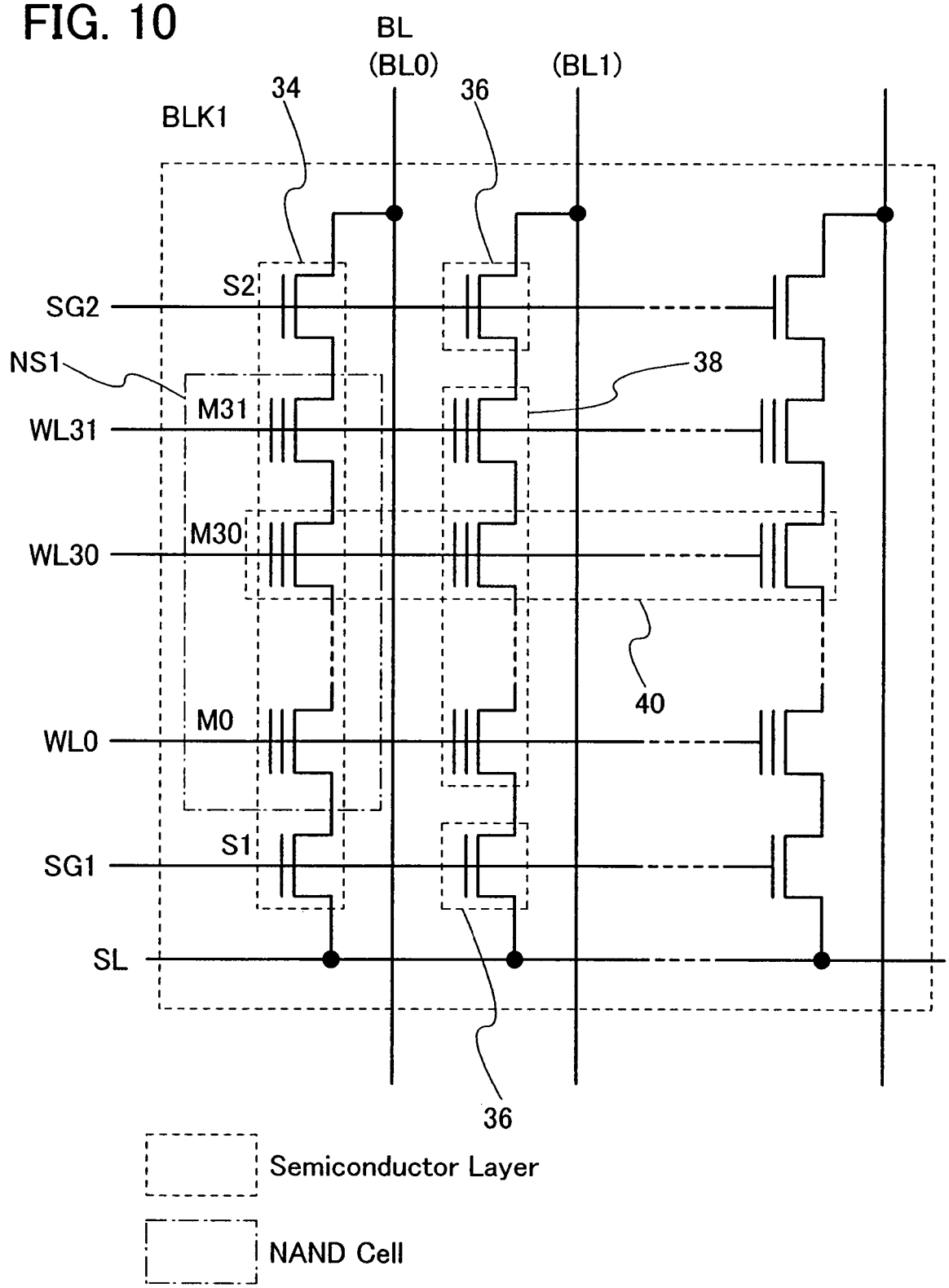
FIG. 10 is a diagram showing an example of an equivalent circuit of a NAND type nonvolatile memory cell array.

FIG. 10 shows an equivalent circuit of a NAND type memory cell array. A NAND cell NS1 in which a plurality of nonvolatile memory elements are connected in series is connected to a bit line BL. A plurality of NAND cells form a block BLK. A block BLK1 shown in FIG. 10 has 32 word lines (word lines WL0 to WL31). The nonvolatile memory elements arranged in the same row of the block BLK1 is commonly connected to a word line corresponding to this row.

In this case, selection transistors S1 and S2 and the nonvolatile memory elements M0 to M31 are connected in series; thus, they may be formed using one semiconductor layer 34 as one group. Accordingly, a wiring connecting the nonvolatile memory elements can be omitted, whereby integration can be achieved. In addition, adjacent NAND cells can easily be separated from each other. Further, a semiconductor layer 36 of the selection transistors S1 and S2 and a semiconductor layer 38 of the NAND cell may be separately formed. In an erasing operation in which charges are extracted from each floating gate of the nonvolatile memory elements M0 to M31, the erasing operation can be performed on the NAND cell basis. Further, nonvolatile memory elements commonly connected to one word line (such as a row of M30) may be formed using one semiconductor layer 40.

A writing operation is executed after the NAND cell NS1 is put in an erasing state, that is, a threshold voltage of each nonvolatile memory element in the NAND cell NS1 is made negative. Writing is sequentially performed from the nonvolatile memory element M0 closer to the source line SL. Writing to the nonvolatile memory element M0 will be outlined as an example as follows.

Figure 11A:
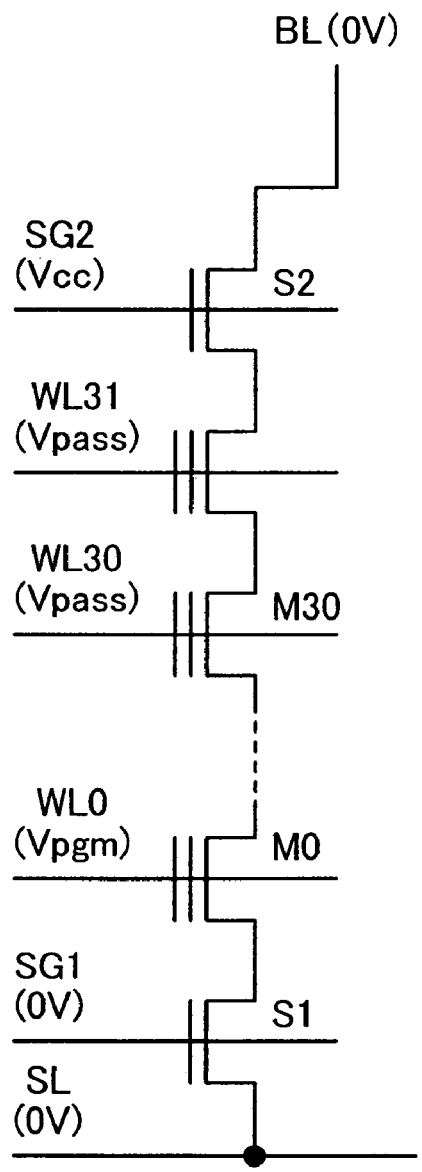
FIGS. 11A and 11B are diagrams each showing a writing operation of a NAND type nonvolatile memory.

In FIG. 11A, when "0" is written, for example, Vcc (power source voltage) is applied to a selection gate line SG2 to turn on the selection transistor S2 and the bit line BL0 is set at 0 V (ground voltage). A selection gate line SG1 is set at 0 V to turn off the selection transistor S1. Then, high voltage Vpgm (approximately 20 V) is applied to a word line WL0 of the nonvolatile memory element M0, and intermediate voltage Vpass (approximately 10 V) is applied to the other word lines. Since the voltage applied to the bit line BL0 is 0 V, the potential of a channel forming region of the selected nonvolatile memory element M0 is 0 V. Since a potential difference between the word line WL0 and the channel forming region is large, electrons are injected to the floating gate of the nonvolatile memory element M0 by F-N tunnel current as described above. Accordingly, threshold voltage of the nonvolatile memory element M0 is put in a positive state (a state where "0" is written).

Figure 11B:
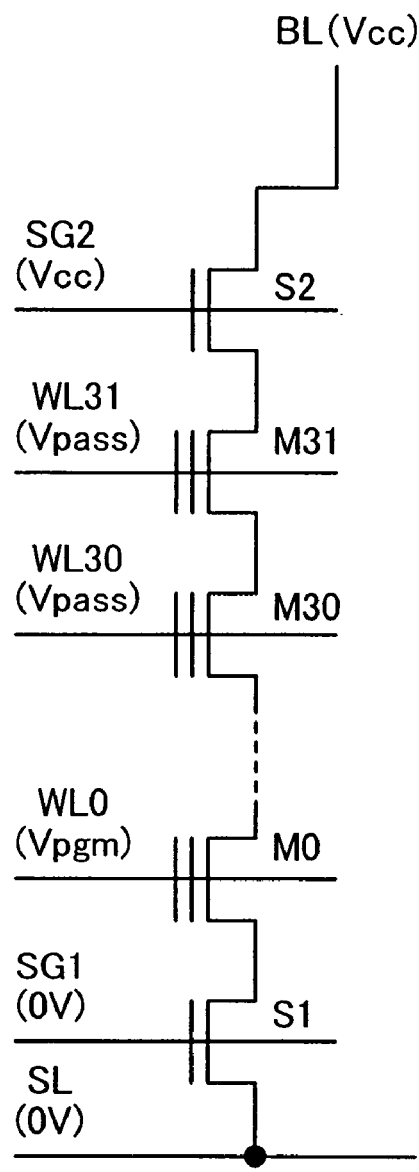

On the other hand, when "1" is written, for example, Vcc (power source voltage) is applied to the bit line BL as shown in FIG. 11B. Since the voltage applied to the selection gate line SG2 is Vcc, the selection transistor S2 is cut off in the case of Vcc−Vth (Vth is threshold voltage of the selection transistor S2). Accordingly, the channel forming region of the nonvolatile memory element M0 is put in a floating state. Next, when high voltage Vpgm (20 V) is applied to the word line WL0 and intermediate voltage Vpass (10 V) is applied to the other word lines, voltage of the channel forming region is increased from (Vcc−Vth) to, for example, approximately 8 V by capacitive coupling of each word line and channel forming region. Unlike in the case of "0" writing, a potential difference between the word line WL0 and the channel forming region is small since the voltage of the channel forming region is increased to a high voltage. Therefore, electron injection due to F-N tunnel current is not caused in the floating gate of the nonvolatile memory element M0. Accordingly, the threshold voltage of the nonvolatile memory element M0 is kept negative (a state where "1" is written).

Figure 12A:
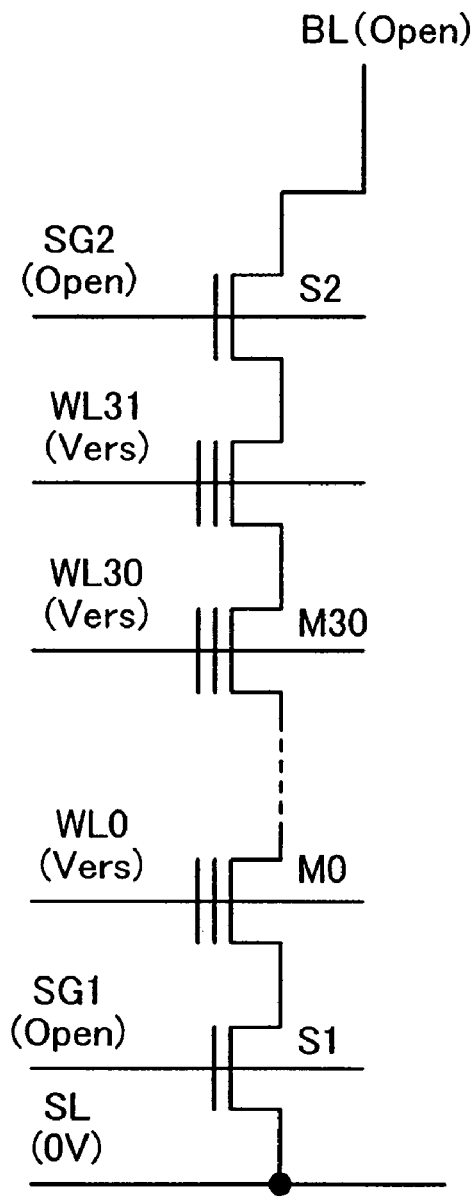
FIGS. 12A and 12B are diagrams showing an erasing operation and a reading operation of a NAND type nonvolatile memory.

In the case of the erasing operation, as shown in FIG. 12A, high voltage with negative polarity (Vers) is applied to all the selected word lines in the selected block. The bit line BL and the source line SL are put in a floating state. Thus, electrons in the floating gate in all the memory cells in the block are discharged to the semiconductor layer by the tunnel current. Consequently, the threshold voltages of these memory cells are shifted to a negative side.

Figure 12B:
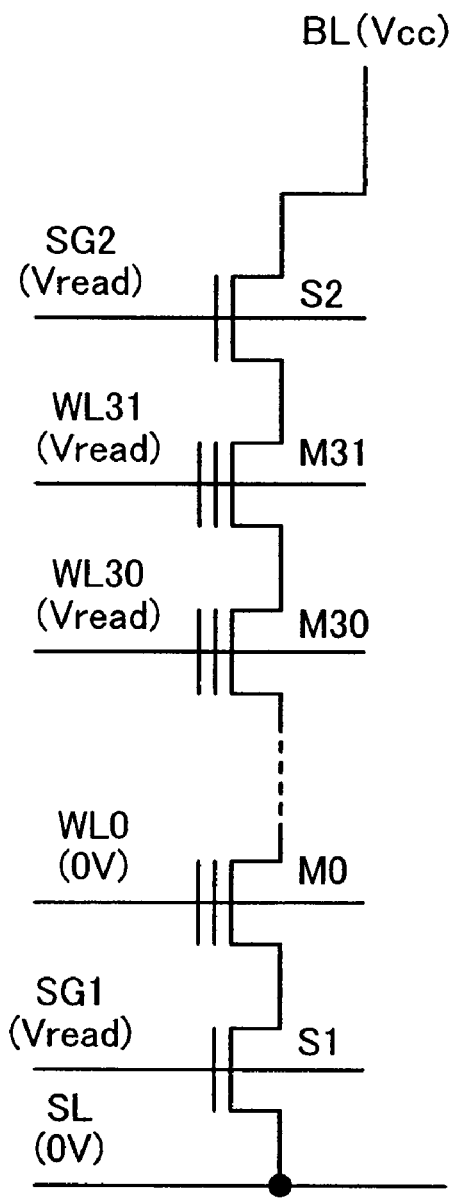
Figure 13:
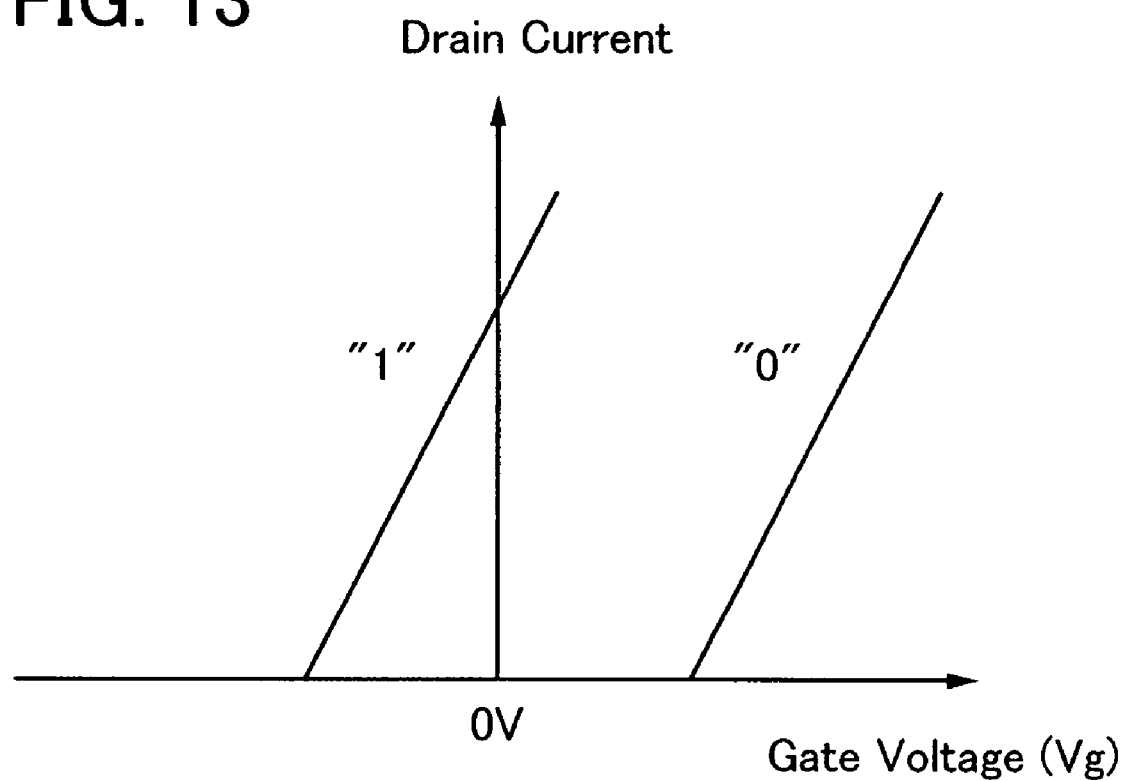
FIG. 13 is a diagram showing a change in threshold voltage of a nonvolatile memory in the case of "0" where charges are accumulated and in the case of "1" where charges are discharged.

In the reading operation shown in FIG. 12B, voltage Vr (for example, 0 V) is applied to the word line WL0 of the nonvolatile memory element M0 which is selected for reading, whereas intermediate voltage Vread for reading which is slightly higher than power source voltage is applied to the word lines WL1 to WL31 and the selection gate lines SG1 and SG2 of the memory cell which is not selected. That is, as shown in FIG. 13, the memory elements other than the selected memory element each function as a transfer transistor. Accordingly, it is detected whether current flows through the nonvolatile memory element M0 which is selected for reading. In other words, when data stored in the nonvolatile memory element M0 is "0", the nonvolatile memory element M0 is off; therefore, the bit line BL does not discharge electricity. On the other hand, when data stored in the nonvolatile memory element M0 is "1", the nonvolatile memory element M0 is on; therefore, the bit line BL discharges electricity.

Figure 14:
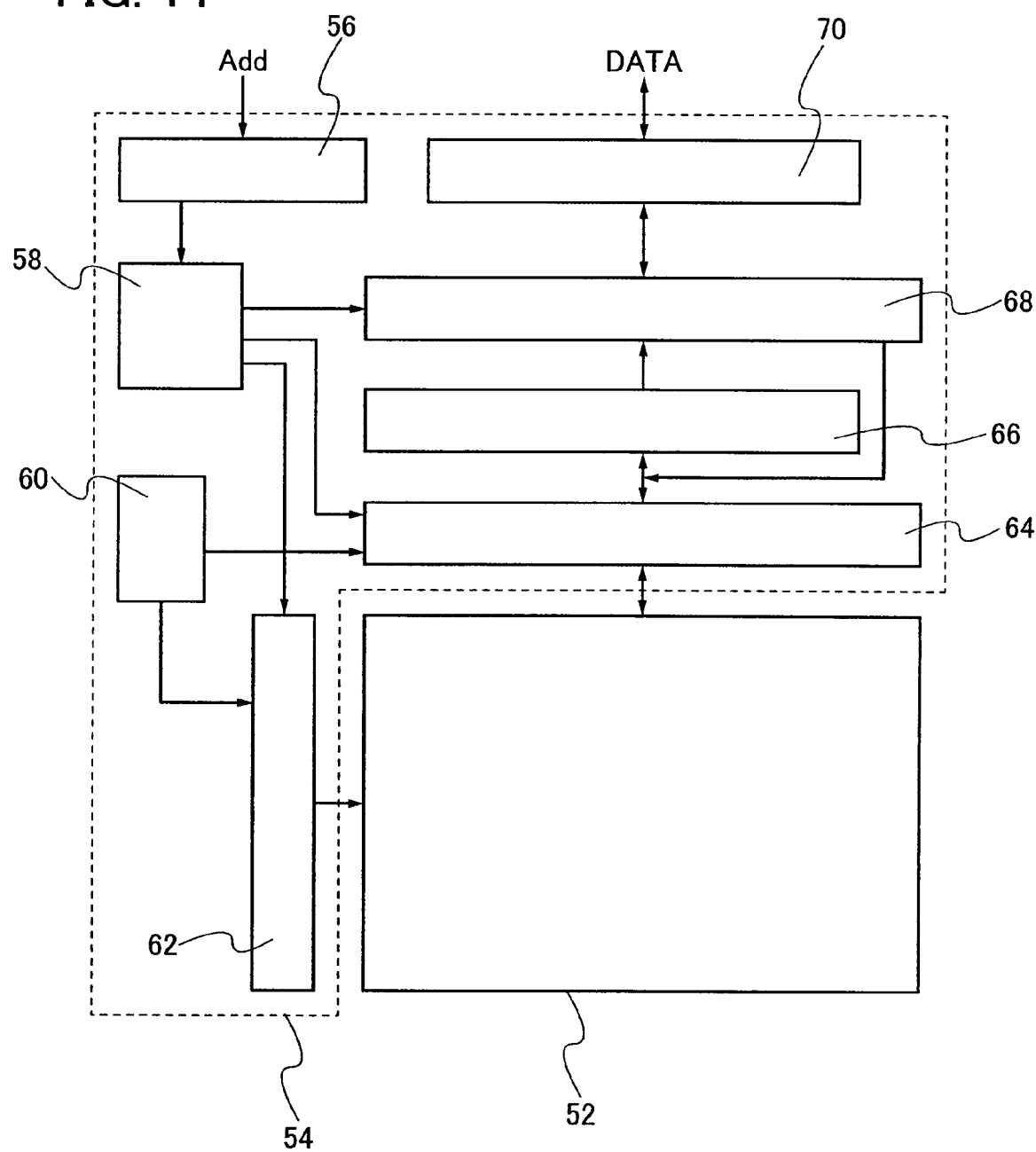
FIG. 14 is a diagram showing an example of a circuit block diagram of a nonvolatile semiconductor memory device.

FIG. 14 shows an example of a circuit block diagram of a nonvolatile semiconductor memory device. In the nonvolatile semiconductor memory device, a memory cell array 52 and a peripheral circuit 54 are formed over the same substrate. The memory cell array 52 has a configuration as shown in FIG. 8, 9, or 10. The peripheral circuit 54 has the following configuration.

A row decoder 62 for selecting a word line and a column decoder 64 for selecting a bit line are provided adjacent to the memory cell array 52. An address is transmitted to a controlling circuit 58 through an address buffer 56, and an internal row address signal and an internal column address signal are transmitted to the row decoder 62 and the column decoder 64, respectively.

Power source potential is increased to be used for data writing and erasing. Therefore, a boosting circuit 60 which is controlled by the controlling circuit 58 in accordance with the operation mode is provided. Output of the boosting circuit 60 is supplied to a word line WL or a bit line BL through the row decoder 62 or the column decoder 64. Data output from the column decoder 64 is inputted to a sense amplifier 66. The data which is read by the sense amplifier 66 is retained in a data buffer 68, and the data is accessed randomly by the control from the controlling circuit 58 to be outputted through a data input/output buffer 70. Data to be written is temporarily retained in the data buffer 68 through the data input/output buffer 70 and transferred to the column decoder 64 by the control from the controlling circuit 58.

In such a manner, in the nonvolatile semiconductor memory device, it is necessary to use potential that is different from the power source potential in the memory cell array 52. Therefore, it is desirable that at least the memory cell array 52 and the peripheral circuit 54 be electrically insulated and isolated. In this case, as in embodiments to be explained below, the nonvolatile memory element and a transistor in the peripheral circuit are each formed using a semiconductor layer formed over an insulating surface, whereby insulation and isolation can easily be achieved. Accordingly, a nonvolatile semiconductor memory device with no malfunction and less power consumption can be obtained.

Hereinafter, the nonvolatile semiconductor memory device according to the present invention will be explained more in detail in the following embodiments. In structures of the present invention, which will be explained below, reference numerals denoting the same portions are used in common in different drawings, and repeated explanation thereof may be omitted.

Embodiment 1

This embodiment will explain an example of a nonvolatile semiconductor memory device with reference to drawings. Hereinafter explained is a case where in the nonvolatile semiconductor memory device, a nonvolatile memory element included in a memory portion is formed at the same time as an element such as a transistor included a logic portion, which is provided over the same substrate as the memory portion to control the memory portion or the like.

First, FIG. 8 shows a schematic diagram of the memory portion in the nonvolatile semiconductor memory device.

The memory portion described in this embodiment includes a plurality of memory cells each of which has a selection transistor and a nonvolatile memory element. In FIG. 8, a selection transistor S01 and a nonvolatile memory element M01 form one memory cell. Similarly, memory cells include a selection transistor S02 and a nonvolatile memory element M02, a selection transistor S03 and a nonvolatile memory element M03, a selection transistor S11 and a nonvolatile memory element M11, a selection transistor S12 and a nonvolatile memory element M12, and a selection transistor S13 and a nonvolatile memory element M13.

A gate electrode of the selection transistor S01 is connected to a word line WL1, one of a source and a drain thereof is connected to a bit line BL0, and the other is connected to a source or a drain of the nonvolatile memory element M01. Further, a gate electrode of the nonvolatile memory element M01 is connected to a word line WL11, one of a source and a drain is connected to the source or the drain of the selection transistor S01, and the other is connected to a source line SL0.

The selection transistor provided in the memory portion has high drive voltage compared to the transistor provided in the logic portion. Therefore, gate insulating layers or the like of the transistor provided in the memory portion and the transistor provided in the logic portion are preferably formed with different thicknesses. For example, when drive voltage is low and variation in threshold voltage is desired to be reduced, a thin film transistor in which a gate insulating film is thin is preferably provided, whereas, when drive voltage is high and a high withstand voltage of a gate insulating layer is required, a thin film transistor in which a gate insulating film is thick is preferably provided.

Figure 32:
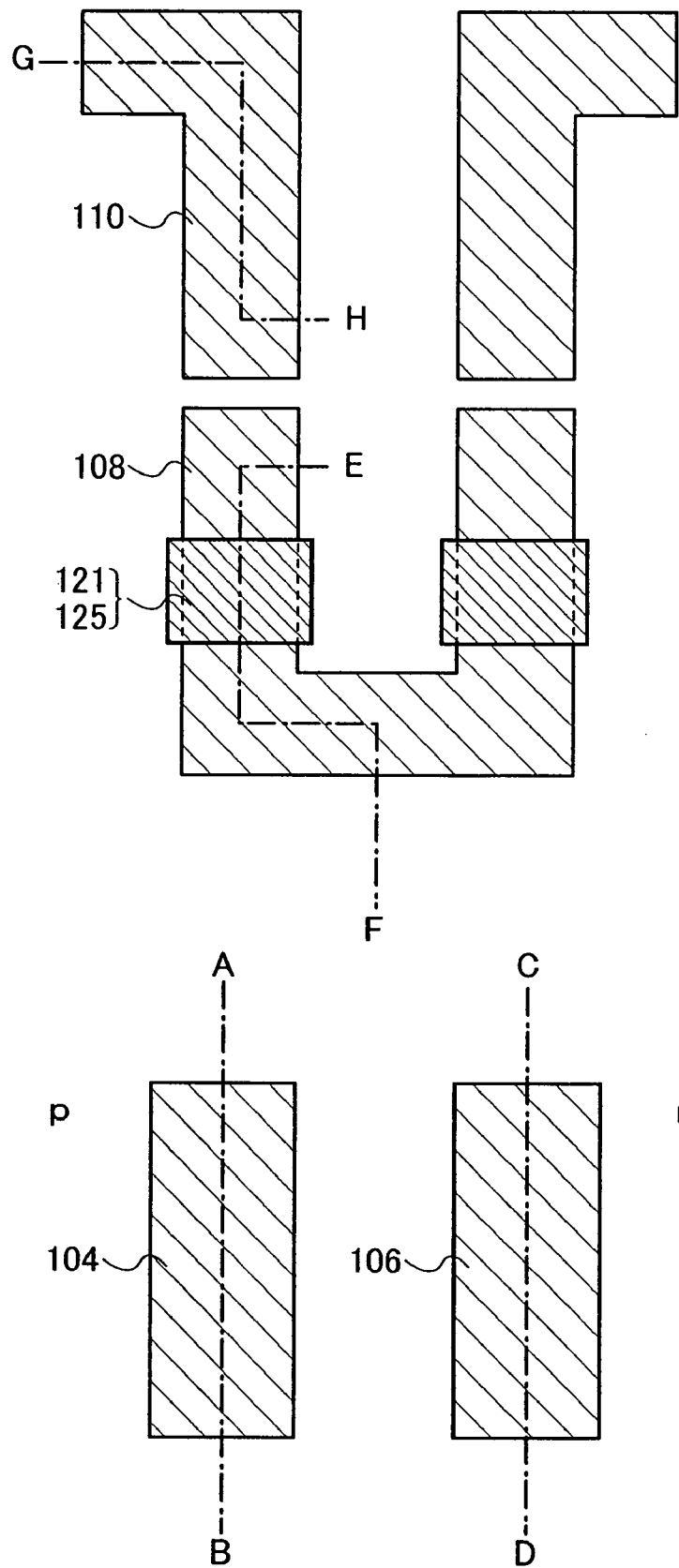
FIG. 32 is a diagram showing an example of a top view of a nonvolatile semiconductor memory device of the present invention.
Figure 33:
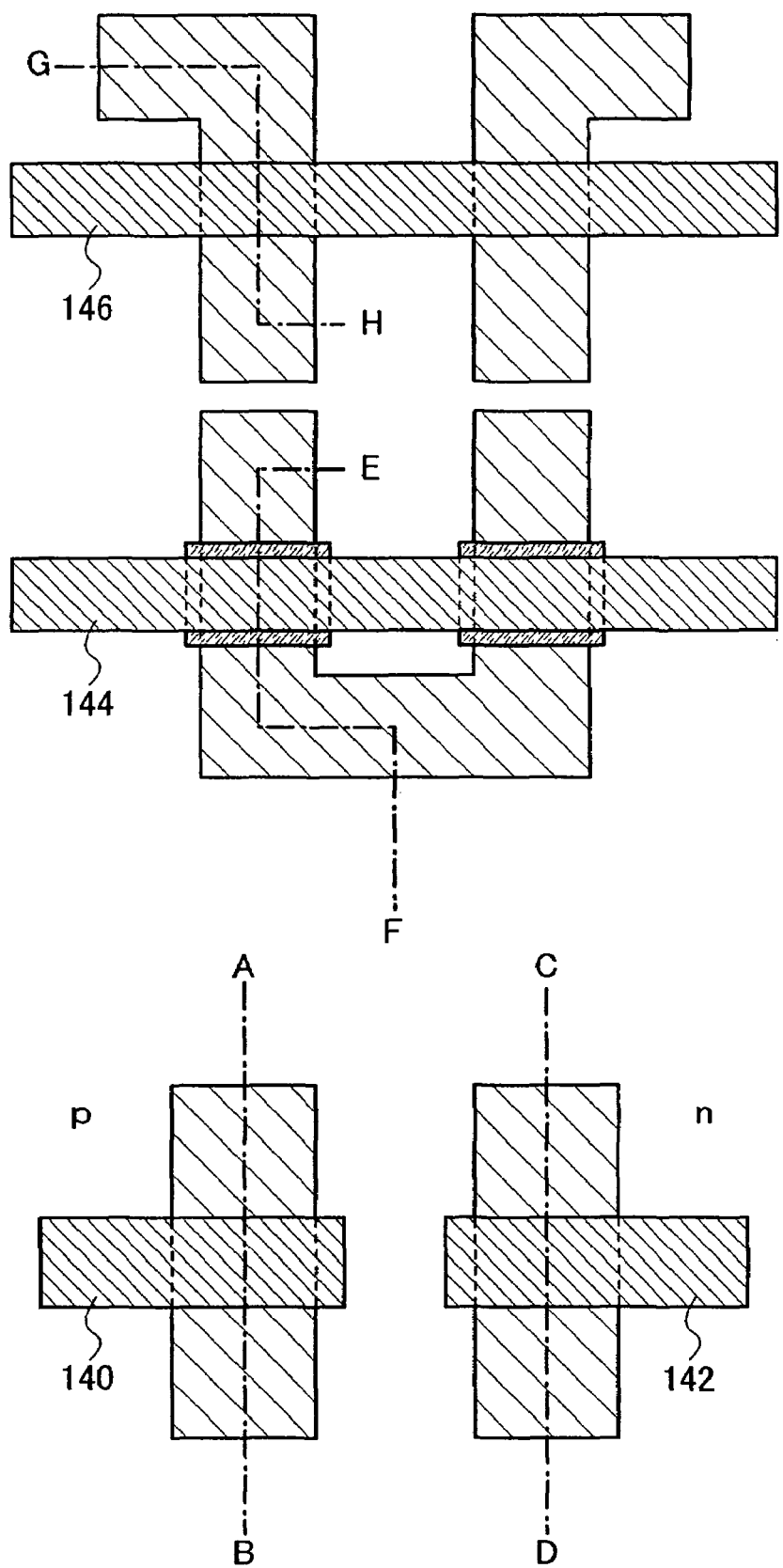
FIG. 33 is a diagram showing an example of a top view of a nonvolatile semiconductor memory device of the present invention.

Therefore, with reference to drawings, this embodiment will hereinafter explain a case where a thin insulating layer is formed in the transistor in the logic portion in which drive voltage is low and variation in threshold voltage is desirably reduced, and a thick insulating layer is formed in the transistor in the memory portion in which drive voltage is high and a high withstand voltage of a gate insulating layer is required. FIGS. 32 to 34 show top views, and FIGS. 18A to 21C show cross-sectional views taken along lines A-B, C-D, E-F, and G-H of FIGS. 32 to 34. Portions between A and B and between C and D show thin film transistors provided in the logic portion, a portion between E and F shows a nonvolatile memory element provided in the memory portion, and a portion between G and H shows a thin film transistor provided in the memory portion. This embodiment will explain a case where the thin film transistor provided in the portion between A and B is a p-channel transistor, the thin film transistors provided in the portions between C and D and between G and H are n-channel transistors, and carrier movement is performed by electrons in the nonvolatile memory element provided in the portion between E and F. However, the nonvolatile semiconductor memory device of the present invention is not limited thereto.

First, island-like semiconductor layers 104, 106, 108, and 110 are formed over a substrate 100 with an insulating layer 102 interposed therebetween. First insulating layers 112, 114, 116, and 118 are formed so as to cover the island-like semiconductor layers 104, 106, 108, and 110, respectively. Then, a first conductive layer 120 and a second conductive layer 123 for forming a floating gate of the nonvolatile memory element to be completed later are stacked so as to cover the first insulating layers 112, 114, 116, and 118 (see FIG. 18A). The island-like semiconductor layers 104, 106, 108, and 110 can be provided as follows: an amorphous semiconductor layer is formed using silicon (Si) by a sputtering method, an LPCVD method, a plasma CVD method, or the like over the insulating layer 102 which is formed over the substrate 100 in advance, and the amorphous semiconductor layer is crystallized and then selectively etched. The amorphous semiconductor layer can be crystallized by a laser crystallization method, a thermal crystallization method using RTA or an annealing furnace, a thermal crystallization method using a metal element which promotes crystallization, a combination thereof, or the like.

When crystallization or recrystallization of the semiconductor layer is performed by laser beam irradiation, an LD-pumped continuous wave (CW) laser ($YVO_4$, the second harmonic (wavelength: 532 nm)) can be used as a laser beam source. The wavelength is not particularly limited to the second harmonic; however, the second harmonic is superior to other higher-order harmonics in terms of energy efficiency. When the semiconductor layer is irradiated with a CW laser beam, the semiconductor layer continuously receives energy; therefore, once the semiconductor layer is melted, the melted state can be continuous. Moreover, it is possible to move a solid-liquid interface of the semiconductor layer by scanning of a CW laser beam and to form a crystal grain which is elongated in one direction along this moving direction. A solid-state laser is used because its output is so stable that stable treatment can be expected as compared to a gas laser or the like.

Note that not only a CW laser but also a pulsed laser with a repetition rate of 10 MHz or more can be used. In the case of a pulsed laser with high repetition rate, when the pulse interval of the laser beam is shorter than the period after the semiconductor layer is melted and before the melted semiconductor layer is solidified, the semiconductor layer can be maintained in a melted state at all times. Also, by movement of the solid-liquid interface, a semiconductor layer including crystal grains which are elongated in one direction can be formed. Alternatively, other CW lasers, or pulsed lasers with a repetition rate of 10 MHz or more can be used. Examples of gas lasers are: an Ar laser, a Kr laser, a $CO_2$ laser, and the like. Examples of solid-state lasers are: a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, and the like. A YAG laser, a $Y_2O_3$ laser, a $GdVO_4$ laser, a $YVO_4$ laser, or the like is also called a ceramic laser. Examples of metal vapor lasers are: a helium-cadmium laser, and the like. It is preferable for a laser oscillator to emit a laser beam which is oscillated with $TEM_{00}$ (single transverse mode) because the energy homogeneity of a linear beam spot on an irradiation surface can be improved. Alternatively, a pulsed excimer laser may be used.

The substrate 100 can be selected from a glass substrate, a quartz substrate, a metal substrate (such as a stainless steel substrate), a ceramic substrate, and a semiconductor substrate such as a silicon substrate. Alternatively, a plastic substrate such as a substrate of polyethylene terephthalate (PET), polyethylene naphthalate (PEN), polyether sulfone (PES), acrylic, or the like can be used.

The insulating layer 102 is formed by a CVD method, a sputtering method, or the like using an insulating material such as silicon oxide, silicon nitride, silicon oxynitride ($SiO_xN_y$, (x>y)), or silicon nitride oxide ($SiN_xO_y$, (x>y)). For example, in the case of forming the insulating layer 102 with a two-layer structure, a silicon nitride oxide film may be formed as a first insulating layer, and a silicon oxynitride film may be formed as a second insulating layer. Alternatively, a silicon nitride film may be formed as the first insulating layer, and a silicon oxide film may be formed as the second insulating layer. Through formation of the insulating layer 102 that functions as a blocking layer, an element to be formed thereover can be prevented from being adversely affected by alkali metal such as Na or alkaline earth metal from the substrate 100. When the substrate 100 is formed using quartz, the insulating layer 102 may be omitted.

The first insulating layers 112, 114, 116, and 118 can be formed through heat treatment, plasma treatment, or the like performed to the semiconductor layers 104, 106, 108, and 110. For example, oxidation treatment, nitridation treatment, or oxynitridation treatment is performed to the semiconductor layers 104, 106, 108, and 110 by high-density plasma treatment, whereby oxide films, nitride films, or oxynitride films are formed as the first insulating layers 112, 114, 116, and 118 over the semiconductor layers 104, 106, 108, and 110, respectively. It is to be noted that the first insulating layers 112, 114, 116, and 118 may be formed by a plasma CVD method or a sputtering method.

For example, in the case of using a semiconductor layer mainly containing silicon as each of the semiconductor layers 104, 106, 108, and 110 and performing oxidation treatment or nitridation treatment by high-density plasma treatment, a silicon oxide ($SiO_x$) film or a silicon nitride ($SiN_x$) film is formed as each of the first insulating layers 112, 114, 116, and 118. Moreover, oxidation treatment may be performed to the semiconductor layers 104, 106, 108, and 110 by high-density plasma treatment, and then, nitridation treatment may be performed by performing high-density plasma treatment again. In this case, a silicon oxide film is formed in contact with each of the semiconductor layers 104, 106, 108, and 110 and a film containing oxygen and nitrogen (hereinafter referred to as an silicon oxynitride film) is formed over the silicon oxide film, whereby each of the first insulating layers 112, 114, 116, and 118 is a stack of the silicon oxide film and the silicon oxynitride film.

In this embodiment, each of the first insulating layers 112, 114, 116, and 118 is formed with a thickness of 1 nm to 10 nm, preferably 1 nm to 5 nm. For example, oxidation treatment is performed to the semiconductor layers 104, 106, 108, and 110 by high-density plasma treatment, whereby a silicon oxide film with a thickness of approximately 5 nm is formed over each surface of the semiconductor layers 104, 106, 108, and 110. After that, nitridation treatment is performed by high-density plasma treatment, whereby a nitrogen plasma treatment layer is formed on or adjacent to the surface of the silicon oxide film. Specifically, silicon oxide layers are formed over the semiconductor layers 104, 106, 108, and 110 by plasma treatment in oxygen atmosphere with a thickness of 3 nm to 6 nm. Then, a nitrogen plasma treatment layer with high nitrogen concentration is successively provided on or adjacent to the surface of the silicon oxide layer through plasma treatment in nitrogen atmosphere. In this embodiment, nitrogen at a rate of 20 atomic % to 50 atomic % is included in a region of the silicon oxide layer with a depth of approximately 1 nm from the surface through plasma treatment in nitrogen atmosphere. In the nitrogen plasma treatment layer, silicon containing oxygen and nitrogen (silicon oxynitride) is formed. Moreover, at this time, the oxidation treatment and the nitridation treatment by high-density plasma treatment are preferably performed successively without exposure to the air. Successively high-density plasma treatment can achieve prevention of contaminant entry and improvement in production efficiency.

In the case where the semiconductor layer is oxidized by high-density plasma treatment, the plasma treatment is performed in an atmosphere including oxygen (for example, an atmosphere containing oxygen ($O_2$) or dinitrogen monoxide ($N_2O$) and a rare gas (containing at least one of He, Ne, Ar, Kr, and Xe), or an atmosphere containing oxygen or dinitrogen monoxide, and hydrogen ($H_2$) and a rare gas). On the other hand, in the case where the semiconductor layer is nitrided by high-density plasma treatment, the plasma treatment is performed in an atmosphere including nitrogen (for example, an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas).

As the rare gas, Ar can be used, for example. Alternatively, a gas in which Ar and Kr are mixed may be used. When high-density plasma treatment is performed in a rare gas atmosphere, the first insulating layers 112, 114, 116, and 118 may contain the rare gas (containing at least one of He, Ne, Ar, Kr, and Xe) used for the plasma treatment. When Ar is used, the first insulating layers 112, 114, 116, and 118 may contain Ar.

The high-density plasma treatment is performed in an atmosphere containing the aforementioned gas with an electron density of $1\times10^{11}$ cm$^{-3}$ or more and a plasma electron temperature of 1.5 eV or less. Specifically, the high-density plasma treatment is performed with an electron density of $1\times10^{11}$ cm$^{-3}$ to $1\times10^{13}$ cm$^{-3}$ and a plasma electron temperature of 0.5 eV to 1.5 eV. Since the plasma electron density is high and the electron temperature around a treatment object formed over the substrate 100 (the semiconductor layers 104, 106, 108, and 110 in this embodiment) is low, plasma damage to the treatment object can be prevented. Moreover, since the plasma electron density is as high as $1\times10^{11}$ cm$^{-3}$ or more, an oxide film or a nitride film formed by oxidizing or nitriding the treatment object by using the plasma treatment can be dense and superior in uniformity of its thickness and the like compared to a film formed by a CVD method, a sputtering method, or the like. Furthermore, since the plasma electron temperature is as low as 1.5 eV or less, oxidation or nitridation treatment can be performed at a lower temperature than that in the conventional plasma treatment or thermal oxidation method. For example, even plasma treatment at a temperature lower than the distortion point of a glass substrate by 100° C. or more can sufficiently perform oxidation or nitridation treatment. As a frequency for generating plasma, a high-frequency wave such as a microwave (for example, 2.45 GHz) can be used.

In this embodiment, when oxidation treatment is performed to the treatment object by high-density plasma treatment, a mixed gas of oxygen ($O_2$), hydrogen ($H_2$) and argon (Ar) is introduced. As the mixed gas here, oxygen, hydrogen, and argon may be introduced at 0.1 sccm to 100 sccm, 0.1 sccm to 100 sccm, and 100 sccm to 5000 sccm, respectively. The mixed gas is preferably introduced at a ratio of oxygen:hydrogen:argon=1:1:100. For example, oxygen, hydrogen, and argon may be introduced at 5 sccm, 5 sccm, and 500 sccm, respectively.

When nitridation treatment is performed by high-density plasma treatment, a mixed gas of nitrogen ($N_2$) and argon (Ar) is introduced. As the mixed gas here, nitrogen and argon may be introduced at 20 sccm to 2000 sccm, 100 sccm to 10000 sccm, respectively. For example, nitrogen and argon may be introduced at 200 sccm and 1000 sccm, respectively.

In this embodiment, the first insulating layer 116 formed over the semiconductor layer 108 in the memory portion functions as a tunnel oxide film in the nonvolatile memory element to be completed later. Therefore, as the first insulating layer 116 is thinner, a tunnel current flows more easily, which allows a higher-speed operation as a memory. Further, as the first insulating layer 116 is thinner, more charges can be accumulated with lower voltage in a floating gate to be formed later; therefore, power consumption of the semiconductor device can be reduced. Accordingly, the first insulating layers 112, 114, 116, and 118 are preferably formed to be thin.

A thermal oxidation method is given as an example of a method for forming an insulating layer over a semiconductor layer. However, when a substrate with a melting point which is not sufficiently high, such as a glass substrate, is used as the substrate 100, it is highly difficult to form the first insulating layers 112, 114, 116, and 118 by a thermal oxidation method. Moreover, an insulating layer formed by a CVD method or a sputtering method has a problem in that the thickness is not sufficient because of its defects inside the film, and a defect such as a pinhole is produced when the insulating layer is formed to be thin. In addition, an insulating layer formed by a CVD method or a sputtering method may cover an edge of the semiconductor layer insufficiently, which may result in leakage between the semiconductor layer and a conductive film and the like to be formed over the first insulating layer 116. Thus, when the first insulating layers 112, 114, 116, and 118 are formed by the high-density plasma treatment as described in this embodiment, the first insulating layers 112, 114, 116, and 118 can be denser than an insulating layer formed by a CVD method, a sputtering method, or the like. Moreover, the first insulating layers 112, 114, 116, and 118 can sufficiently cover the edge portions of the semiconductor layers 104, 106, 108, and 110, respectively. As a result, an operation speed and a charge-retention property as a memory can be improved. It is to be noted that when the first insulating layers 112, 114, 116, and 118 are formed by a CVD method or a sputtering method, the surfaces of the insulating layers are preferably subjected to oxidation treatment, nitridation treatment, or oxynitridation treatment by high-density plasma treatment after the insulating layers are formed.

The first conductive layer 120 is formed by stacking a film containing germanium, such as germanium (Ge) or a silicon germanium alloy, and a film of a metal, an alloy, or a metal compound. For example, the first conductive layer 120 is formed using a film containing germanium as its main component with a thickness of 1 nm to 20 nm, preferably 1 nm to 10 μm, by a plasma CVD method in an atmosphere containing a germanium element (for example, $GeH_4$). For example, a germanium layer can be formed using a germane ($GeH_4$) gas diluted with hydrogen to 5% to 10%, by the application of a high-frequency power of 13.56 MHz to 60 MHz (for example, 27 MHz) with the substrate 100 heated at a temperature of 200° C. to 350° C.

The second conductive layer 123 is formed of a metal or an alloy thereof, or a metal compound. For example, a tantalum film is formed with a thickness of 1 nm to 20 nm, preferably 1 nm to 10 nm. Alternatively, the second conductive layer 123 can be formed using a refractory metal such as tungsten (W), titanium (Ti), molybdenum (Mo), chromium (Cr), or nickel (Ni). The alloy may be formed using the refractory metal and niobium, zirconium, cerium, thorium, or hafnium. Alternatively, oxide or nitride of the refractory metal may be used. The metal nitride can be tantalum nitride, tungsten nitride, molybdenum nitride, titanium nitride, or the like. The metal oxide can be tantalum oxide, titanium oxide, molybdenum oxide, or the like. The second conductive layer 123 can be formed by a sputtering method, an electron beam evaporation method, or the like. When the second conductive layer 123 is formed by a sputtering method, a target including a subject metal may be used. In forming metal oxide or metal nitride, it may be formed by reactive sputtering or with the use of a target of the metal oxide or the metal nitride. When the second conductive layer 123 to be a second floating gate electrode layer 125 later is thus formed of a metal or the like, a first floating gate electrode layer 121 formed using the first conductive layer 120 can be stabilized.

Subsequently, the first insulating layers 112, 114, and 118, and the stacked structure including the first conductive layer 120 and the second conductive layer 123, which are formed over the semiconductor layers 104, 106, and 110, are removed, whereas the first insulating layer 116 and the stacked structure including the first conductive layer 120 and the second conductive layer 123, which are formed over the semiconductor layer 108, are left. In this embodiment, the semiconductor layer 108, the first insulating layer 116, and the stacked structure including the first conductive layer 120 and the second conductive layer 123 provided in the memory portion are covered with a resist, and the first insulating layers 112, 114, and 118, and the stacked structure including the first conductive layer 120 and the second conductive layer 123, which are formed over the semiconductor layers 104, 106, and 110, are removed by etching (see FIG. 18B).

Next, a resist 122 is selectively formed to cover the semiconductor layers 104, 106, and 110 and a part of the stacked structure including the first conductive layer 120 and the second conductive layer 123 formed over the semiconductor layer 108, and a part of the first conductive layer 120 and the second conductive layer 123 not covered with the resist 122 is removed by etching. Thus, the part of the stacked structure including the first conductive layer 120 and the second conductive layer 123 covered with the resist 122 is left; accordingly, a stacked structure including a first floating gate electrode layer 121 and a second floating gate electrode layer 125 functioning as a floating gate is formed (see FIGS. 18C and 32).

Then, an impurity region is formed in a specific region of the semiconductor layer 110. In this embodiment, an impurity region 126 is formed by selectively forming a resist 124 to cover the semiconductor layers 104, 106, and 108 and a part of the semiconductor layer 110 after the resist 122 is removed and by introducing an impurity element to a part of the semiconductor layer 110 not covered with the resist 124 (see FIG. 19A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is introduced to the semiconductor layer 110.

Figure 19A:
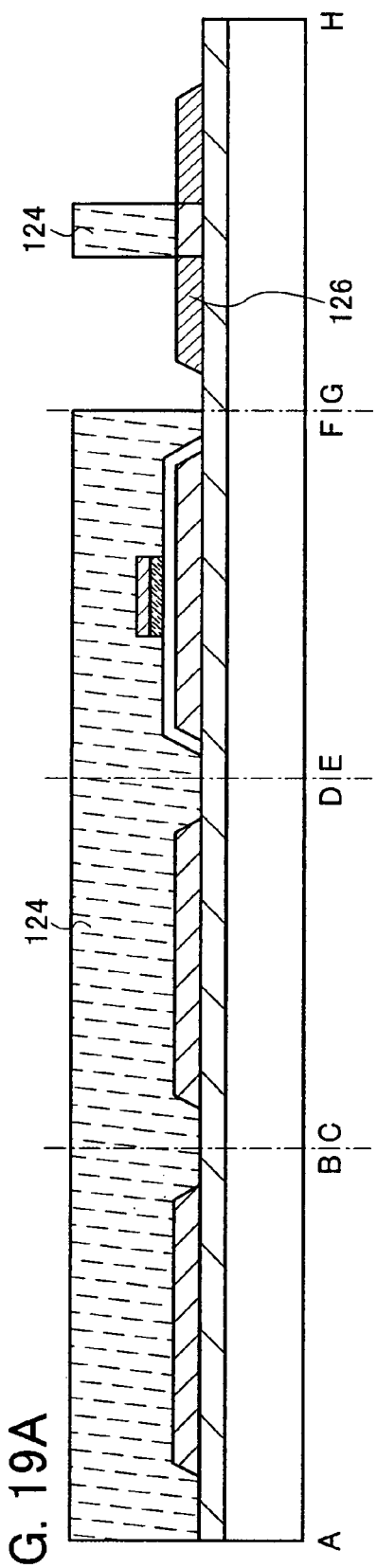
FIGS. 19A to 19C are diagrams showing an example of a manufacturing method of a nonvolatile semiconductor memory device of the present invention.
Figure 19B:
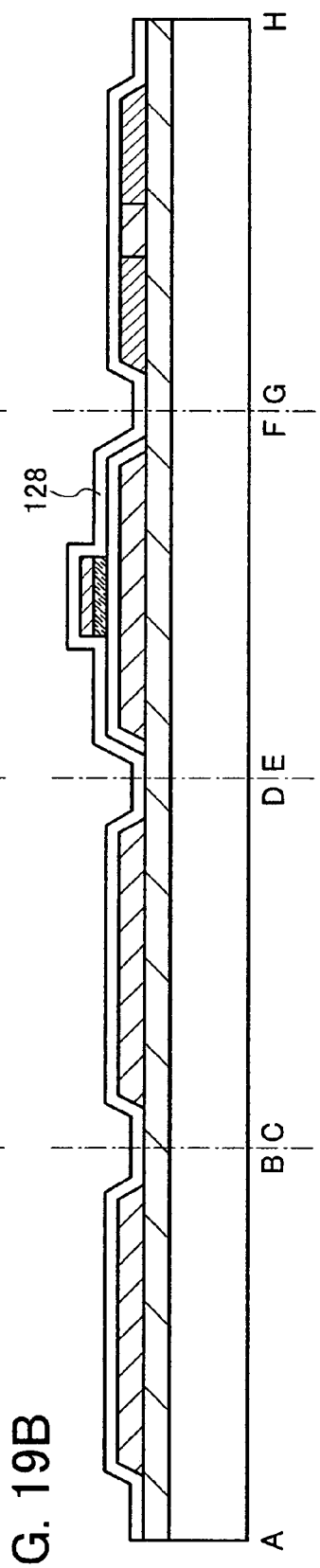

Subsequently, a second insulating layer 128 is formed to cover the semiconductor layers 104, 106, and 110, and the first insulating layer 116, and the stacked structure including and the first floating gate electrode layer 121 and the second floating gate electrode layer 125 functioning as a floating gate, which are formed over the semiconductor layer 108 (see FIG. 19B).

The second insulating layer 128 is formed by a CVD method, a sputtering method, or the like using an insulating material such as silicon oxide, silicon nitride, silicon oxynitride ($SiO_xN_y$, (x>y)), or silicon nitride oxide ($SiN_xO_y$, (x>y)) with a single layer structure or a stacked structure. For example, in the case of the second insulating layer 128 with a single layer structure, a silicon oxynitride film or a silicon nitride oxide film is formed by a CVD method with a thickness of 5 nm to 50 nm. In the case of the second insulating layer 128 with a three-layer structure, a silicon oxynitride film may be formed as a first insulating layer, a silicon nitride film may be formed as a second insulating layer, and a silicon oxynitride film may be formed as a third insulating layer. Alternatively, oxide or nitride of germanium may be used for the second insulating layer 128.

It is to be noted that the second insulating layer 128 formed over the semiconductor layer 108 functions as a control insulating layer in the nonvolatile memory element to be completed later, and the second insulating layer 128 formed over the semiconductor layer 110 functions as a gate insulating layer in a transistor to be completed later.

Figure 19C:
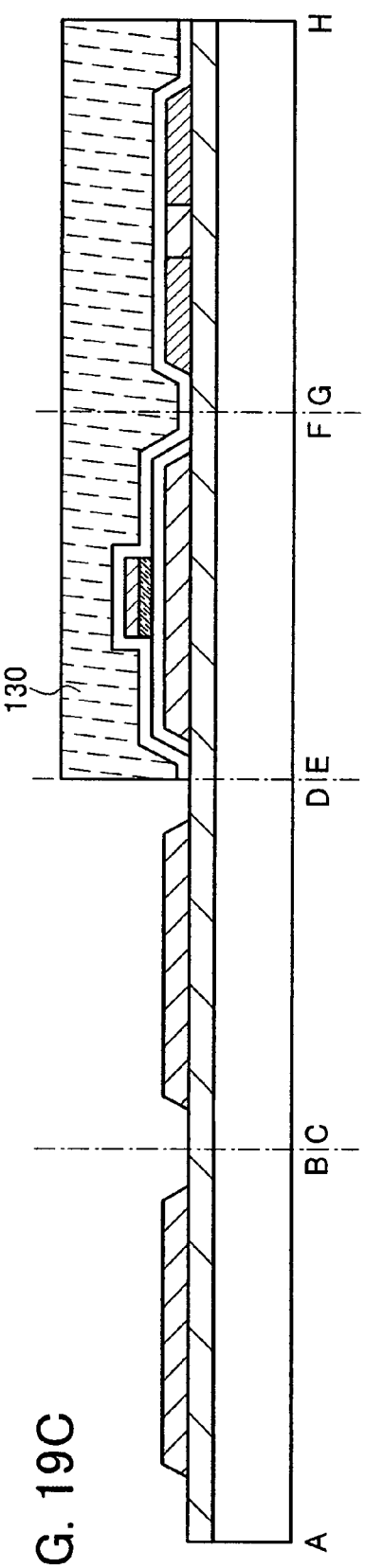

Next, a resist 130 is selectively formed to cover the second insulating layer 128 formed over the semiconductor layers 108 and 110, and the second insulating layer 128 formed over the semiconductor layers 104 and 106 is removed (see FIG. 19C).

Then, third insulating layers 132 and 134 are formed to cover the semiconductor layers 104 and 106, respectively (see FIG. 20A).

The third insulating layers 132 and 134 are formed by any of the methods described as the method for forming the first insulating layers 112, 114, 116, and 118. For example, oxidation treatment, nitridation treatment, or oxynitridation treatment is performed to the semiconductor layers 104, 106, 108, and 110 by high-density plasma treatment; thus, oxide films, nitride films, or oxynitride films of silicon are formed as the third insulating layers 132 and 134 over the semiconductor layers 104 and 106, respectively.

In this embodiment, each of the third insulating layers 132 and 134 is formed with a thickness of 1 nm to 20 nm, preferably 1 nm to 10 nm. For example, a silicon oxide film is formed on each surface of the semiconductor layers 104 and 106 by performing oxidation treatment to each of the semiconductor layers 104 and 106 by high-density plasma treatment, and then, a nitrogen plasma treatment layer is formed on or adjacent to the surface of the silicon oxide film by performing nitridation treatment by high-density plasma treatment. Further, in this case, the oxidation treatment or the nitridation treatment is also performed to the surface of the second insulating layer 128 formed over the semiconductor layers 108 and 110, so that an oxide film or an oxynitride film is formed. Each of the third insulating layers 132 and 134 formed over the semiconductor layers 104 and 106 functions as a gate insulating layer in a transistor to be completed later.

Next, a conductive film is formed to cover the third insulating layers 132 and 134 formed over the semiconductor layers 104 and 106, and the second insulating layer 128 formed over the semiconductor layers 108 and 110 (see FIG. 20B). This embodiment describes an example in which conductive films 136 and 138 are sequentially stacked as the conductive film. Of course, the conductive film may have a single-layer structure or a stacked structure including three or more layers.

The conductive films 136 and 138 can be formed using an element selected from tantalum (Ta), tungsten (W), titanium (Ti), molybdenum (Mo), aluminum (Al), copper (Cu), chromium (Cr), niobium (Nb), and the like or an alloy material or a compound material containing the above element as its main component. Alternatively, a metal nitride film obtained by nitriding the above-mentioned element can be used. Further alternatively, a semiconductor material typified by polycrystalline silicon doped with an impurity element such as phosphorus can be used.

In this embodiment, the conductive layer is provided with a stacked structure in which the conductive film 136 is formed using tantalum nitride and the conductive film 138 is formed using tungsten thereover. Alternatively, a single layer or a stacked layer of tungsten nitride, molybdenum nitride, or titanium nitride can be used as the conductive film 136, and a single layer or a stacked layer of tantalum, molybdenum, or titanium can be used as the conductive film 138.

Next, the stacked conductive films 136 and 138 are selectively removed by etching, so that the conductive films 136 and 138 are partially left over the semiconductor layers 104, 106, 108, and 110 to form conductive films 140, 142, 144, and 146 each functioning as a gate electrode (see FIGS. 20C and 33). It is to be noted that the conductive film 144 formed over the semiconductor layer 108 provided in the memory portion functions as a control gate in the nonvolatile memory element to be completed later. Each of the conductive films 140, 142, and 146 functions as a gate electrode of a transistor to be completed later.

Then, impurity regions are formed by selectively forming a resist 148 to cover the semiconductor layer 104 and by introducing an impurity element to the semiconductor layers 106, 108, and 110 using the resist 148 and the conductive films 142, 144, and 146 as masks (see FIG. 21A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is used.

In FIG. 21A, by introducing the impurity element, impurity regions 152 which form a source region and a drain region, and a channel forming region 150 are formed in the semiconductor layer 106. In the semiconductor layer 108, impurity regions 156 which form a source region and a drain region, low-concentration impurity regions 158 which form LDD regions, and a channel forming region 154 are formed. In the semiconductor layer 110, impurity regions 162 which form a source region and a drain region, low-concentration impurity regions 164 which form LDD regions, and a channel forming region 160 are formed.

The low-concentration impurity regions 158 are formed in the semiconductor layer 108 by passage of the impurity element introduced in FIG. 21A through the stacked structure including the first floating gate electrode layer 121 and the second floating gate electrode layer 125 functioning as a floating gate. Therefore, in the semiconductor layer 108, the channel forming region 154 is formed in a region which is overlapped by both the conductive film 144 and the stacked structure including the first floating gate electrode layer 121 and the second floating gate electrode layer 125; each of the low-concentration impurity regions 158 is formed in a region which is overlapped by the stacked structure including the first floating gate electrode layer 121 and the second floating gate electrode layer 125 and which is not overlapped by the conductive film 144; and each of the high-concentration impurity regions 156 is formed in a region which is overlapped by neither the conductive film 144 nor the stacked structure including the first floating gate electrode layer 121 and the second floating gate electrode layer 125.

Subsequently, impurity regions are formed by selectively forming a resist 166 to cover the semiconductor layers 106, 108, and 110 and by introducing an impurity element to the semiconductor layer 104 using the resist 166 and the conductive film 140 as masks (see FIG. 21B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a different conductivity type from that of the impurity element introduced to the semiconductor layers 106, 108, and 110 in FIG. 21A, such as boron (B), is used. As a result, in the semiconductor layer 104, impurity regions 170 which form a source region and a drain region, and a channel forming region 168 are formed.

Next, an insulating layer 172 is formed to cover the second insulating layer 128, the third insulating layers 132 and 134, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (see FIGS. 21C and 34).

The insulating layer 172 can be formed by a CVD method, a sputtering method, or the like using an insulating layer containing oxygen or nitrogen such as silicon oxide ($SiO_x$), silicon nitride ($SiN_x$), silicon oxynitride ($SiO_xN_y$, (x>y)), or silicon nitride oxide ($SiN_xO_y$, (x>y)), a film containing carbon such as DLC (diamond-like carbon), an organic material such as epoxy, polyimide, polyamide, polyvinyl phenol, benzocyclobutene, or acrylic, or a siloxane material such as a siloxane resin with a single layer structure or a stacked structure. The siloxane material is a material including a Si—O—Si bond. Siloxane has a skeleton structure formed of a bond of silicon (Si) and oxygen (O). As a substituent, an organic group containing at least hydrogen (for example, an alkyl group or aromatic hydrocarbon) is used. Alternatively, a fluoro group may be used as a substituent. Further, as a substituent, both a fluoro group and an organic group containing at least hydrogen may be used.

The conductive film 174 is formed by a CVD method, a sputtering method, or the like using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si) or an alloy material or a compound material containing the above-mentioned element as its main component with a single layer structure or a stacked structure. An alloy material containing aluminum as its main component corresponds to, for example, an alloy material containing aluminum as a main component and nickel, or an alloy material containing aluminum as a main component, nickel, and one or both of carbon and silicon. As the conductive film 174, a stacked structure of a barrier film, an aluminum-silicon (Al—Si) film, and a barrier film, or a stacked structure of a barrier film, an aluminum-silicon (Al—Si) film, a titanium nitride (TiN) film, and a barrier film may be employed, for example. It is to be noted that the barrier film corresponds to a thin film formed using titanium, a nitride of titanium, molybdenum, or a nitride of molybdenum. Aluminum or aluminum silicon, which has low resistivity and is inexpensive, is an optimal material for forming the conductive film 174. In addition, generation of a hillock of aluminum or aluminum silicon can be prevented when upper and lower barrier layers are provided. Further, when the barrier film is formed using titanium that is a highly-reducible element, even if a thin natural oxide film is formed on the crystalline semiconductor layer, the natural oxide film is reduced so that preferable contact with the crystalline semiconductor layer can be obtained.

In this embodiment, the stacked structure including the first floating gate electrode layer 121 and the second floating gate electrode layer 125 functioning as a floating gate is formed so as to extend beyond the edges of the semiconductor layer 108 (see FIG. 32). Therefore, the stacked structure including the first floating gate electrode layer 121 and the second floating gate electrode layer 125 functioning as a floating gate is formed over the edges of the semiconductor layer 108 provided in an island shape with the first insulating layer 116 functioning as a tunnel insulating layer interposed therebetween. Accordingly, at the edges of the semiconductor layer 108, characteristics of the nonvolatile memory element may be adversely affected due to a coverage defect of the first insulating layer 116 or some charge accumulation accompanying the manufacturing process. Therefore, in the above-described structure, impurity regions 194 may be selectively provided in a region which is overlapped by the stacked structure including the first floating gate electrode layer 121 and the second floating gate electrode layer 125 and its vicinity near the edge portions of the semiconductor layer 108 (see FIG. 35).

The impurity regions 194 are provided so as to have a different conductivity type from that of the impurity regions 156 functioning as a source region and a drain region in the semiconductor layer 108. For example, when the impurity regions 156 are provided so as to have n-type conductivity, the impurity regions 194 are provided so as to have p-type conductivity.

Figure 35:
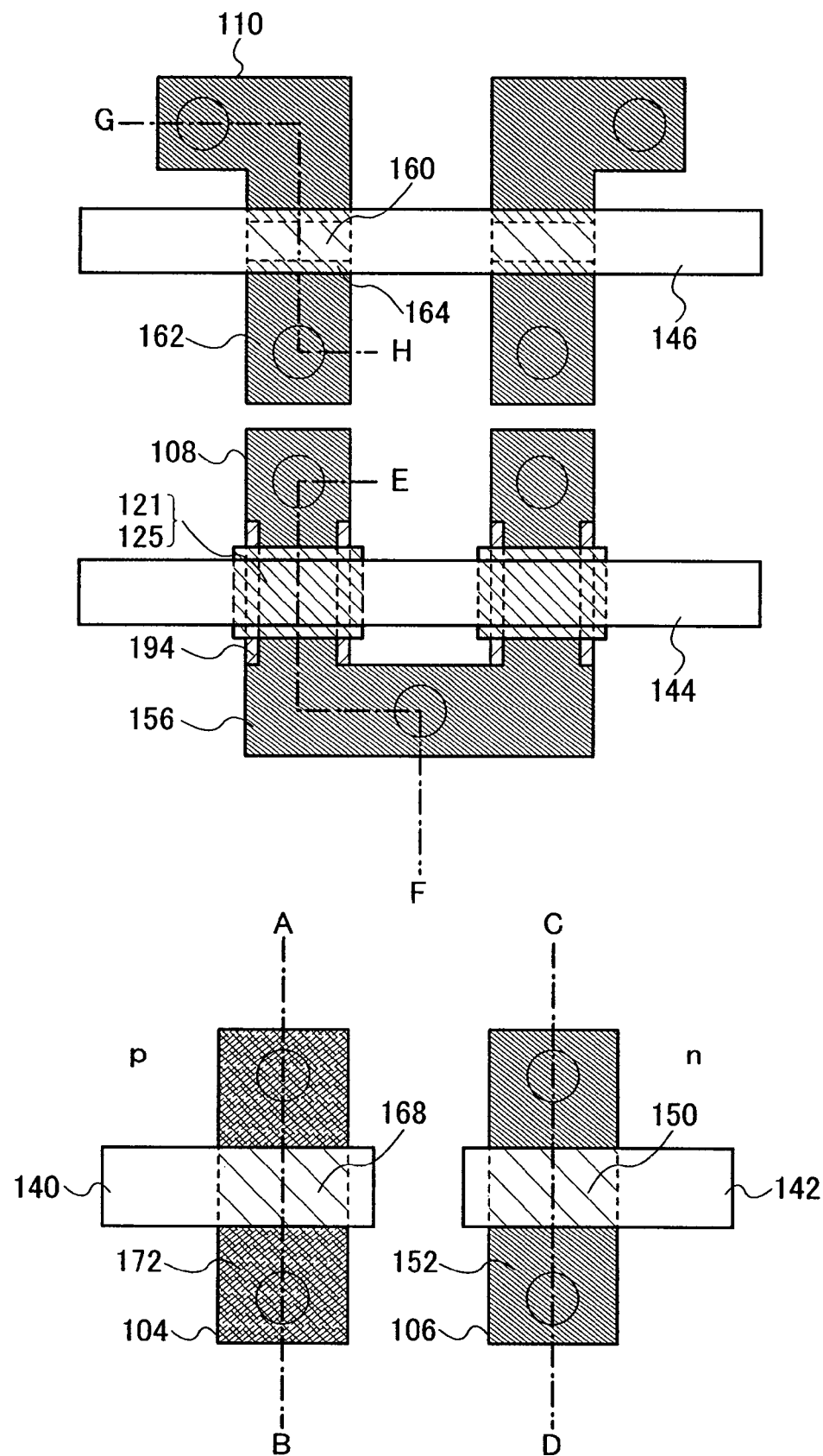
FIG. 35 is a diagram showing an example of a top view of a nonvolatile semiconductor memory device of the present invention.

In addition, FIG. 35 shows an example in which the impurity regions 194 are provided in the region which is overlapped by the stacked structure including the first floating gate electrode layer 121 and the second floating gate electrode layer 125 functioning as a floating gate and its vicinity near the edge portions of the semiconductor layer 108; however, the present invention is not limited thereto. For example, the impurity regions 194 may be provided only in the region which is overlapped by the stacked structure including the first floating gate electrode layer 121 and the second floating gate electrode layer 125 at the edges of the semiconductor layer 108, or entirely in the peripheral portion of the edge of the semiconductor layer 108. Alternatively, for example, the impurity regions 194 may be provided in the vicinity of the region which is overlapped by the stacked structure including the first floating gate electrode layer 121 and the second floating gate electrode layer 125 at the edges of the semiconductor layer 108 and not provided below the stacked structure including the first floating gate electrode layer 121 and the second floating gate electrode layer 125 (see FIG. 36).

In such a manner, by providing the impurity regions 194, resistance of a portion where the impurity regions 156 and 194 are adjacent to each other is increased due to a p-n junction. Accordingly, characteristics of the nonvolatile memory element are prevented from being affected due to a coverage defect of the first insulating layer 116, some charge accumulation accompanying the manufacturing process, and the like at the edges of the semiconductor layer 108.

Figure 36:
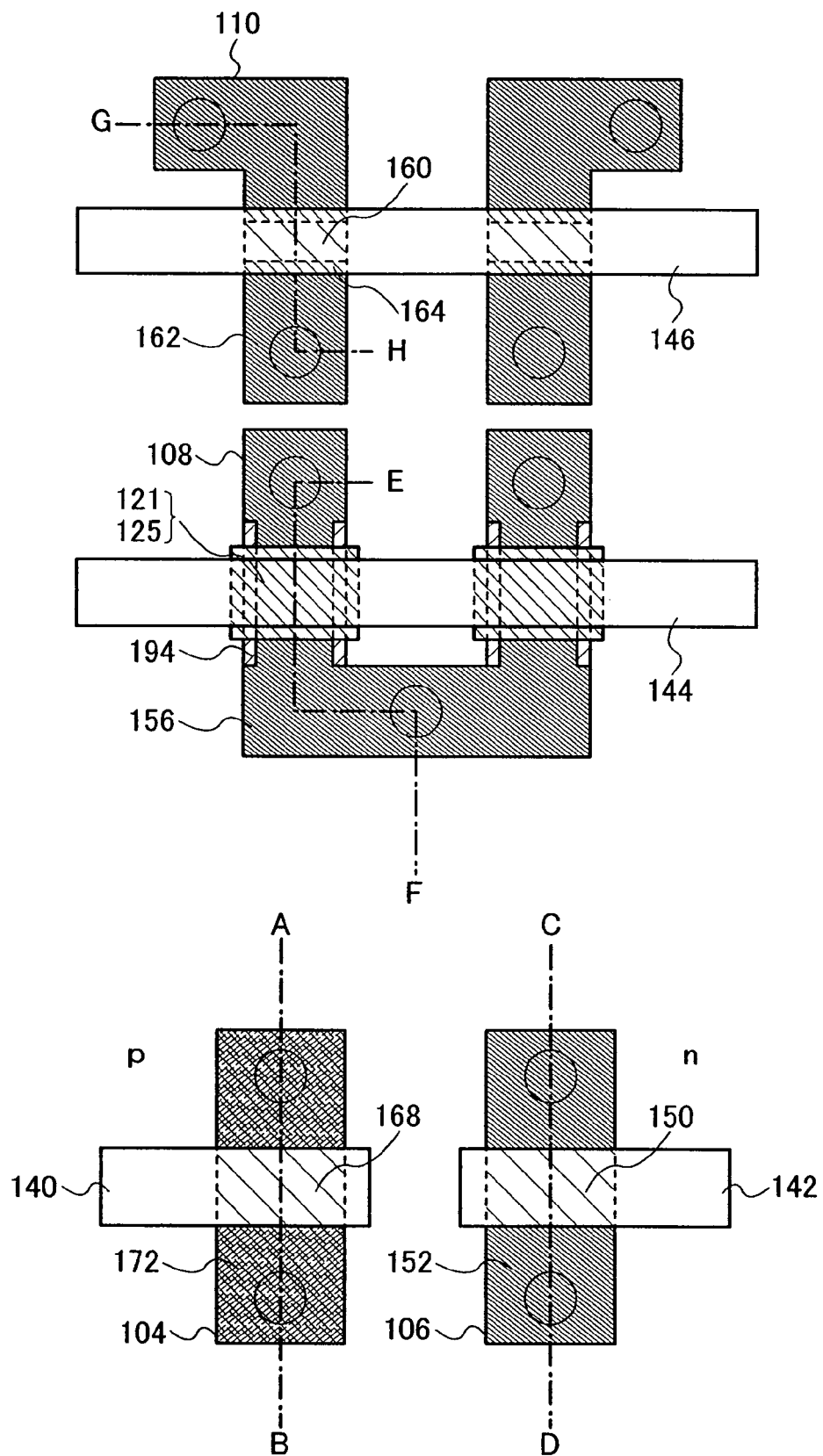
FIG. 36 is a diagram showing an example of a top view of a nonvolatile semiconductor memory device of the present invention.

In this embodiment, the nonvolatile memory element in the portion between E and F is explained. Similarly, the impurity region 194 may also be provided in the transistors provided in the portions between A and B, C and D, and G and H as shown in FIGS. 35 and 36.

In the nonvolatile semiconductor memory device of this embodiment, a reduction in power consumption can be achieved by making the thicknesses of gate insulating layers in transistors different in accordance with circuit structures. In addition, a stable operation of the nonvolatile semiconductor memory device can be achieved. Specifically, by formation of a thin gate insulating layer of a transistor included in a logic portion, variation in threshold voltage can be reduced, and the memory device can be driven with low voltage. By formation of a thick gate insulating layer of a selection transistor included in a memory portion, stability of an operation can be enhanced even when higher voltage than that in the logic portion is applied in writing and erasing operations in the nonvolatile memory element. In the nonvolatile memory element, charges can be easily injected from a semiconductor layer to the floating gate electrode, and the charges can be prevented from being discharged from the floating gate electrode. In other words, in the case of an operation as a memory, writing can be performed with very high efficiency at low voltage, and a charge-retention property can be improved. According to this embodiment, a nonvolatile semiconductor memory device which has excellent effect as described above can be manufactured in successive steps.

This embodiment can be executed by being combined with any of the embodiment mode or the other embodiments shown in this specification.

Embodiment 2

Figure 37:
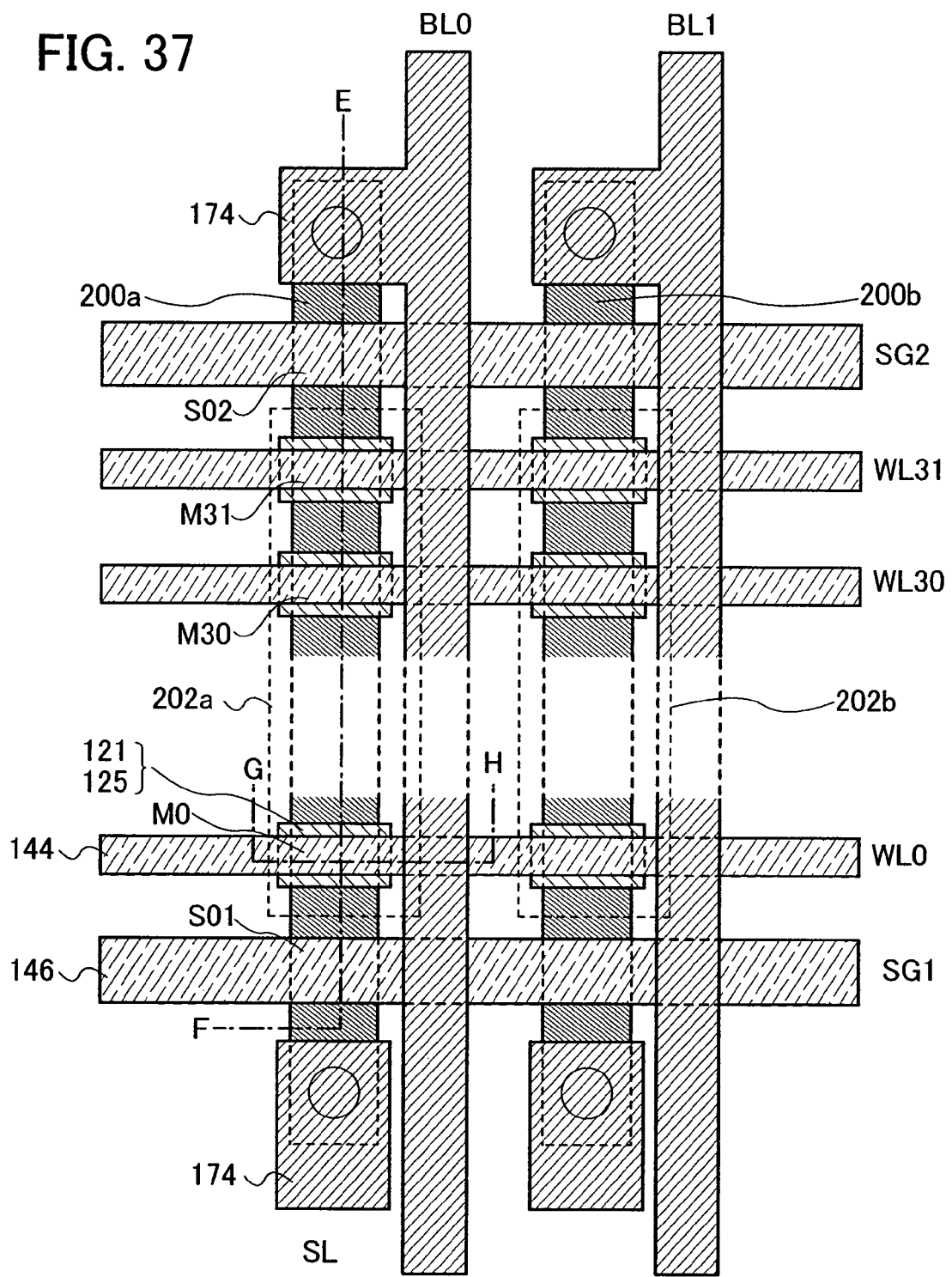
FIG. 37 is a diagram showing an example of a nonvolatile semiconductor memory device of the present invention.
Figure 38A:
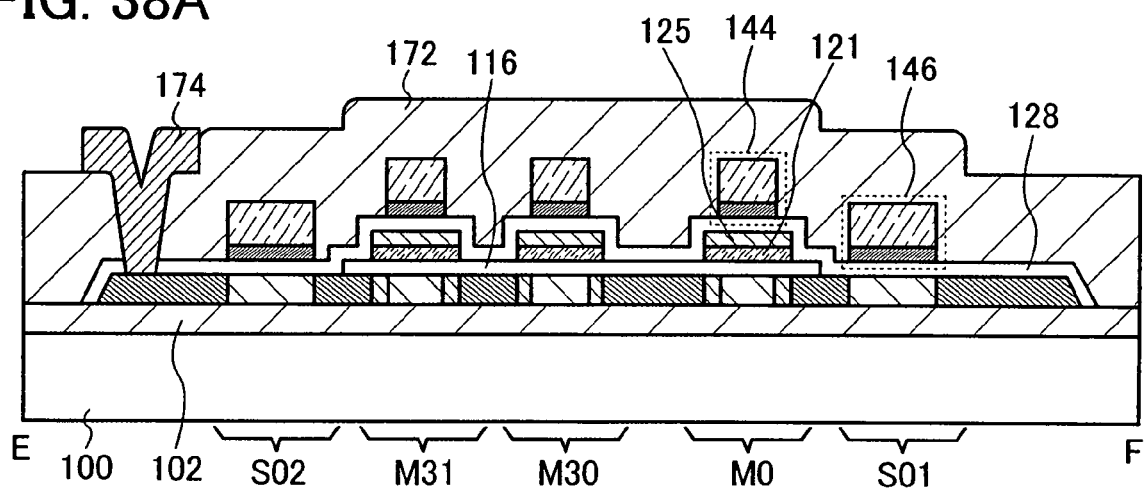
FIGS. 38A and 38B are diagrams each showing an example of a nonvolatile semiconductor memory device of the present invention.
Figure 38B:
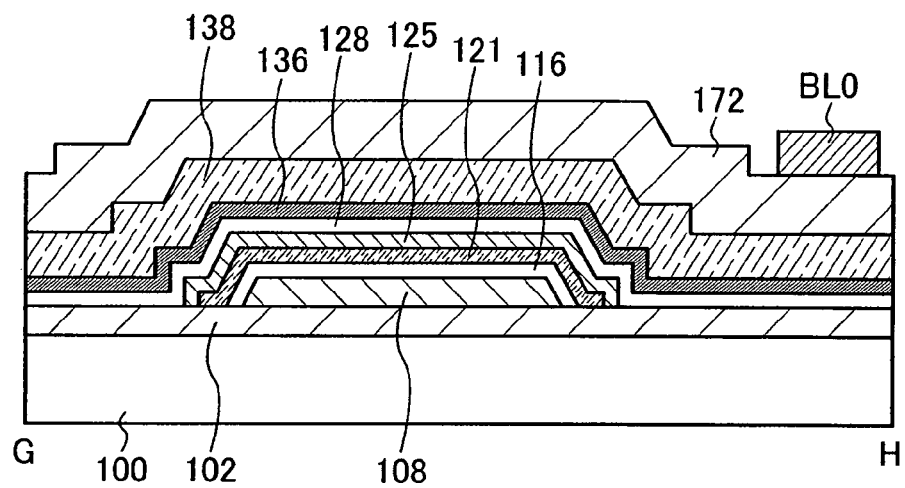

This embodiment will explain a case where a plurality of nonvolatile memory elements are provided using one island-like semiconductor layer in the structure shown in Embodiment 1, with reference to drawings. It is to be noted that the same portions as those in the above embodiment are denoted by the same reference numerals, and explanation thereof will be omitted. FIG. 37 shows a top view, and FIGS. 38A and 38B show cross-sectional views taken along lines E-F and G-H of FIG. 37.

The nonvolatile semiconductor memory device described in this embodiment includes island-like semiconductor layers 200a and 200b electrically connected to bit lines BL0 and BL1, respectively. A plurality of nonvolatile memory elements are provided using each of the island-like semiconductor layers 200a and 200b (see FIGS. 37 and 45). Specifically, using the semiconductor layer 200a, a NAND cell 202a including a plurality of nonvolatile memory elements M0 to M31 is provided between selection transistors S01 and S02. Further, using the semiconductor layer 200b, a NAND cell 202b including a plurality of nonvolatile memory elements is provided between selection transistors. In addition, by separately providing the semiconductor layers 200a and 200b, the adjacent NAND cells 202a and 202b can be insulated and isolated from each other.

When a plurality of nonvolatile memory elements are provided using one island-like semiconductor layer, further integration of the nonvolatile memory elements becomes possible, whereby a large-capacity nonvolatile semiconductor memory device can be formed.

In this embodiment, by formation of a thick gate insulating layer in a selection transistor of a NAND cell as in Embodiment 1, stability of an operation can be enhanced even when higher voltage than that in a logic portion is applied in writing and erasing operations in the nonvolatile memory element. In the nonvolatile memory element, charges can be easily injected from a semiconductor layer to a floating gate electrode, and the charges can be prevented from being discharged from the floating gate electrode. With such a structure, stability of an operation of the nonvolatile semiconductor memory device according to this embodiment can be achieved.

This embodiment can be executed by being combined with any of the embodiment mode or the other embodiments shown in this specification.

Embodiment 3

This embodiment will explain a manufacturing method of a semiconductor device, which is different from that of Embodiment 1, with reference to drawings. It is to be noted that the same portions as those in the above embodiment are denoted by the same reference numerals, and explanation thereof will be omitted. In FIGS. 22A to 24B, each of portions between A and B and between C and D shows a thin film transistor provided in a logic portion, a portion between E and F shows a nonvolatile memory element provided in a memory portion, and a portion between G and H shows a thin film transistor provided in the memory portion.

Figure 18A:
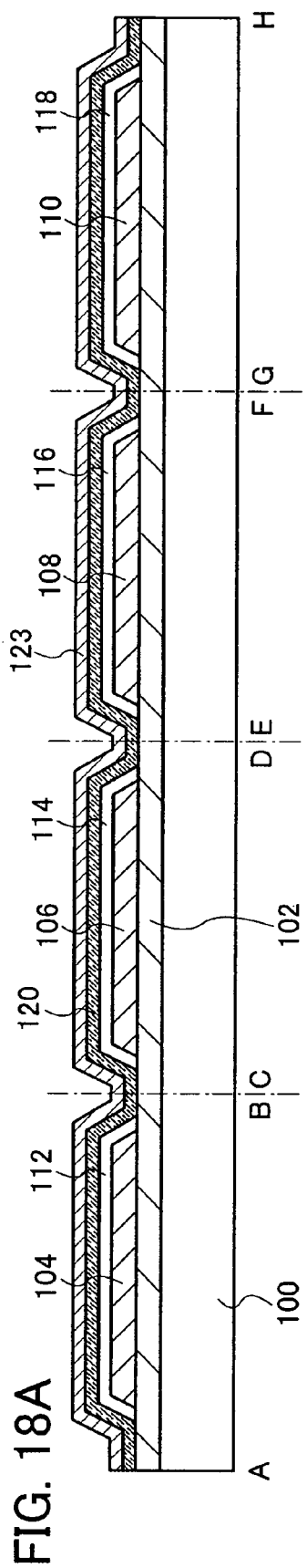
FIGS. 18A to 18C are diagrams showing an example of a manufacturing method of a nonvolatile semiconductor memory device of the present invention.
Figure 18B:
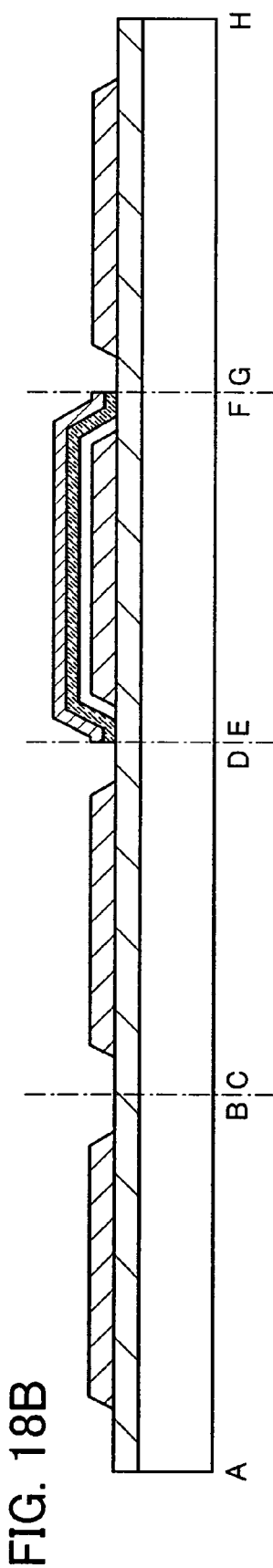
Figure 18C:
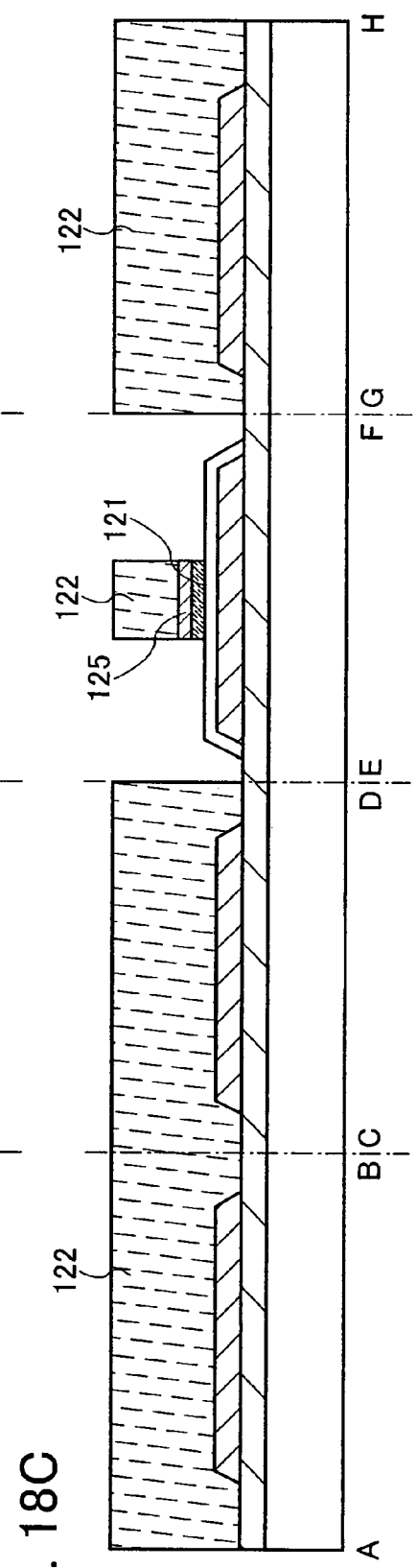

First, the components up to those in FIG. 18C are similarly formed. Then, the resist 122 is removed, and a second insulating layer 128 is formed to cover the semiconductor layers 104, 106, and 110, and the first insulating layer 116 and the stacked structure including the first floating gate electrode layer 121 and the second floating gate electrode layer 125, which are formed over the semiconductor layer 108 (see FIG. 22A).

Then, a resist 130 is selectively formed to cover the second insulating layer 128 formed over the semiconductor layers 108 and 110, and the second insulating layer 128 formed over the semiconductor layers 104 and 106 is selectively removed (see FIG. 22B).

Then, third insulating layers 132 and 134 are formed to cover the semiconductor layers 104 and 106, respectively (see FIG. 22C).

A conductive film is formed to cover the third insulating layers 132 and 134 formed over the semiconductor layers 104 and 106, and the second insulating layer 128 formed over the semiconductor layers 108 and 110 (see FIG. 23A). In this embodiment, an example of the conductive film is shown, in which conductive films 136 and 138 are sequentially stacked. Of course, the conductive film may have a single layer structure or a stacked structure including three or more layers.

Next, the stacked conductive films 136 and 138 are selectively removed by etching, so that the conductive films 136 and 138 are partially left over the semiconductor layers 104, 106, 108, and 110 to form conductive films 140, 142, 144, and 146 each functioning as a gate electrode (see FIG. 23B). It is to be noted that the conductive film 140 includes stacked conductive films 182a and 184a which are formed by the remaining conductive films 136 and 138. In addition, in this embodiment, the width (the width in a direction almost parallel to a direction in which carriers flow in a channel forming region (a direction connecting a source region and a drain region)) of the lower conductive film 182a is made larger than that of the conductive film 184a in the conductive film 140. Similarly, a conductive film 182b and a conductive film 184b having a narrower width than that of the conductive film 182b are sequentially stacked in the conductive film 142; a conductive film 182c and a conductive film 184c having a narrower width than that of the conductive film 182c are sequentially stacked in the conductive film 144; and a conductive film 182d and a conductive film 184d having a narrower width than that of the conductive film 182d are sequentially stacked in the conductive film 146.

Then, a resist 148 is selectively formed to cover the semiconductor layer 104, and an impurity element is introduced to the semiconductor layers 106, 108, and 110 using the resist 148 and the conductive films 142, 144, and 146 as masks, whereby impurity regions are formed (see FIG. 23C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is used.

In FIG. 23C, by introducing the impurity element, high-concentration impurity regions 152 which form a source region and a drain region, low-concentration impurity regions 186 which form LDD regions, and a channel forming region 150 are formed in the semiconductor layer 106. In the semiconductor layer 108, impurity regions 156 which form a source region and a drain region, low-concentration impurity regions 158 which form LDD regions, and a channel forming region 154 are formed. Further, in the semiconductor layer 110, high-concentration impurity regions 162 which form a source region and a drain region, low-concentration impurity regions 164 which form LDD regions, and a channel forming region 160 are formed.

The low-concentration impurity regions 186 are formed in the semiconductor layer 106 by passage of the impurity element introduced in FIG. 23C through the conductive film 182b. Therefore, in the semiconductor layer 106, the channel forming region 150 is formed in a region which is overlapped by both the conductive films 182b and 184b, the low-concentration impurity regions 186 are formed in a region which is overlapped by the conductive film 182b and which is not overlapped by the conductive film 184b, and the high-concentration impurity regions 152 are formed in a region which is overlapped by neither the conductive film 182b nor 184b.

The low-concentration impurity regions 158 are formed in the semiconductor layer 108 by passage of the impurity element introduced in FIG. 23C through the stacked structure including the first floating gate electrode layer 121 and the second floating gate electrode layer 125. Therefore, in the semiconductor layer 108, the channel forming region 154 is formed in a region which is overlapped by both the conductive film 182c and the stacked structure including the first floating gate electrode layer 121 and the second floating gate electrode layer 125, the low-concentration impurity regions 158 are formed in a region which is overlapped by the stacked structure including the first floating gate electrode layer 121 and the second floating gate electrode layer 125 and which is not overlapped by the conductive film 182c, and the high-concentration impurity region 156 is formed in a region which is overlapped by neither the stacked structure including the first floating gate electrode layer 121 and the second floating gate electrode layer 125 nor the conductive film 182c. It is to be noted that when the conductive film 182c is formed to be thin, low-concentration impurity regions each having a concentration that is equal to or lower than that of the low-concentration impurity regions 158 may be formed in a region which is overlapped by both the conductive film 182c and the stacked structure including the first floating gate electrode layer 121 and the second floating gate electrode layer 125 and which is not overlapped by the conductive film 184c in the semiconductor layer 108.

The low-concentration impurity regions 164 are formed in the semiconductor layer 110 by passage of the impurity element introduced in FIG. 23C through the conductive film 182d. Therefore, in the semiconductor layer 110, the channel forming regions 160 are formed in a region which is overlapped by both the conductive films 182d and 184d, the low-concentration impurity regions 164 are formed in a region which is overlapped by the conductive film 182d and which is not overlapped by the conductive film 184d, and the high-concentration impurity regions 162 are formed in a region which is overlapped by neither the conductive film 182d nor 184d.

Then, a resist 166 is selectively formed to cover the semiconductor layers 106, 108, and 110. An impurity element is introduced to the semiconductor layer 104 using the resist 166 and the conductive film 140 as masks to form an impurity regions (see FIG. 24A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a different conductivity type from that of the impurity element introduced to the semiconductor layers 106, 108, and 110 in FIG. 23C, such as boron (B), is used. As a result, in the semiconductor layer 104, high-concentration impurity regions 170 which form a source region and a drain region, low-concentration impurity regions 188 which form LDD regions, and a channel forming region 168 are formed.

The low-concentration impurity regions 188 are formed in the semiconductor layer 104 by passage of the impurity element introduced in FIG. 24A through the conductive film 182a. Therefore, in the semiconductor layer 104, the channel forming region 168 is formed in a region which is overlapped by both the conductive films 182a and 184a, the low-concentration impurity regions 188 are formed in a region which is overlapped by the conductive film 182a and which is not overlapped by the conductive film 184a, and the high-concentration impurity regions 170 are formed in a region which is overlapped by neither the conductive film 182a nor 184a.

Then, an insulating layer 172 is formed to cover the second insulating layer 128, the third insulating layers 132 and 134, and the conductive films 140, 142, 144, and 146. Over the insulating layer 172, a conductive film 174 is formed to be electrically connected to the impurity regions 170, 152, 156, and 162 which are formed in the semiconductor layers 104, 106, 108, and 110, respectively (see FIG. 24B).

Figure 42:
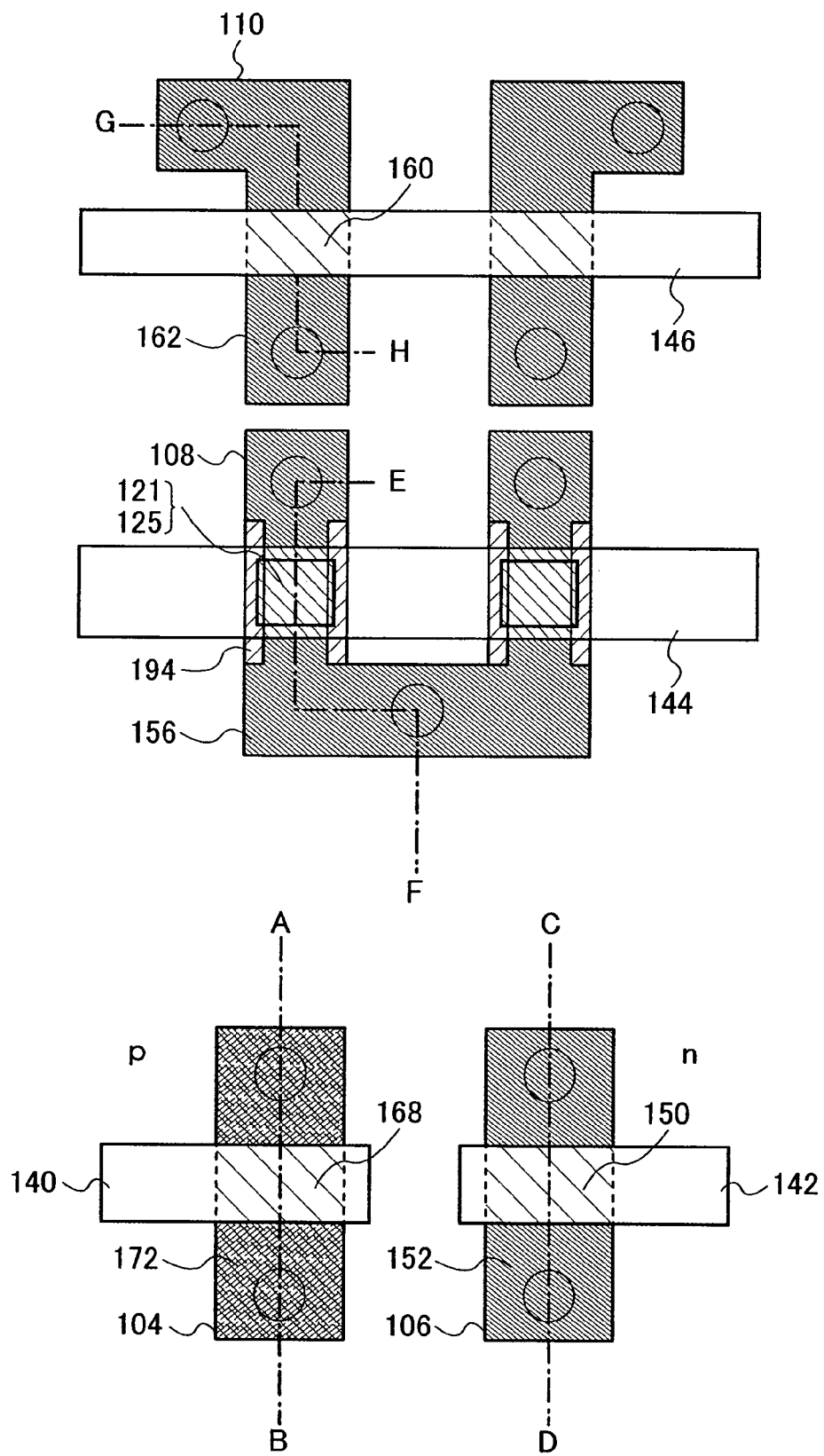
FIG. 42 is a diagram showing an example of a top view of a nonvolatile semiconductor memory device of the present invention.

It is to be noted that impurity regions 194 may be provided also in the structure shown in this embodiment as shown in FIGS. 35 and 42.

In the nonvolatile semiconductor memory device of this embodiment, a reduction in power consumption can be achieved by making the thicknesses of gate insulating layers in transistors different in accordance with circuit structures. In addition, a stable operation of the nonvolatile semiconductor memory device can be achieved. Specifically, by formation of a thin gate insulating layer of a transistor included in a logic portion, variation in threshold voltage can be reduced, and the memory device can be driven with low voltage. By formation of a thick gate insulating layer of a selection transistor included in a memory portion, stability of an operation can be enhanced even when higher voltage than that in the logic portion is applied in writing and erasing operations in the nonvolatile memory element. In the nonvolatile memory element, charges can be easily injected from a semiconductor layer to the floating gate electrode, and the charges can be prevented from being discharged from the floating gate electrode. In other words, in the case of an operation as a memory, writing can be performed with very high efficiency at low voltage, and a charge-retention property can be improved. According to this embodiment, a nonvolatile semiconductor memory device which has excellent effect as described above can be manufactured in successive steps.

This embodiment can be executed by being combined with any of the embodiment mode and the other embodiments shown in this specification.

Embodiment 4

Figure 39:
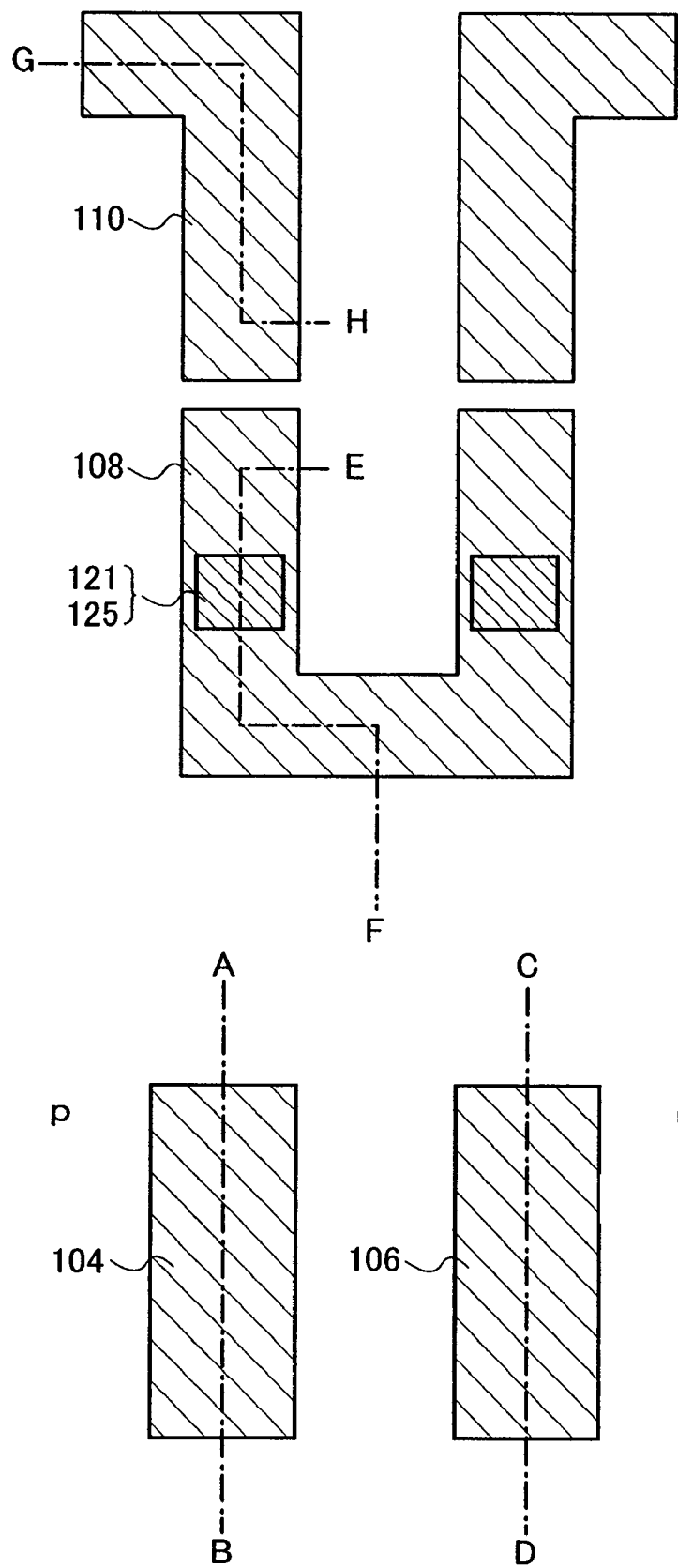
FIG. 39 is a diagram showing an example of a top view of a nonvolatile semiconductor memory device of the present invention.
Figure 40:
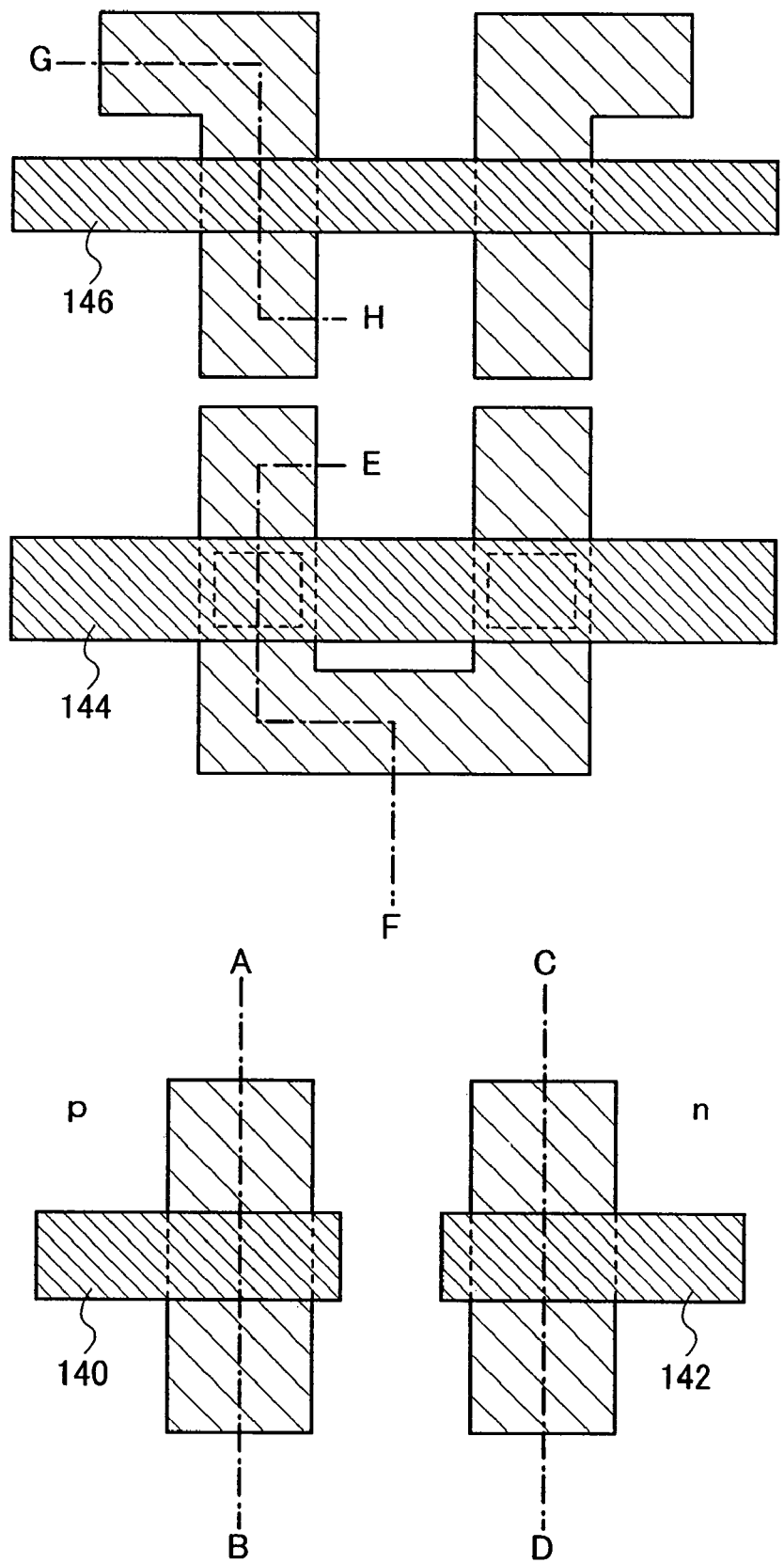
FIG. 40 is a diagram showing an example of a top view of a nonvolatile semiconductor memory device of the present invention.

This embodiment will explain a manufacturing method of a semiconductor device, which is different from that of Embodiment 1 or 2, with reference to drawings. It is to be noted that the same portions as those in Embodiment 1 or 2 are denoted by the same reference numerals, and explanation thereof will be omitted. FIGS. 39 to 41 show top views, and FIGS. 28A to 30C show cross-sectional views taken along lines A-B, C-D, E-F, and G-H of FIGS. 39 to 41. Each of portions between A and B and between C and D shows a thin film transistor provided in a logic portion, a portion between E and F shows a nonvolatile memory element provided in a memory portion, and a portion between G and H shows a thin film transistor provided in the memory portion.

First, components up to those in FIG. 18C of Embodiment 1 are similarly formed. Then, an impurity element is introduced to the semiconductor layer 108 using the resist 122 as a mask to form impurity regions 190 (see FIG. 28A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is introduced to the semiconductor layer 108. It is to be noted that, in this embodiment, the width of the stacked structure including the first floating gate electrode layer 121 and the second floating gate electrode layer 125 functioning as a floating gate is made smaller than that of the semiconductor layer 108. In other words, the stacked structure including the first floating gate electrode layer 121 and the second floating gate electrode layer 125 is provided so as not to extend beyond the semiconductor layer 108 (so that the stacked structure including the first floating gate electrode layer 121 and the second floating gate electrode layer 125 always overlaps the semiconductor layer 108) (see FIG. 39).

A second insulating layer 128 is formed to cover the semiconductor layers 104, 106, and 110, and the first insulating layer 116 and the stacked structure including the first floating gate electrode layer 121 and the second floating gate electrode layer 125, which are formed over the semiconductor layer 108 (see FIG. 28B).

A resist 130 is selectively formed to cover the second insulating layer 128 formed over the semiconductor layers 108 and 110, and the second insulating layer 128 formed over the semiconductor layers 104 and 106 is selectively removed (see FIG. 28C).

Third insulating layers 132 and 134 are formed to cover the semiconductor layers 104 and 106, respectively (see FIG. 29A).

A conductive film is formed to cover the third insulating layers 132 and 134 formed over the semiconductor layers 104 and 106, and the second insulating layer 128 formed over the semiconductor layers 108 and 110 (see FIG. 29B). In this embodiment, an example of the conductive film is shown, in which conductive films 136 and 138 are sequentially stacked. Of course, the conductive film may have a single layer structure or a stacked structure including three or more layers.

The stacked conductive films 136 and 138 are selectively removed by etching, so that the conductive films 136 and 138 are partially left over the semiconductor layers 104, 106, 108, and 110 to form conductive films 140, 142, 144, and 146 each functioning as a gate electrode (see FIGS. 29C and 40).

It is to be noted, in this embodiment, the width of the conductive film 144 formed over the semiconductor layer 108 is made larger than that of the stacked structure including the first floating gate electrode layer 121 and the second floating gate electrode layer 125 (the width in a direction almost parallel to a direction in which at least carriers flow in a channel forming region).

A resist 148 is selectively formed to cover the semiconductor layer 104, and an impurity element is introduced to the semiconductor layers 106, 108, and 110 using the resist 148 and the conductive films 142, 144, and 146 as masks, whereby impurity regions are formed (see FIG. 30A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is used.

In FIG. 30A, by introducing the impurity element, high-concentration impurity regions 152 which form a source region and a drain region and a channel forming region 150 are formed in the semiconductor layer 106. In the semiconductor layer 108, impurity regions 156 which form a source region and a drain region, low-concentration impurity regions 158 which form LDD regions, and a channel forming region 154 are formed. Further, in the semiconductor layer 110, high-concentration impurity regions 162 which form a source region and a drain region and a channel forming region 160 are formed.

A resist 166 is selectively formed to cover the semiconductor layers 106, 108, and 110. An impurity element is introduced to the semiconductor layer 104 using the resist 166 and the conductive film 140 as masks to form impurity regions (see FIG. 30B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a different conductivity type from that of the impurity element introduced to the semiconductor layers 106, 108, and 110 in FIG. 30A, such as boron (B), is used. As a result, in the semiconductor layer 104, high-concentration impurity regions 170 which form a source region and a drain region and a channel forming region 168 are formed.

An insulating layer 172 is formed to cover the second insulating layer 128, the third insulating layers 132 and 134, and the conductive films 140, 142, 144, and 146. Over the insulating layer 172, a conductive film 174 is formed to be electrically connected to the impurity regions 170, 152, 156, and 162 which are formed in the semiconductor layers 104, 106, 108, and 110, respectively (see FIGS. 30C and 41).

In this embodiment, the width of the stacked structure including the first floating gate electrode layer 121 and the second floating gate electrode layer 125 functioning as a floating gate in the nonvolatile memory element is made smaller than that of the semiconductor layer 108 (see FIG. 40). The edge of the stacked structure including the first floating gate electrode layer 121 and the second floating gate electrode layer 125 is formed over the semiconductor layer 108, and the conductive film 144 functioning as a control gate is formed so as to extend beyond the edge of the semiconductor layer 108. Therefore, characteristics of the nonvolatile memory element may be adversely affected when the edge of the stacked structure including the first floating gate electrode layer 121 and the second floating gate electrode layer 125 is formed into a nonuniform shape by etching or the like accompanying the manufacturing process. In addition, characteristics of the nonvolatile memory element may be adversely affected at the edge of the semiconductor layer 108 due to a coverage defect of the insulating layer or some charge accumulation accompanying the manufacturing process. Thus, in the above described structure, impurity regions 194 may be selectively provided in a region of the semiconductor layer 108, which is overlapped by the edge of the stacked structure including the first floating gate electrode layer 121 and the second floating gate electrode layer 125 (in this embodiment, the edge of the stacked structure including the first floating gate electrode layer 121 and the second floating gate electrode layer 125 in a direction almost perpendicular to a direction in which carriers flow in a channel forming region (a direction connecting a source region and a drain region)) and its vicinity (see FIG. 42).

The impurity regions 194 are provided so as to have a different conductivity type from that of the impurity regions 156 functioning as a source region and a drain region in the semiconductor layer 108. For example, when the impurity regions 156 are provided so as to have n-type conductivity, the impurity regions 194 are provided so as to have p-type conductivity.

In FIG. 42, the impurity regions 194 are formed to extend to a region which is not overlapped by the conductive film 144; however, the impurity regions 194 may also be formed only in a region which is overlapped with the conductive film 144. In addition, the impurity regions 194 may be provided entirely in the peripheral portion of the semiconductor layer 108.

In such a manner, by providing the impurity regions 194, resistance of a portion where the impurity regions 156 and 194 are adjacent to each other is enhanced due to a p-n junction. Accordingly, characteristics of the nonvolatile memory element are prevented from being affected due to a shape or the like of the edge of the stacked structure including the first floating gate electrode layer 121 and the second floating gate electrode layer 125.

In this embodiment, the nonvolatile memory element in the portion between E and F is explained. Similarly, the impurity regions 194 may also be provided in the transistors provided in the portions between A and B, C and D, and G and H as shown in FIGS. 35 to 42.

In the nonvolatile semiconductor memory device of this embodiment, a reduction in power consumption can be achieved by making the thicknesses of gate insulating layers in transistors different in accordance with circuit structures. In addition, a stable operation of the nonvolatile semiconductor memory device can be achieved. Specifically, by formation of a thin gate insulating layer of a transistor included in a logic portion, variation in threshold voltage can be reduced, and the memory device can be driven with low voltage. By formation of a thick gate insulating layer of a selection transistor included in a memory portion, stability of an operation can be enhanced even when higher voltage than that in the logic portion is applied in writing and erasing operations in the nonvolatile memory element. In the nonvolatile memory element, charges can be easily injected from a semiconductor layer to the floating gate electrode, and the charges can be prevented from being discharged from the floating gate electrode. In other words, in the case of an operation as a memory, writing can be performed with very high efficiency at low voltage, and a charge-retention property can be improved. According to this embodiment, a nonvolatile semiconductor memory device which has excellent effect as described above can be manufactured in successive steps.

This embodiment can be executed by being combined with any of the embodiment mode and the other embodiments shown in this specification.

Embodiment 5

Figure 43:
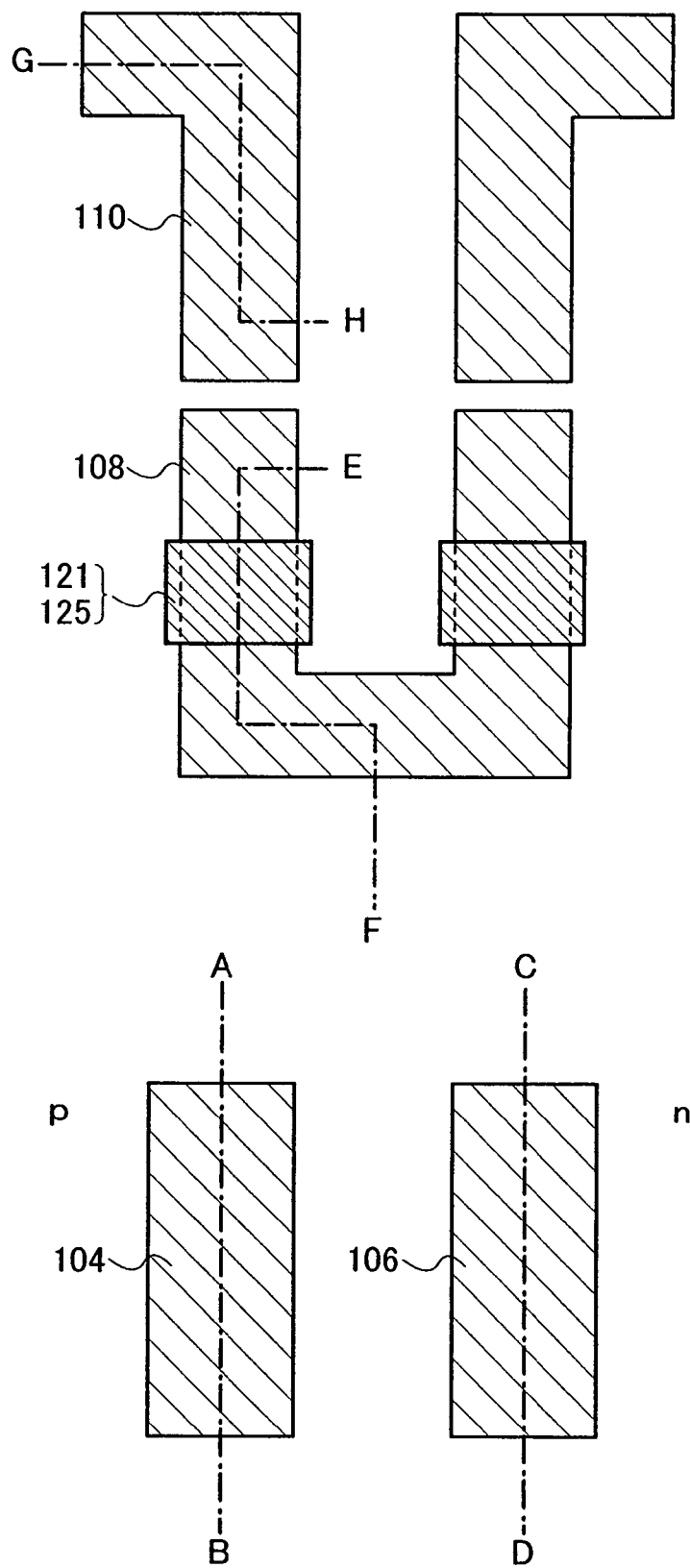
FIG. 43 is a diagram showing an example of a top view of a nonvolatile semiconductor memory device of the present invention.
Figure 44:
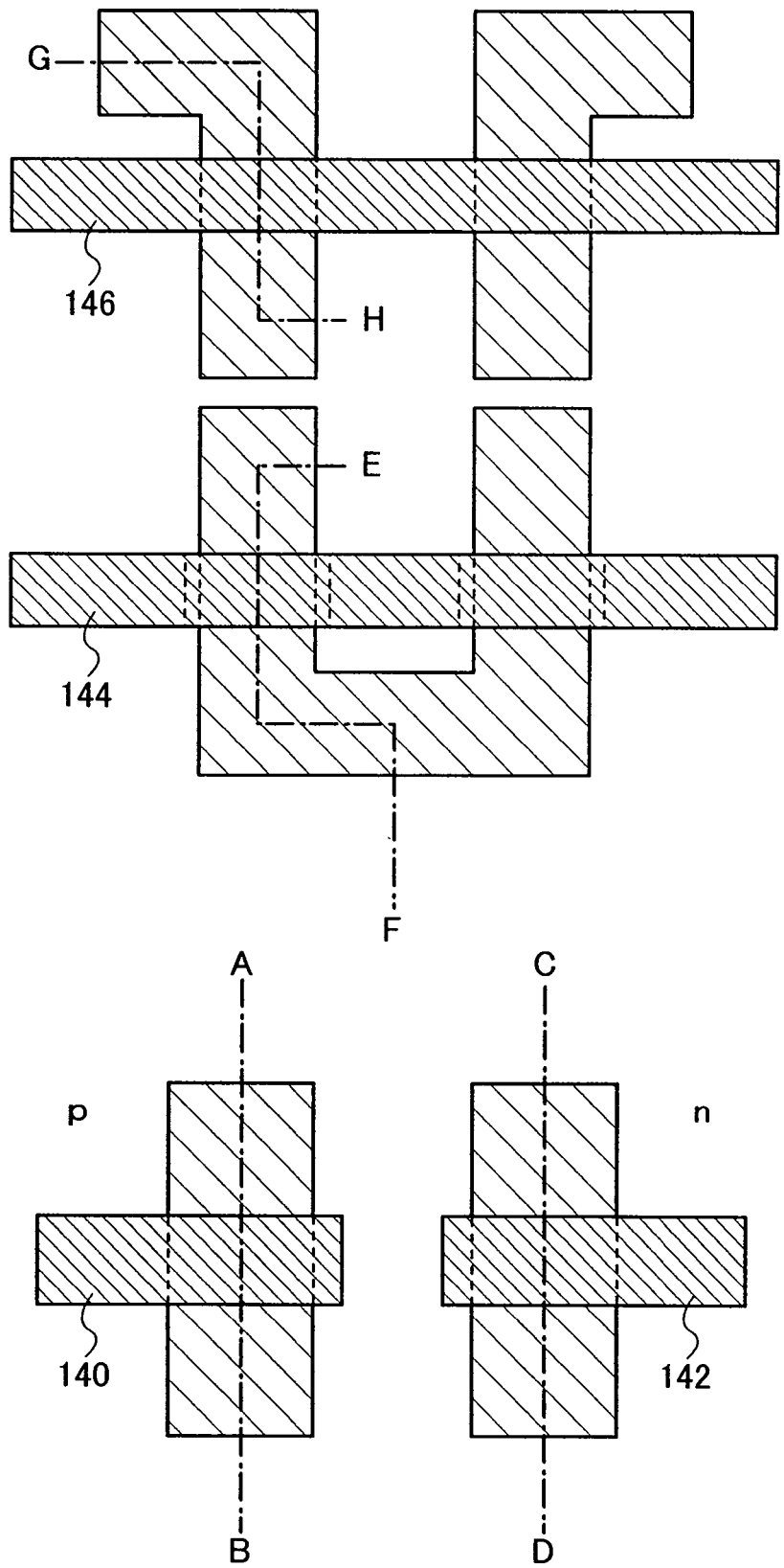
FIG. 44 is a diagram showing an example of a top view of a nonvolatile semiconductor memory device of the present invention.

This embodiment will explain a manufacturing method of a semiconductor device, which is different from those of Embodiments 1 to 3, with reference to drawings. It is to be noted that the same portions as those in Embodiments 1 to 3 are denoted by the same reference numerals, and explanation thereof will be omitted. FIGS. 43 to 45 show top views, and FIGS. 25A to 27C show cross-sectional views taken along lines A-B, C-D, E-F, and G-H of FIGS. 43 to 45. Each of portions between A and B and between C and D shows a thin film transistor provided in a logic portion, a portion between E and F shows a nonvolatile memory element provided in a memory portion, and a portion between G and H shows a thin film transistor provided in the memory portion.

First, components up to those in FIG. 18C are similarly formed. Then, as shown in FIG. 19A, a resist is selectively formed to cover the semiconductor layers 104, 106, and 108, and a part of the semiconductor layer 110, and an impurity element is introduced to the semiconductor layer 110 which is not covered with the resist, to form impurity regions 126. Then, the resist is removed, and a second insulating layer 128 is formed to cover the semiconductor layers 104, 106, and 110, and a first insulating layer 116 and a stacked structure including a first conductive layer 120 and a second conductive layer 123, which are formed over the semiconductor layer 108 (see FIGS. 25A and 43).

Figure 25A:
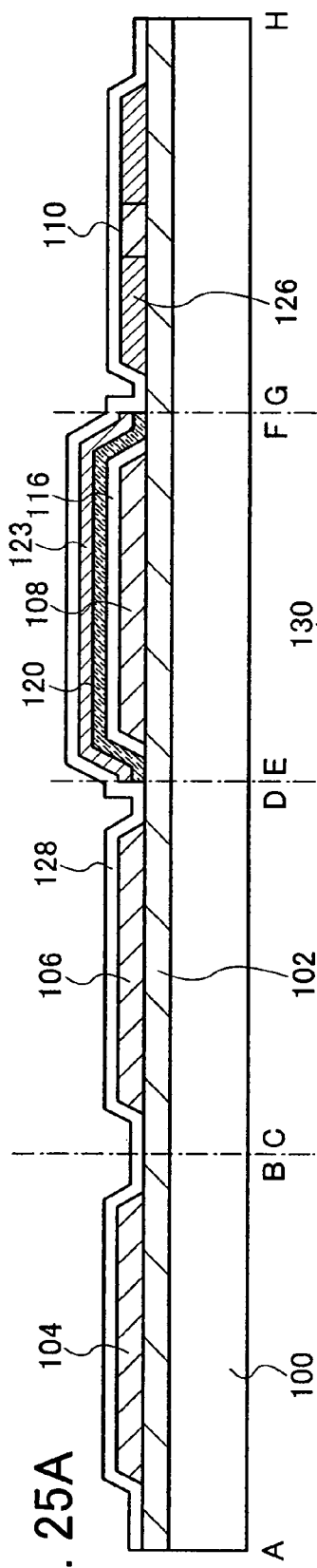
FIGS. 25A to 25C are diagrams showing an example of a manufacturing method of a nonvolatile semiconductor memory device of the present invention.
Figure 25B:
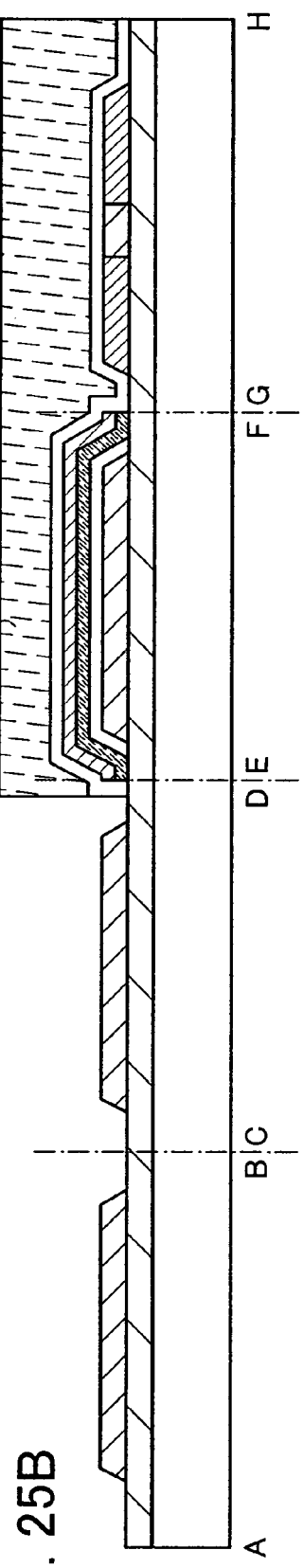

A resist 130 is selectively formed to cover the second insulating layer 128 formed over the semiconductor layers 108 and 110, and the second insulating layer 128 formed over the semiconductor layers 104 and 106 is selectively removed (see FIG. 25B).

Figure 25C:
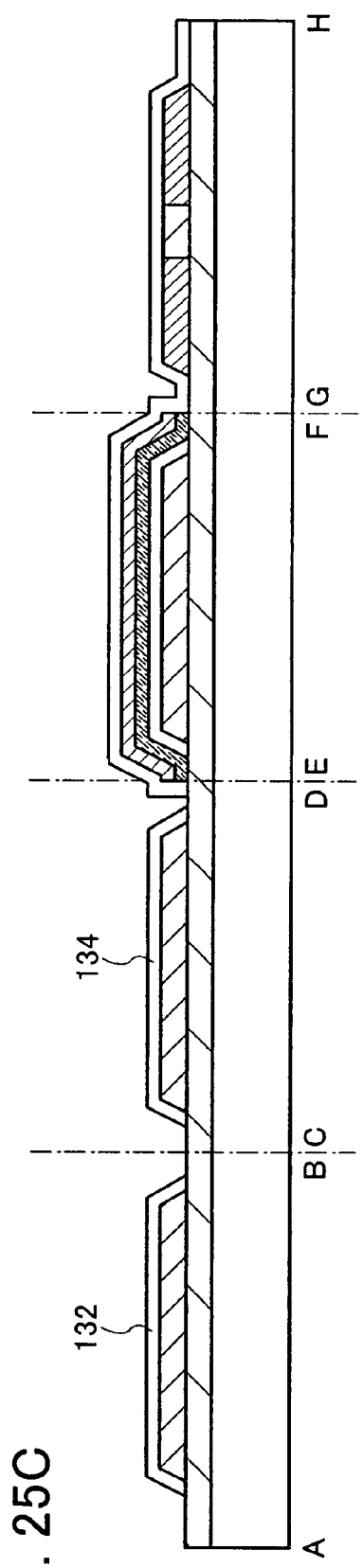

Third insulating layers 132 and 134 are formed to cover the semiconductor layers 104 and 106, respectively (see FIG. 25C).

Figure 26A:
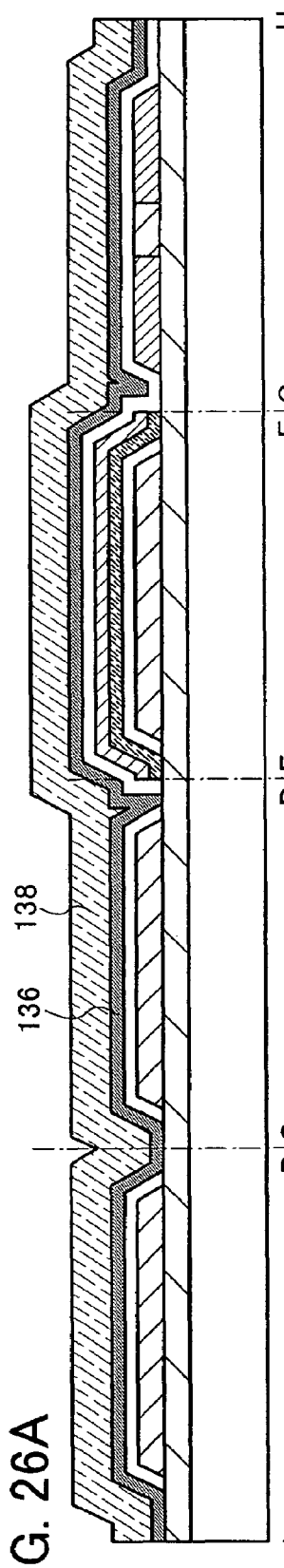
FIGS. 26A to 26C are diagrams showing an example of a manufacturing method of a nonvolatile semiconductor memory device of the present invention.

A conductive film is formed to cover the third insulating layers 132 and 134 formed over the semiconductor layers 104 and 106, and the second insulating layer 128 formed over the semiconductor layers 108 and 110 (see FIG. 26A). In this embodiment, an example of the conductive film is shown, in which conductive films 136 and 138 are sequentially stacked. Of course, the conductive film may also have a single layer structure or a stacked structure including three or more layers.

Figure 26B:
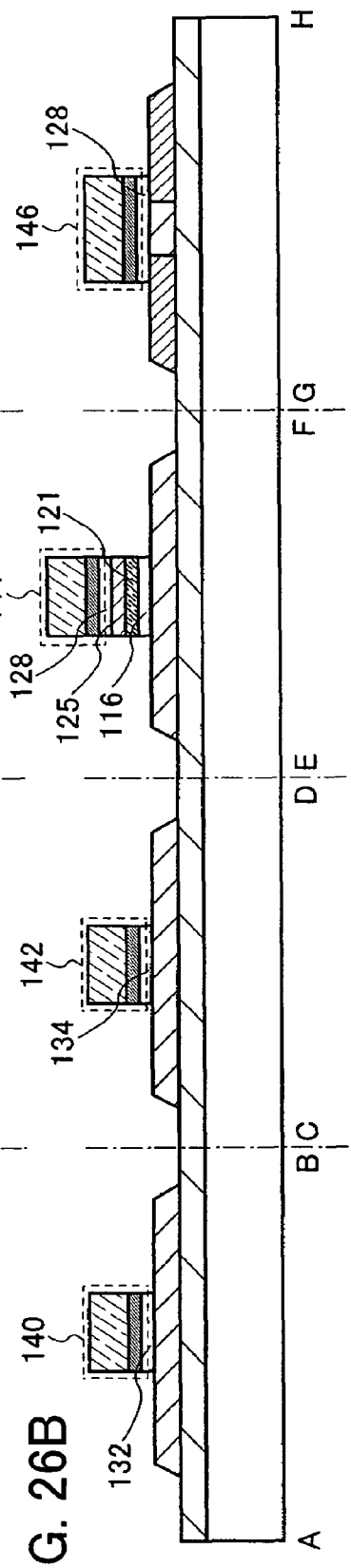

The stacked conductive films 136 and 138 are selectively removed by etching, so that the conductive films 136 and 138 are partially left over the semiconductor layers 104, 106, 108, and 110 to form conductive films 140, 142, 144, and 146 each functioning as a gate electrode (see FIGS. 26B and 43). In addition, in this embodiment, the surfaces of the semiconductor layers 104, 106, 108, and 110 which are not overlapped by the conductive films 140, 142, 144, and 146 are exposed.

Specifically, in the semiconductor layer 104, a portion of the third insulating layer 132 formed below the conductive film 140, which is not overlapped by the conductive film 140, is removed so that the edges of the conductive film 140 and the third insulating layer 132 are almost in alignment. In the semiconductor layer 106, a portion of the third insulating layer 134 formed below the conductive film 142, which is not overlapped by the conductive film 142, is removed so that the edges of the conductive film 142 and the third insulating layer 134 are almost in alignment. In the semiconductor layer 108, portions of the second insulating layer 128, the stacked structure including the first conductive layer 120 and the second conductive layer 123, and the first insulating layer 116 formed below the conductive film 144, which are not overlapped by the conductive film 144, are removed so that the edges of the conductive film 144, the second insulating layer 128, the stacked structure including the first floating gate electrode layer 121 and the second floating gate electrode layer 125, and the first insulating layer 116 are almost in alignment. In the semiconductor layer 110, a portion of the second insulating layer 128 formed below the conductive film 146, which is not overlapped by the conductive film 146, is removed so that the edges of the conductive film 146 and the second insulating layer 128 are almost in alignment (see FIG. 44).

In this case, parts of the insulating layer and the like, which is not overlapped by the conductive films 140, 142, 144, and 146, may be removed at the same time as formation of the conductive films 140, 142, 144, and 146. Alternatively, parts of the insulating layer and the like, which are not overlapped by the conductive films 140, 142, 144, and 146 may be removed after the conductive films 140, 142, 144, and 146 are formed, using the remaining resist or the conductive films 140, 142, 144, and 146 as masks.

Next, a resist 148 is selectively formed to cover the semiconductor layer 104. An impurity element is introduced to the semiconductor layers 106, 108, and 110 using the resist 148, and the conductive films 142, 144, and 146 as masks to form impurity regions (see FIG. 26C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is used.

Figure 26C:
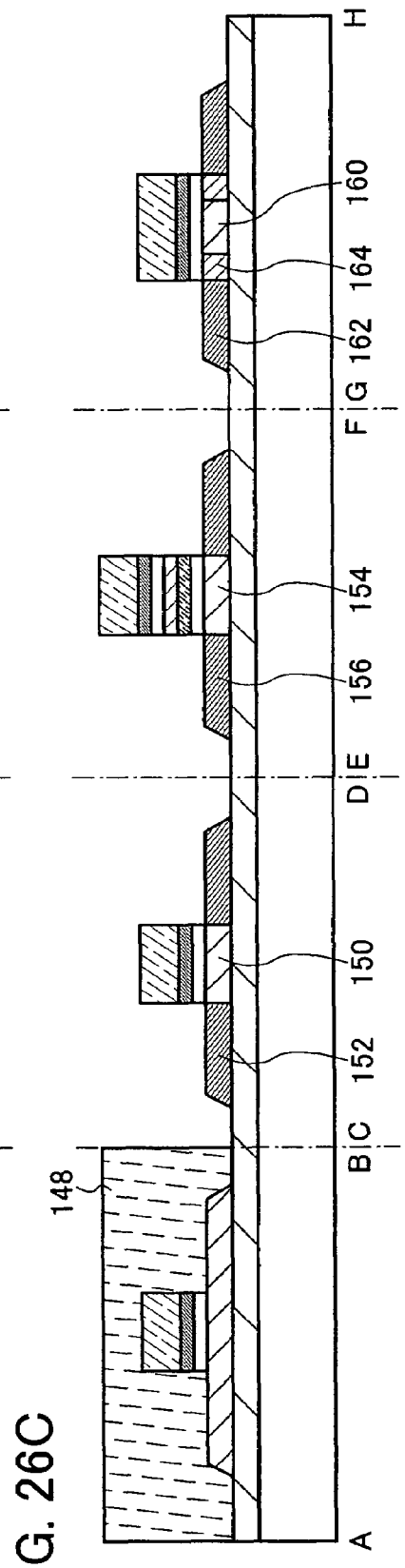

In FIG. 26C, by introducing the impurity element, impurity regions 152 which form a source region and a drain region and a channel forming region 150 are formed in the semiconductor layer 106. In the semiconductor layer 108, impurity regions 156 which form a source region and a drain region and a channel forming region 154 are formed. Further, in the semiconductor layer 110, high-concentration impurity regions 162 which form a source region and a drain region, low-concentration impurity regions 164 which form LDD regions, and a channel forming region 160 are formed.

A resist 166 is selectively formed to cover the semiconductor layers 106, 108, and 110. An impurity element is introduced to the semiconductor layer 104 using the resist 166 and the conductive film 140 as masks to form impurity regions (see FIG. 27A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a different conductivity type from that of the impurity element introduced to the semiconductor layers 106, 108, and 110 in FIG. 26C, such as boron (B), is used. As a result, impurity regions 170 which form a source region and a drain region and a channel forming region 168 are formed in the semiconductor layer 104.

Figure 27A:
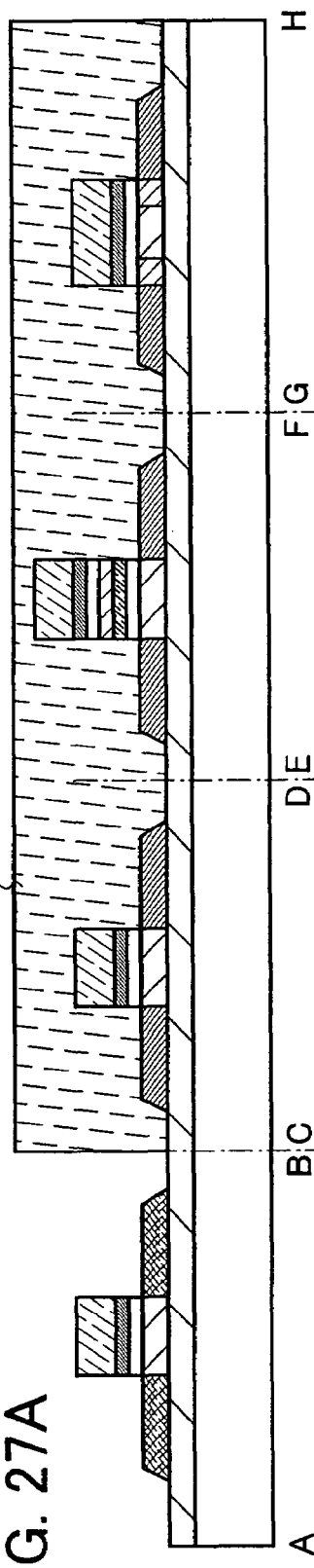
FIGS. 27A to 27C are diagrams showing an example of a manufacturing method of a nonvolatile semiconductor memory device of the present invention.

It is to be noted that, in this embodiment, an impurity element is introduced in FIGS. 26C and 27A in a state where the semiconductor layers 104, 106, 108, and 110, which are not overlapped by the conductive films 140, 142, 144, and 146, are exposed. Therefore, the channel forming regions 168, 150, 154, and 160 which are formed in the semiconductor layers 104, 106, 108, and 110, respectively, can be formed in a self-alignment manner with the conductive films 140, 142, 144, and 146.

Figure 27B:
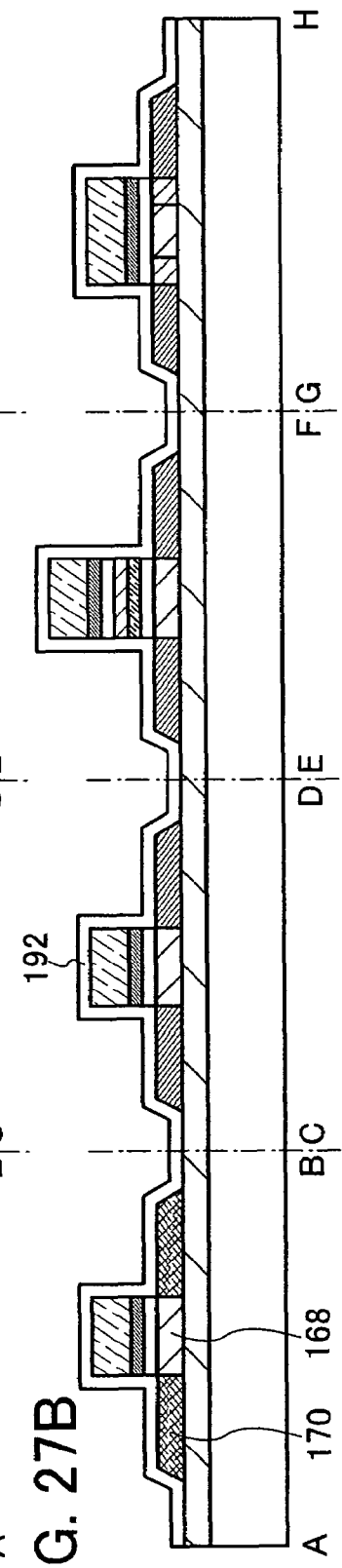
Figure 27C:
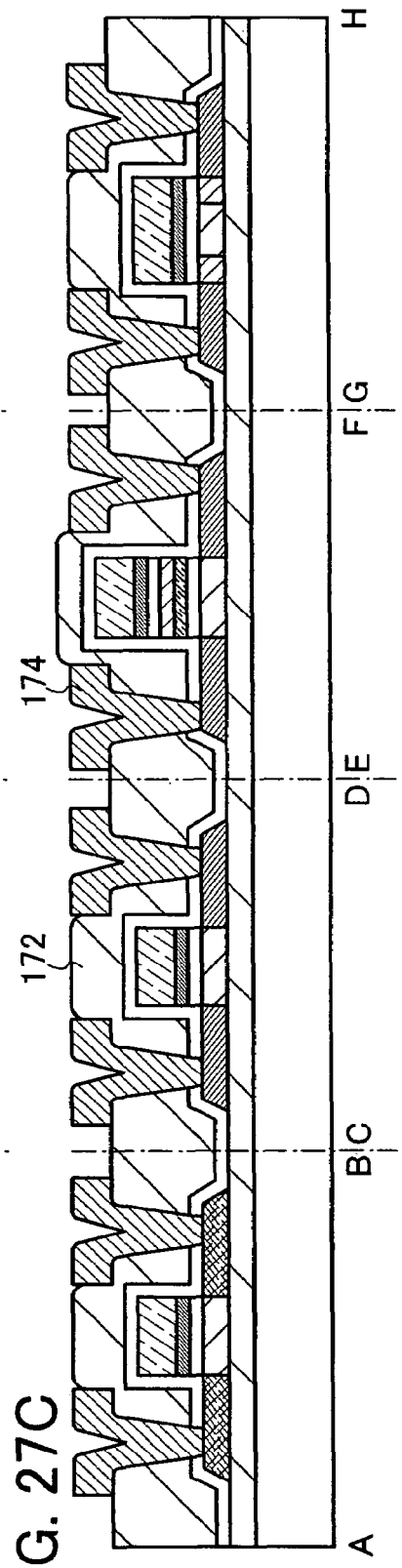

An insulating layer 192 is formed to cover the exposed semiconductor layers 104, 106, 108, and 110, and the conductive films 140, 142, 144, and 146 (see FIG. 27B).

The insulating layer 192 is formed by a CVD method, a sputtering method, or the like using an insulating layer containing oxygen or nitrogen such as silicon oxide ($SiO_x$), silicon nitride ($SiN_x$), silicon oxynitride ($SiO_xN_y$, (x>y)), or silicon nitride oxide ($SiN_xO_y$, (x>y)), DLC (diamond-like carbon), or the like with a single layer structure or a stacked structure.

An insulating layer 172 is formed to cover the insulating layer 192. Over the insulating layer 172, a conductive film 174 is formed to be electrically connected to the impurity regions 170, 152, 156, and 162 which are formed in the semiconductor layers 104, 106, 108, and 110, respectively (see FIGS. 27C and 45).

For the insulating layer 172, any of the materials described in Embodiment 1 can be used. For example, the insulating layer 192 can be formed using an insulating layer containing an inorganic material having oxygen or nitrogen such as silicon oxide ($SiO_x$), silicon nitride ($SiN_x$), silicon oxynitride ($SiO_xN_y$, (x>y)), or silicon nitride oxide ($SiN_xO_y$, (x>y)), and the insulating layer 172 can be formed using an organic material such as epoxy, polyimide, polyamide, polyvinyl phenol, benzocyclobutene, or acrylic. Of course, both the insulating layer 192 and the insulating layer 172 may be formed using an insulating layer containing an inorganic material.

It is to be noted that, in this embodiment, LDD regions can be formed using a sidewall in each of the semiconductor layers 104, 106, 108, and 110. For example, after the components up to those in FIG. 26B are formed, an impurity element is introduced at a low concentration to the semiconductor layers 104, 106, 108, and 110 using the conductive films 140, 142, 144, and 146 as masks. Then, an insulating layer (also referred to as a sidewall) 198 is formed so as to be in contact with each side surface of the conductive films 140, 142, 144, and 146.

Figure 31A:
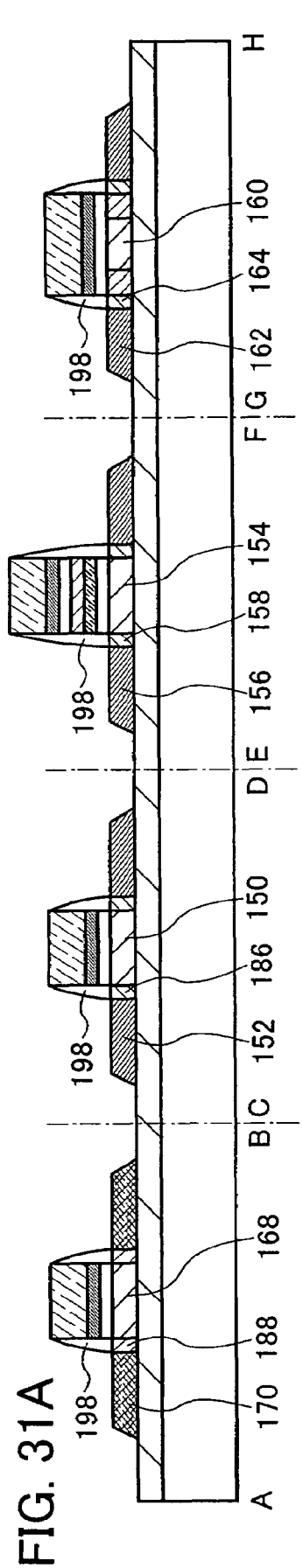
FIGS. 31A and 31B are diagrams showing an example of a manufacturing method of a nonvolatile semiconductor memory device of the present invention.

An impurity element is introduced at a high concentration using the insulating layer 198, and the conductive films 140, 142, 144, and 146 as masks to form high-concentration impurity regions 170 which form a source region and a drain region, low-concentration impurity regions 188 which forms LDD regions, and a channel forming region 168 are formed in the semiconductor layer 104. In the semiconductor layer 106, high-concentration impurity regions 152 which form a source region and a drain region, low-concentration impurity regions 186 which form LDD regions, and a channel forming region 150 are formed. In addition, in the semiconductor layer 108, impurity region 156 which form a source region and a drain region, low-concentration impurity regions 158 which form LDD regions, and a channel forming region 154 are formed. In addition, in the semiconductor layer 110, high-concentration impurity regions 162 which form a source region and a drain region, low-concentration impurity regions 164 which forms LDD regions, and a channel forming region 160 are formed (see FIG. 31A).

As for a method for forming the insulating layer 198, a film containing an inorganic material such as silicon, an oxide of silicon, or a nitride of silicon, or a film containing an organic material such as an organic resin is formed by a plasma CVD method, a sputtering method, or the like with a single layer structure or a stacked structure. Then, the insulating layer is selectively etched by anisotropic etching mainly in a perpendicular direction so as to be in contact with each side surface of the conductive films 140, 142, 144, and 146. It is to be noted that the insulating layer 198 is used as a doping mask when LDD (Lightly Doped Drain) regions are formed. In this embodiment, the insulating layer 198 is formed so as to be also in contact with each side surface of the insulating layer and the floating gate electrode layer formed below conductive films 140, 142, 144, and 146.

Figure 31B:
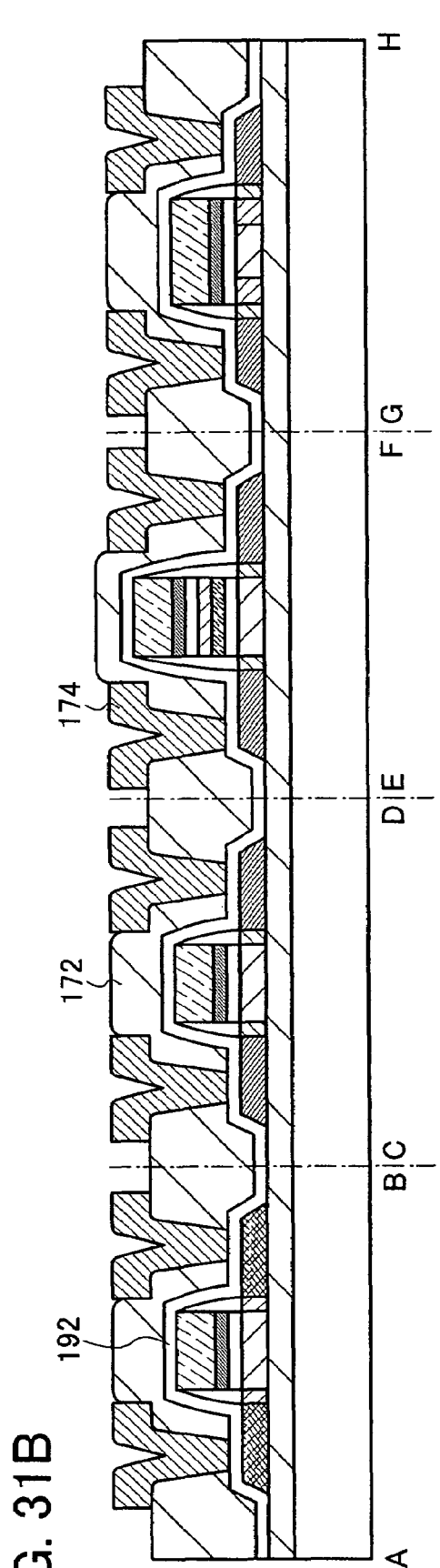

Thereafter, as described above, the insulating layers 192 and 172, and the conductive film 174 are formed, whereby a nonvolatile semiconductor memory device can be obtained (see FIG. 31B). The insulating layer 198 called a sidewall is preferably applied to a nonvolatile memory element with a channel length of 1.5 μm or less. Due to the insulating layer 198 called a sidewall, the low-concentration impurity regions 158 can be formed as LDD regions in a self-aligned manner, and the reliability of the nonvolatile memory element can be improved.

In the structure shown in this embodiment, the width of the stacked structure including the first floating gate electrode layer 121 and the second floating gate electrode layer 125 functioning as a floating gate may be smaller than that of the semiconductor layer 108 as shown in Embodiment 3. In addition, in the structure shown in this embodiment, the impurity regions 194 may be provided as shown in FIGS. 35 and 36.

In the nonvolatile semiconductor memory device of this embodiment, a reduction in power consumption can be achieved by making the thicknesses of gate insulating layers in transistors different in accordance with circuit structures. In addition, a stable operation of the nonvolatile semiconductor memory device can be achieved. Specifically, by formation of a thin gate insulating layer of a transistor included in a logic portion, variation in threshold voltage can be reduced, and the memory device can be driven with low voltage. By formation of a thick gate insulating layer of a selection transistor included in a memory portion, stability of an operation can be enhanced even when higher voltage than that in the logic portion is applied in writing and erasing operations in the nonvolatile memory element. In the nonvolatile memory element, charges can be easily injected from a semiconductor layer to the floating gate electrode, and the charges can be prevented from being discharged from the floating gate electrode. In other words, in the case of an operation as a memory, writing can be performed with very high efficiency at low voltage, and a charge-retention property can be improved. According to this embodiment, a nonvolatile semiconductor memory device which has excellent effect as described above can be manufactured in successive steps.

This embodiment can be executed by being combined with any of the embodiment mode and the other embodiments shown in this specification.

Embodiment 6

This embodiment will explain application examples of a semiconductor device which is provided with the nonvolatile semiconductor memory device of the present invention and is capable of data input and output without contact, with reference to drawings. The semiconductor device capable of data input and output without contact is also referred to as an RFID tag, an ID tag, an IC tag, an IC chip, an RF tag, a wireless tag, an electronic tag, or a wireless chip depending on uses.

A semiconductor device 800 functions to exchange data without contact, and includes a high-frequency circuit 810, a power supply circuit 820, a reset circuit 830, a clock generating circuit 840, a data demodulating circuit 850, a data modulating circuit 860, a control circuit 870 for controlling other circuits, a memory circuit 880, and an antenna 890

Figure 46A:
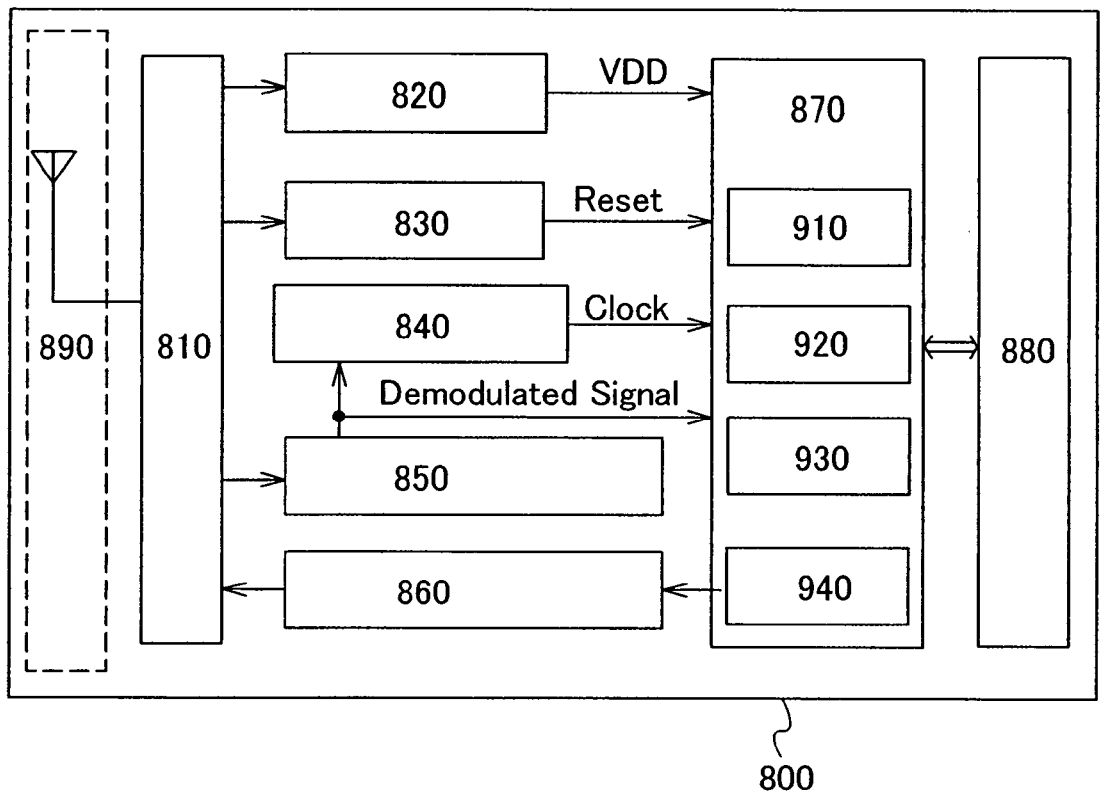
FIGS. 46A to 46C are diagrams each showing an example of a usage pattern of a nonvolatile semiconductor memory device of the present invention.

(FIG. 46A). The high-frequency circuit 810 receives a signal from the antenna 890, and outputs a signal, which is received from the data modulating circuit 860, to the antenna 890. The power supply circuit 820 generates power supply potential from a received signal. The reset circuit 830 generates a reset signal. The clock generating circuit 840 generates various clock signals based on a received signal inputted from the antenna 890. The data demodulating circuit 850 demodulates a received signal and outputs the demodulated signal to the control circuit 870. The data modulating circuit 860 modulates a signal received from the control circuit 870. As the control circuit 870, for example, a code extracting circuit 910, a code judging circuit 920, a CRC judging circuit 930, and an output unit circuit 940 are provided. It is to be noted that the code extracting circuit 910 separately extracts a plurality of codes included in an instruction transmitted to the control circuit 870. The code judging circuit 920 judges the content of the instruction by comparing the extracted code with a code corresponding to a reference. The CRC judging circuit 930 detects whether or not there is a transmission error or the like based on the judgment code.

An example of an operation of the aforementioned semiconductor device will be explained. First, a radio signal is received by the antenna 890 and then transmitted through the high-frequency circuit 810 to the power supply circuit 820, where high power supply potential (hereinafter referred to as VDD) is generated. The VDD is supplied to each circuit in the semiconductor device 800. A signal transmitted to the data demodulating circuit 850 through the high-frequency circuit 810 is demodulated (hereinafter, this signal is referred to as a demodulated signal). Moreover, signals passed through the reset circuit 830 and the clock generating circuit 840 through the high-frequency circuit 810, and the demodulated signal are transmitted to the control circuit 870. The signals sent to the control circuit 870 are analyzed by the code extracting circuit 910, the code judging circuit 920, the CRC judging circuit 930, and the like. Then, based on the analyzed signals, information of the semiconductor device stored in the memory circuit 880 is outputted. The outputted information of the semiconductor device is encoded through the output unit circuit 940. Further, the encoded information of the semiconductor device 800 is transmitted through the data modulating circuit 860 and then is transmitted by the antenna 890 as a wireless signal. It is to be noted that low power supply potential (hereinafter referred to as VSS) is common among the plurality of circuits included in the semiconductor device 800 and VSS can be set to GND. In addition, the nonvolatile semiconductor memory device of the present invention can be applied to the memory circuit 880. With the nonvolatile semiconductor memory device of the present invention, drive voltage can be reduced, and the distance within which data can be exchanged without contact can be extended.

In this manner, data of the semiconductor device can be read by transmission of a signal from a reader/writer to the semiconductor device 800 and reception of a signal transmitted from the semiconductor device 800 by the reader/writer.

Moreover, the semiconductor device 800 may supply a power supply voltage to each circuit either by an electromagnetic wave without a power source (battery) mounted, or by an electromagnetic wave and a power source (battery) mounted.

Figure 46B:
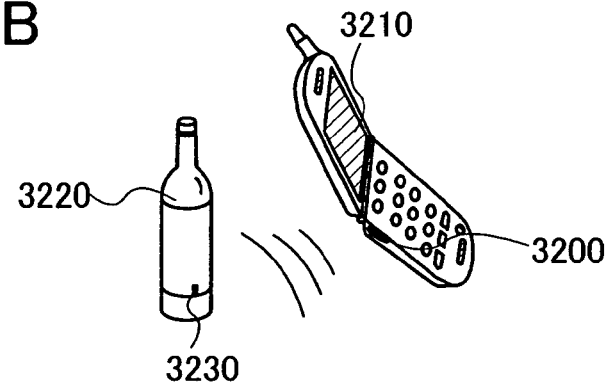
Figure 46C:
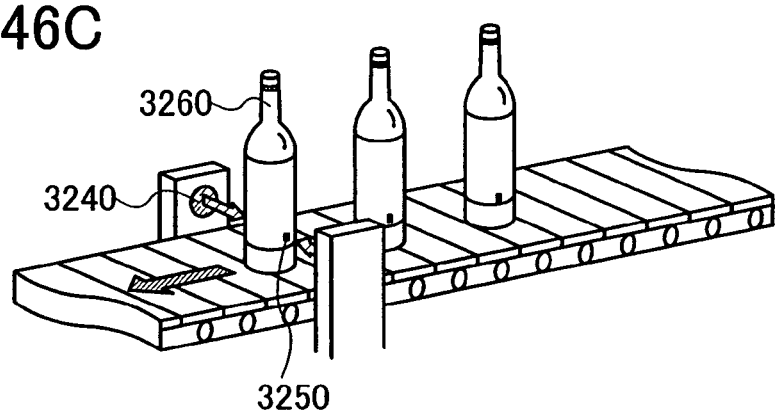

An example of application of the semiconductor device capable of data input and output without contact will be explained. A side surface of a portable terminal including a display portion 3210 is provided with a reader/writer 3200. A side surface of a product 3220 is provided with a semiconductor device 3230 (FIG. 46B). When the reader/writer 3200 is held over the semiconductor device 3230 included in the product 3220, the display portion 3210 displays information on the product, such as a material, a production area, an inspection result of each production step, history of distribution, and explanation of the product. In addition, when a product 3260 is transported by a conveyer belt, the product 3260 can be inspected with the use of a semiconductor device 3250 provided on the product 3260 and a reader/writer 3240 (FIG. 46C). In this manner, through application of the semiconductor device in such a system, information can be easily obtained and higher performance and higher added value are obtained.

The nonvolatile semiconductor memory device of the present invention can be applied to electronic devices provided with a memory in various fields. For example, the nonvolatile semiconductor memory device of the present invention can be applied to the following electronic devices and the like: a camera such as a video camera or a digital camera, a goggle type display (a head-mounted display), a navigation system, a sound reproducing device (such as a car audio system or an audio component set), a computer, a game machine, a portable information terminal (such as a mobile computer, a cellular phone, a portable game machine, or an electronic book), and an image reproducing device provided with a recording medium (specifically, a device which reproduces a recording medium such as a DVD (Digital Versatile Disc) and has a display capable of displaying the reproduced image). FIGS. 17A to 17E show specific examples of these electronic devices.

Figure 17A:
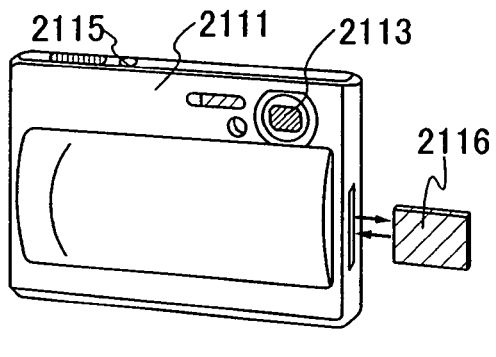
FIGS. 17A to 17E are diagrams each showing an example of a usage pattern of a nonvolatile semiconductor memory device of the present invention.
Figure 17B:
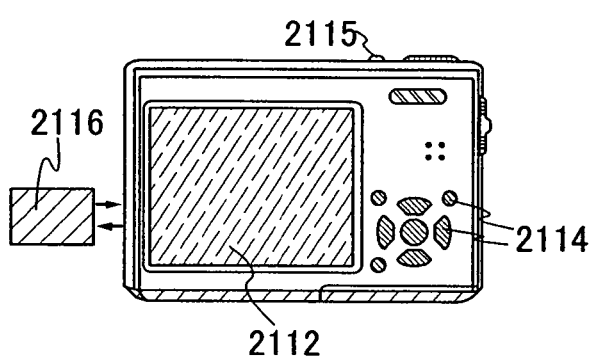

FIGS. 17A and 17B show a digital camera. FIG. 17B shows a rear side of the digital camera shown in FIG. 17A. This digital camera includes a chassis 2111, a display portion 2112, a lens 2113, operation keys 2114, a shutter button 2115, and the like. Further, the digital camera includes a removable nonvolatile memory 2116 and can store data obtained by the digital camera in the memory 2116. The nonvolatile semiconductor memory device formed using the present invention can be applied to the memory 2116.

Figure 17C:
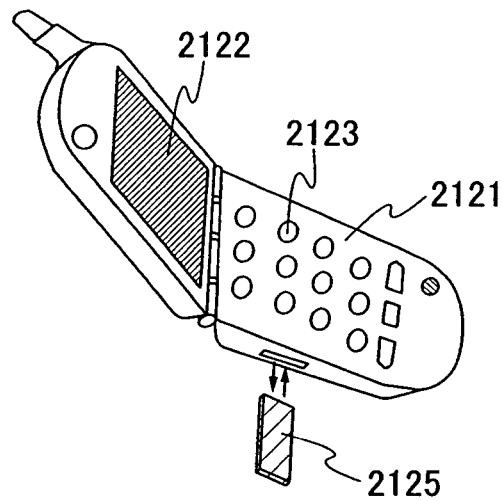

FIG. 17C shows a cellular phone which is a typical example of portable terminals. This cellular phone includes a chassis 2121, a display portion 2122, operation keys 2123, and the like. Further, the cellular phone includes a removable nonvolatile memory 2125, and data such as telephone numbers, images, music data, and the like can be stored in the memory 2125 and reproduced by the cellular phone. The nonvolatile semiconductor memory device formed using the present invention can be applied to the memory 2125.

Figure 17D:
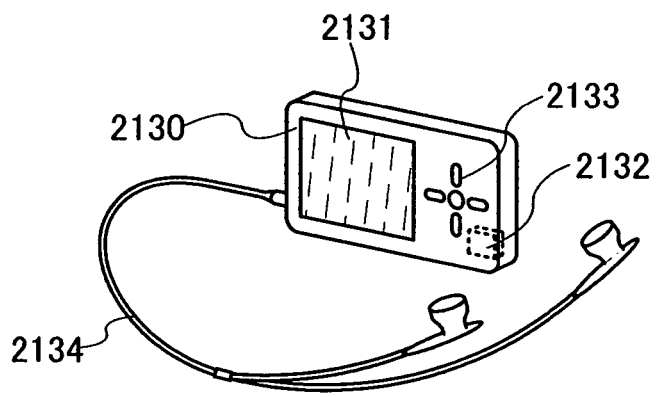

FIG. 17D shows a digital player, which is a typical example of audio devices. The digital player shown in FIG. 17D includes a main body 2130, a display portion 2131, a memory portion 2132, an operating portion 2133, an earphone 2134, and the like. A headphone or a wireless earphone may be used instead of the earphone 2134. The nonvolatile semiconductor memory device formed using the present invention can be applied to the memory portion 2132. For example, by using a NAND type nonvolatile memory with a storage capacity of 20 GB to 200 GB and operating the operating portion 2133, images and sound (music) can be recorded and reproduced. It is to be noted that power consumption can be reduced by displaying white characters on a black background in the display portion 2131. This is particularly effective for a mobile audio device. The nonvolatile semiconductor memory device provided in the memory portion 2132 may be removable.

Figure 17E:
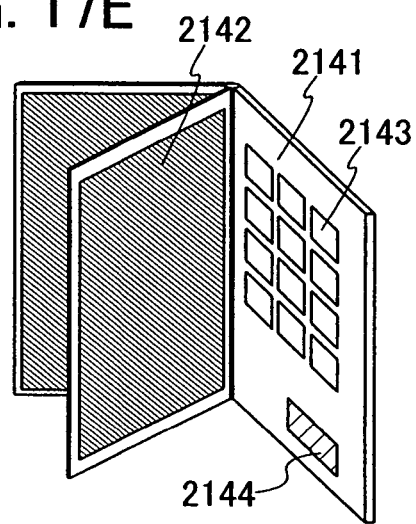

FIG. 17E shows an electronic book (also referred to as electronic paper). This electronic book includes a main body 2141, a display portion 2142, operation keys 2143, and a memory portion 2144. In addition, a modem may be incorporated in the main body 2141, or a structure in which data can be transmitted and received wirelessly may be employed. The nonvolatile semiconductor memory device formed using the present invention can be applied to the memory portion 2144. For example, by using a NAND type nonvolatile memory with a storage capacity of 20 GB to 200 GB and operating the operating key 2143, images and sound (music) can be recorded and reproduced. The nonvolatile semiconductor memory device provided in the memory portion 2144 may be removable.

As described above, the applicable range of the nonvolatile semiconductor memory device of the present invention is so wide that it can be used for any electronic device in various fields that includes a memory.

This application is based on Japanese Patent Application serial No. 2006-100367 filed in Japan Patent Office on Mar. 31, 2006, the entire contents of which are hereby incorporated by reference.

What is claimed is:

1. A nonvolatile semiconductor memory device comprising:
a substrate;
a base insulating layer over the substrate;
a semiconductor layer over the base insulating layer, the semiconductor layer including a channel forming region between a first impurity region and a second impurity region which are formed apart from each other;
a first insulating layer over the channel forming region;
a floating gate over the channel forming region with the first insulating layer interposed therebetween;
a second insulating layer over the floating gate; and
a control gate over the floating gate with the second insulating layer interposed therebetween,
wherein the floating gate includes at least a first layer which is in direct contact with the first insulating layer and a second layer formed over the first layer,
wherein the first layer comprises germanium or a germanium compound, and
wherein the second layer is formed of a material selected from the group consisting of a metal, an alloy, and a metal compound which is different from the germanium or the germanium compound.

2. The nonvolatile semiconductor memory device according to claim 1, wherein the germanium compound is germanium oxide or germanium nitride.

3. The nonvolatile semiconductor memory device according to claim 1, wherein the first insulating layer comprises a silicon oxide layer and a silicon nitride layer over the silicon oxide layer.

4. The nonvolatile semiconductor memory device according to claim 1, wherein the semiconductor layer is an island-like semiconductor layer formed over the base insulating layer.

5. The nonvolatile semiconductor memory device according to claim 1, wherein a plurality of the floating gates and the control gates are arranged over the semiconductor layer, each control gate being stacked over the floating gate.

6. The nonvolatile semiconductor memory device according to claim 1, wherein an edge of the floating gate in a channel length direction extends beyond an edge of the control gate in a channel length direction.

7. The nonvolatile semiconductor memory device according to claim 1, wherein an edge of the control gate in a channel length direction extends beyond an edge of the floating gate in a channel length direction.

8. The nonvolatile semiconductor memory device according to claim 1,
wherein the semiconductor layer includes a third impurity region having a conductivity type which is different from a conductivity type of the first impurity region and the second impurity region,
wherein the third impurity region is provided in an edge portion of the semiconductor layer in a channel width direction, and
wherein an edge of the floating gate in the channel width direction is provided over the third impurity region.

9. The nonvolatile semiconductor memory device according to claim 8, wherein the third impurity region extends in a channel length direction.

10. The nonvolatile semiconductor memory device according to claim 8, wherein the semiconductor layer includes a fourth impurity region having a same conductivity type as the conductivity type of the third impurity region, and the channel forming region is provided between the third impurity region and the fourth impurity region.

11. The nonvolatile semiconductor memory device according to claim 1, wherein the semiconductor layer comprises a low-concentration impurity region which overlaps with the floating gate and has a same conductivity type as a conductivity type of the first impurity region and the second impurity region.

12. The nonvolatile semiconductor memory device according to claim 1, wherein the second layer contains at least one of tungsten, tantalum, titanium, molybdenum, chromium, and nickel.

13. The nonvolatile semiconductor memory device according to claim 1, wherein the second layer contains at least one of tantalum nitride, tungsten nitride, molybdenum nitride, titanium nitride, tantalum oxide, titanium oxide, and molybdenum oxide.

14. The nonvolatile semiconductor memory device according to claim 1, wherein the first layer comprises germanium or a germanium compound and has a thickness of 1 nm to 20 nm.

15. The nonvolatile semiconductor memory device according to claim 1, wherein the control gate includes a first conductive layer and a second conductive layer over the first conductive layer, and an edge of the first conductive layer in a channel length direction extends beyond an edge of the second conductive layer.

16. A nonvolatile semiconductor memory device comprising:
a substrate;
a base insulating layer over the substrate;
a semiconductor layer over the base insulating layer, the semiconductor layer including a channel forming region between a first impurity region and a second impurity region which are formed apart from each other;
a first insulating layer over the channel forming region;
a floating gate over the channel forming region with the first insulating layer interposed therebetween;
a second insulating layer over the floating gate; and
a control gate over the floating gate with the second insulating layer interposed therebetween,
wherein the floating gate includes at least a first layer which is in direct contact with the first insulating layer and a second layer formed over the first layer,
wherein the first layer comprises germanium or a germanium compound,
wherein the second layer is formed of a material selected from the group consisting of a metal, an alloy, and a metal compound which is different from the germanium and the germanium compound, and wherein the germanium compound is germanium oxide or germanium nitride.

17. The nonvolatile semiconductor memory device according to claim 16, wherein the first insulating layer comprises a silicon oxide layer and a silicon nitride layer over the silicon oxide layer.

18. The nonvolatile semiconductor memory device according to claim 16, wherein the semiconductor layer is an island-like semiconductor layer formed over the base insulating layer.

19. The nonvolatile semiconductor memory device according to claim 16, wherein a plurality of the floating gates and the control gates are arranged over the semiconductor layer, each control gate being stacked over the floating gate.

20. The nonvolatile semiconductor memory device according to claim 16, wherein an edge of the floating gate in a channel length direction extends beyond an edge of the control gate in a channel length direction.

21. The nonvolatile semiconductor memory device according to claim 16,
wherein the semiconductor layer includes a third impurity region having a conductivity type which is different from a conductivity type of the first impurity region and the second impurity region,
wherein the third impurity region is provided in an edge portion of the semiconductor layer in a channel width direction, and
wherein an edge of the floating gate in the channel width direction is provided over the third impurity region.

22. The nonvolatile semiconductor memory device according to claim 21, wherein the third impurity region extends in a channel length direction.

23. The nonvolatile semiconductor memory device according to claim 21, wherein the semiconductor layer includes a fourth impurity region having a same conductivity type as the conductivity type of the third impurity region, and the channel forming region is provided between the third impurity region and the fourth impurity region.

24. The nonvolatile semiconductor memory device according to claim 16, wherein the semiconductor layer comprises a low-concentration impurity region which overlaps with the floating gate and has a same conductivity type as a conductivity type of the first impurity region and the second impurity region.

25. The nonvolatile semiconductor memory device according to claim 16, wherein the second layer contains at least one of tungsten, tantalum, titanium, molybdenum, chromium, and nickel.

26. The nonvolatile semiconductor memory device according to claim 16, wherein the second layer contains at least one of tantalum nitride, tungsten nitride, molybdenum nitride, titanium nitride, tantalum oxide, titanium oxide, and molybdenum oxide.

27. The nonvolatile semiconductor memory device according to claim 16, wherein the first layer comprises germanium or a germanium compound and has a thickness of 1 nm to 20 nm.

28. The nonvolatile semiconductor memory device according to claim 16, wherein the control gate includes a first conductive layer and a second conductive layer over the first conductive layer, and an edge of the first conductive layer in a channel length direction extends beyond an edge of the second conductive layer.

29. A nonvolatile semiconductor memory device comprising:
a substrate;
a base insulating layer over the substrate;
an island-like semiconductor layer over the base insulating layer, the island-like semiconductor layer including a channel forming region between a first impurity region and a second impurity region which are formed apart from each other;
a first insulating layer over the channel forming region;
a floating gate over the channel forming region with the first insulating layer interposed therebetween;
a second insulating layer over the floating gate; and
a control gate over the floating gate with the second insulating layer interposed therebetween,
wherein the floating gate includes at least a first layer which is in direct contact with the first insulating layer and a second layer formed over the first layer,
wherein the first layer comprises germanium or a germanium compound,
wherein the second layer is formed of a material selected from the group consisting of a metal, an alloy, and a metal compound which is different from the germanium and the germanium compound, and
wherein a plurality of the floating gates and the control gates are arranged over the island-like semiconductor layer, each control gate being stacked over the floating gate.

30. The nonvolatile semiconductor memory device according to claim 29, wherein the germanium compound is germanium oxide or germanium nitride.

31. The nonvolatile semiconductor memory device according to claim 29, wherein the first insulating layer comprises a silicon oxide layer and a silicon nitride layer over the silicon oxide layer.

32. The nonvolatile semiconductor memory device according to claim 29, wherein an edge of the floating gate in a channel length direction extends beyond an edge of the control gate in a channel length direction.

33. The nonvolatile semiconductor memory device according to claim 29,
wherein the island-like semiconductor layer includes a third impurity region having a conductivity type which is different from a conductivity type of the first impurity region and the second impurity region,
wherein the third impurity region is provided in an edge portion of the island-like semiconductor layer in a channel width direction, and
wherein an edge of the floating gate in the channel width direction is provided over the third impurity region.

34. The nonvolatile semiconductor memory device according to claim 33, wherein the third impurity region extends in a channel length direction.

35. The nonvolatile semiconductor memory device according to claim 33, wherein the island-like semiconductor layer includes a fourth impurity region having a same conductivity type as the conductivity type of the third impurity region, and the channel forming region is provided between the third impurity region and the fourth impurity region.

36. The nonvolatile semiconductor memory device according to claim 29, wherein the island-like semiconductor layer comprises a low-concentration impurity region which overlaps with the floating gate and has a same conductivity type as a conductivity type of the first impurity region and the second impurity region.

37. The nonvolatile semiconductor memory device according to claim 29, wherein the second layer contains at least one of tungsten, tantalum, titanium, molybdenum, chromium, and nickel.

38. The nonvolatile semiconductor memory device according to claim 29, wherein the second layer contains at least one of tantalum nitride, tungsten nitride, molybdenum nitride, titanium nitride, tantalum oxide, titanium oxide, and molybdenum oxide.

39. The nonvolatile semiconductor memory device according to claim 29, wherein the first layer comprises germanium or a germanium compound and has a thickness of 1 nm to 20 nm.

40. The nonvolatile semiconductor memory device according to claim 29, wherein the control gate includes a first conductive layer and a second conductive layer over the first conductive layer, and an edge of the first conductive layer in a channel length direction extends beyond an edge of the second conductive layer.

* * * * *

UNITED STATES PATENT AND TRADEMARK OFFICE
CERTIFICATE OF CORRECTION

| | | |
|---|---|---|
| PATENT NO. | : 7,842,992 B2 | Page 1 of 1 |
| APPLICATION NO. | : 11/723506 | |
| DATED | : November 30, 2010 | |
| INVENTOR(S) | : Shunpei Yamazaki et al. | |

It is certified that error appears in the above-identified patent and that said Letters Patent is hereby corrected as shown below:

At column 6, line 59, "$cm^{-1}$" should be -- $cm^{-3}$ --;

At column 8, line 53, "densel" should be -- denser --;

At column 22, line 45, "10 μm" should be -- 10 nm --.

Signed and Sealed this
Twenty-second Day of March, 2011

David J. Kappos
*Director of the United States Patent and Trademark Office*